US011355418B2

(12) United States Patent
Yu et al.

(10) Patent No.: US 11,355,418 B2
(45) Date of Patent: Jun. 7, 2022

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Chen-Hua Yu, Hsinchu (TW); Chun-Hui Yu, Hsinchu County (TW); Jeng-Nan Hung, Taichung (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/921,916

(22) Filed: Jul. 6, 2020

(65) Prior Publication Data

US 2021/0098335 A1    Apr. 1, 2021

Related U.S. Application Data

(60) Provisional application No. 62/907,692, filed on Sep. 29, 2019.

(51) Int. Cl.
| | |
|---|---|
| *H01L 23/42* | (2006.01) |
| *H01L 25/065* | (2006.01) |
| *H01L 23/00* | (2006.01) |
| *H01L 23/522* | (2006.01) |
| *H01L 23/528* | (2006.01) |
| *H01L 23/31* | (2006.01) |

(52) U.S. Cl.
CPC .......... *H01L 23/42* (2013.01); *H01L 23/3128* (2013.01); *H01L 23/5226* (2013.01); *H01L 23/5283* (2013.01); *H01L 24/08* (2013.01); *H01L 25/0655* (2013.01); *H01L 2224/0401* (2013.01)

(58) Field of Classification Search
CPC . H01L 23/42; H01L 23/3128; H01L 23/5226; H01L 23/5283; H01L 23/49816; H01L 23/5389; H01L 23/473; H01L 23/3677; H01L 24/08; H01L 2224/0401
USPC ........................................................ 257/712
See application file for complete search history.

(56) References Cited

U.S. PATENT DOCUMENTS 5,023,695 A  *  6/1991  Umezawa ........... H01L 23/4735
                                                 257/714
5,239,200 A  *  8/1993  Messina ................ H01L 23/473
                                                 165/104.33

(Continued)

*Primary Examiner* — Dao H Nguyen
(74) *Attorney, Agent, or Firm* — JCIPRNET

(57) ABSTRACT

A package structure includes a wafer-form semiconductor package and a thermal dissipating system. The wafer-form semiconductor package includes semiconductor dies electrically connected with each other. The thermal dissipating system is located on and thermally coupled to the wafer-form semiconductor package, where the thermal dissipating system has a hollow structure with a fluidic space, and the fluidic space includes a ceiling and a floor. The thermal dissipating system includes at least one inlet opening, at least one outlet opening and a plurality of first microstructures. The at least one inlet opening and the at least one outlet opening are spatially communicated with the fluidic space. The first microstructures are located on the floor, and at least one of the first microstructures is corresponding to the at least one outlet opening.

20 Claims, 44 Drawing Sheets

(56) References Cited

U.S. PATENT DOCUMENTS

| | | | | |
|---|---|---|---|---|
| 5,774,334 A | * | 6/1998 | Kawamura | H01L 23/4338 |
| | | | | 165/80.4 |
| 6,351,384 B1 | * | 2/2002 | Daikoku | F28F 3/02 |
| | | | | 165/80.3 |
| 6,528,878 B1 | * | 3/2003 | Daikoku | H01L 23/10 |
| | | | | 361/689 |
| 7,180,179 B2 | * | 2/2007 | Mok | H01L 23/427 |
| | | | | 257/675 |
| 7,849,914 B2 | * | 12/2010 | Di Stefano | H01L 23/473 |
| | | | | 165/46 |
| 9,000,584 B2 | | 4/2015 | Lin et al. | |
| 9,048,222 B2 | | 6/2015 | Hung et al. | |
| 9,048,233 B2 | | 6/2015 | Wu et al. | |
| 9,064,879 B2 | | 6/2015 | Hung et al. | |
| 9,111,949 B2 | | 8/2015 | Yu et al. | |
| 9,263,511 B2 | | 2/2016 | Yu et al. | |
| 9,281,254 B2 | | 3/2016 | Yu et al. | |
| 9,368,460 B2 | | 6/2016 | Yu et al. | |
| 9,372,206 B2 | | 6/2016 | Wu et al. | |
| 9,496,189 B2 | | 11/2016 | Yu et al. | |
| 9,812,377 B2 | * | 11/2017 | Yamada | H01L 25/072 |
| 10,548,240 B1 | * | 1/2020 | Iyengar | H01L 23/473 |
| 2009/0316360 A1 | * | 12/2009 | Campbell | H01L 23/473 |
| | | | | 361/699 |
| 2014/0254099 A1 | * | 9/2014 | Takeda | H01L 23/3677 |
| | | | | 361/701 |
| 2019/0096784 A1 | * | 3/2019 | Katayama | H01L 23/44 |
| 2020/0176357 A1 | * | 6/2020 | Yu | H01L 23/367 |
| 2021/0159139 A1 | * | 5/2021 | Yu | H01L 23/4006 |

\* cited by examiner

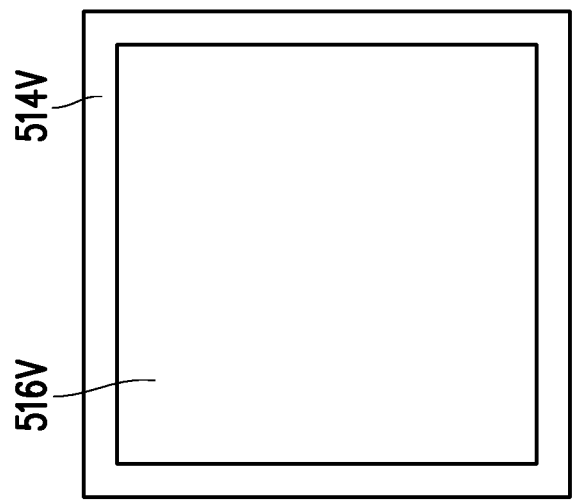
FIG. 31C
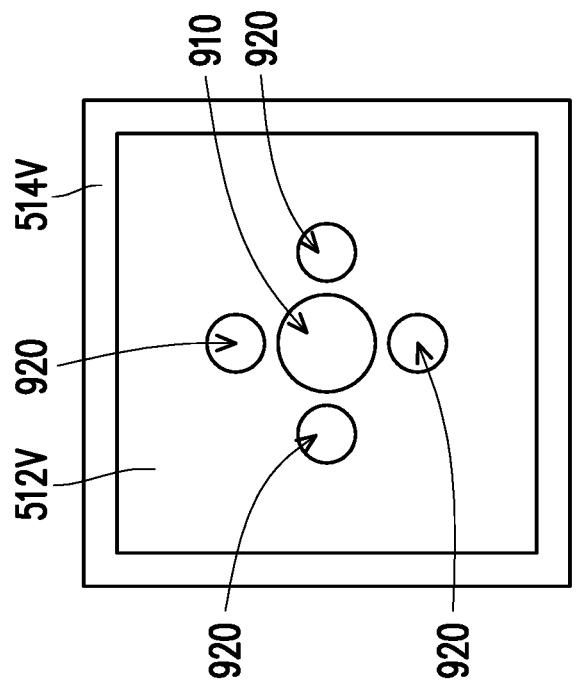
FIG. 31B
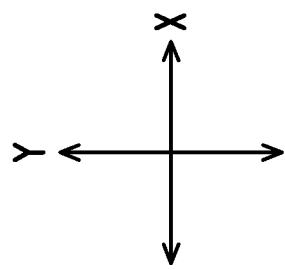

PACKAGE STRUCTURE AND MANUFACTURING METHOD THEREOF

CROSS-REFERENCE TO RELATED APPLICATION

This application claims the priority benefit of U.S. provisional application Ser. No. 62/907,692, filed on Sep. 29, 2019. The entirety of the above-mentioned patent application is hereby incorporated by reference herein and made a part of this specification.

BACKGROUND

As electronic products are continuously miniaturized, heat dissipation of the packaged semiconductor die(s) has become an important issue for packaging technology. In addition, for multi-die packages, the arrangement of the dies and the corresponding connecting elements has impact on data transmission speed among semiconductor dies and reliability of the packaged products.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 31B is a schematic top view illustrating the heat dissipating module depicted in FIG. 31A.

FIG. 31C is a schematic bottom view illustrating the heat dissipating module depicted in FIG. 31A.

DETAILED DESCRIPTION

Figure 1:
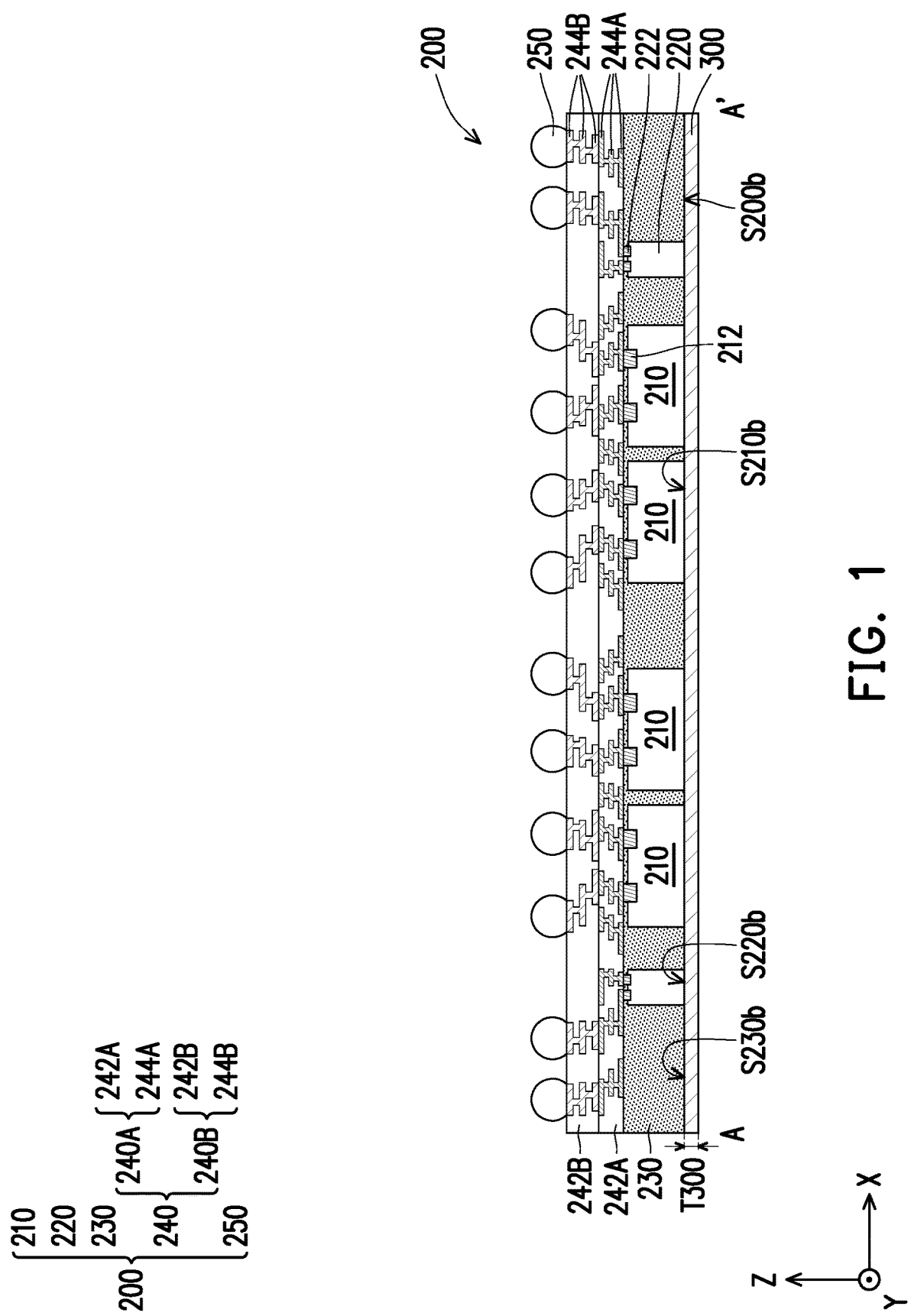
FIG. 1 through FIG. 4 are schematic cross-sectional views illustrating intermediate structures formed at various stages of a manufacturing method of a (semiconductor) package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed. In the disclosure, it should be appreciated that the illustration of components throughout all figures is schematic and is not in scale.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, for a semiconductor device such as a fan-out wafer level chip scale package (WLCSP), semiconductor dies are sawed from wafers before they are packaged onto other wafers, and only "known-good-dies" are packaged. An advantageous feature of this packaging technology is that the I/O pads on a semiconductor die can be redistributed to a greater area than the semiconductor die itself, and hence the number of I/O pads packed on the surfaces of the semiconductor dies can be increased. The disclosure will be described with respect to embodiments in a specific context, namely a package structure having a heat dissipating system which that realizes efficient heat dissipating for the fan-out WLCSP. The embodiments are not limited in this context. And, the embodiments are intended to provide further explanations but are not used to limit the scope of the disclosure. Sometimes, the fan-out WLCSP may also be referred to a semiconductor package of a wafer-form or a fan-out wafer-form semiconductor package.

In addition, the heat dissipating system, which realizes efficient heat dissipating for the fan-out WLCSP, includes one or more inlet channels and one or more outlet channels, where there is a microstructure (capable of slitting the flow of coolant) placed underneath the one or more outlet channels while there may also be or may not be another microstructure (capable of slitting the flow of coolant) placed underneath the one or more inlet channels. For illustrative purposes, the disclosure will be described with respect to embodiments with microstructures underneath both of the inlet and outlet channels. However, the disclosure is not specifically limited to have the microstructure placed underneath the one or more inlet channels of the heat dissipating system, but includes at least the microstructure placed underneath the one or more outlet channels of the heat dissipating system.

Figure 3:
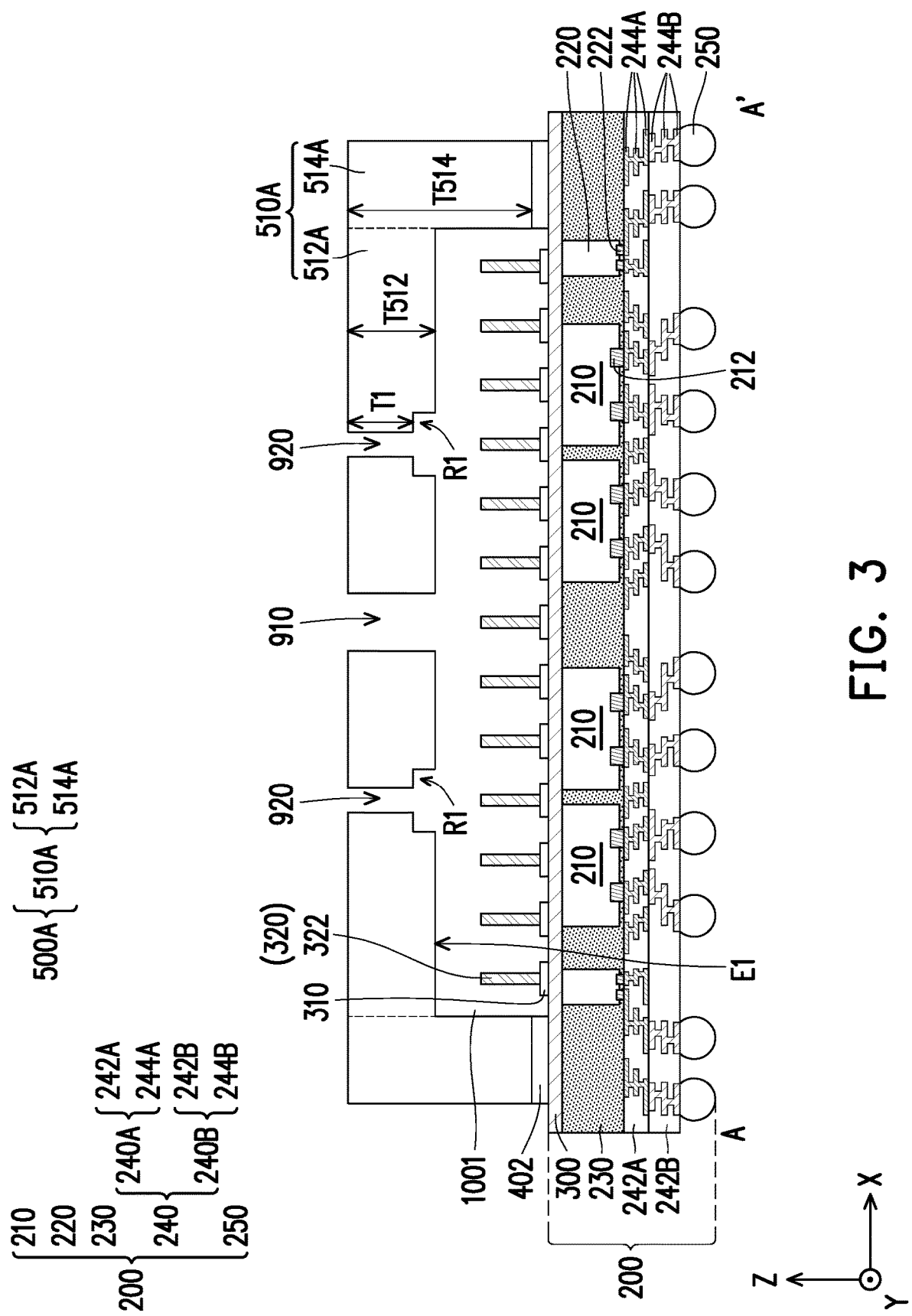
Figure 4:
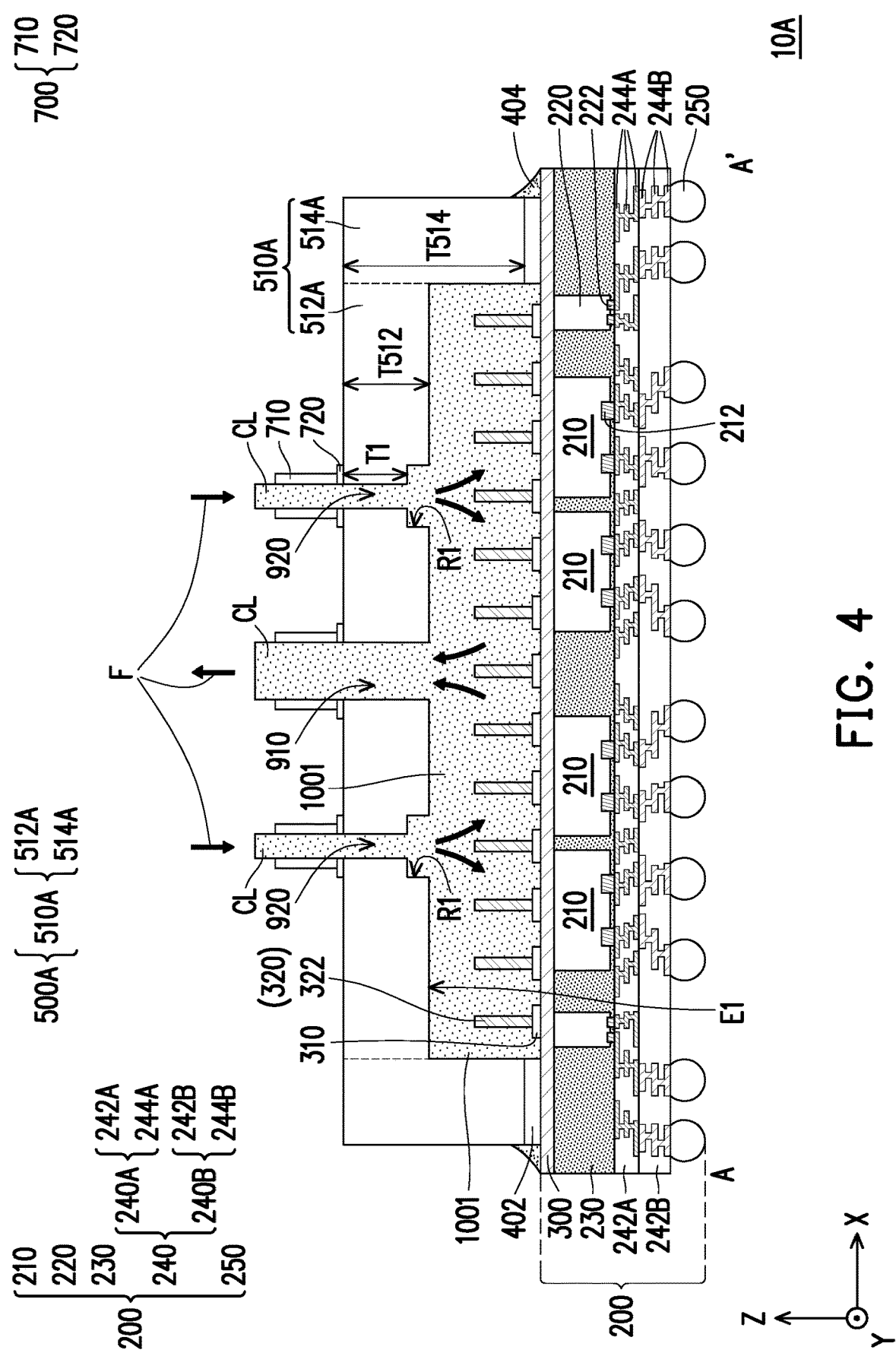
Figure 5:
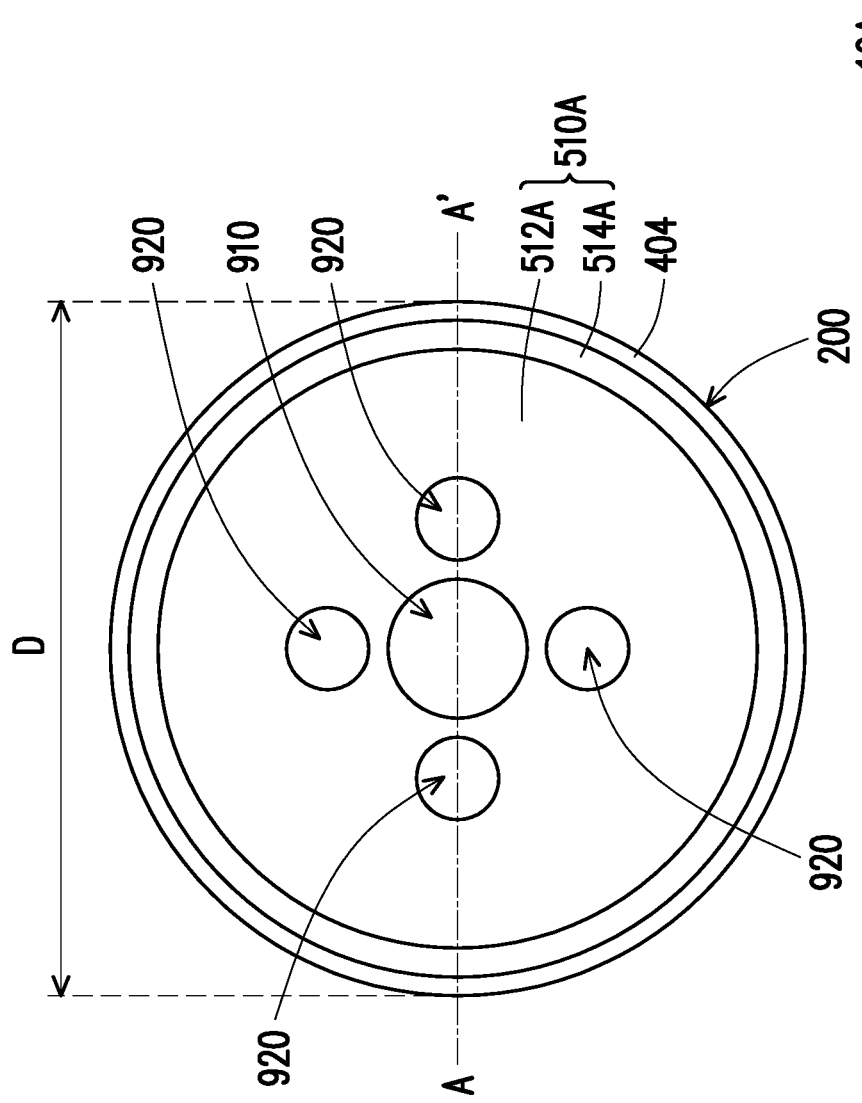
FIG. 5 is a top view illustrating the package structure depicted in FIG. 4.
Figure 5:
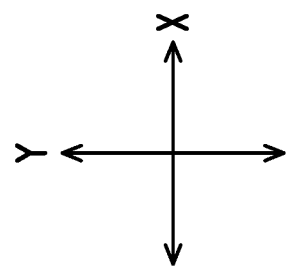
Figure 33:
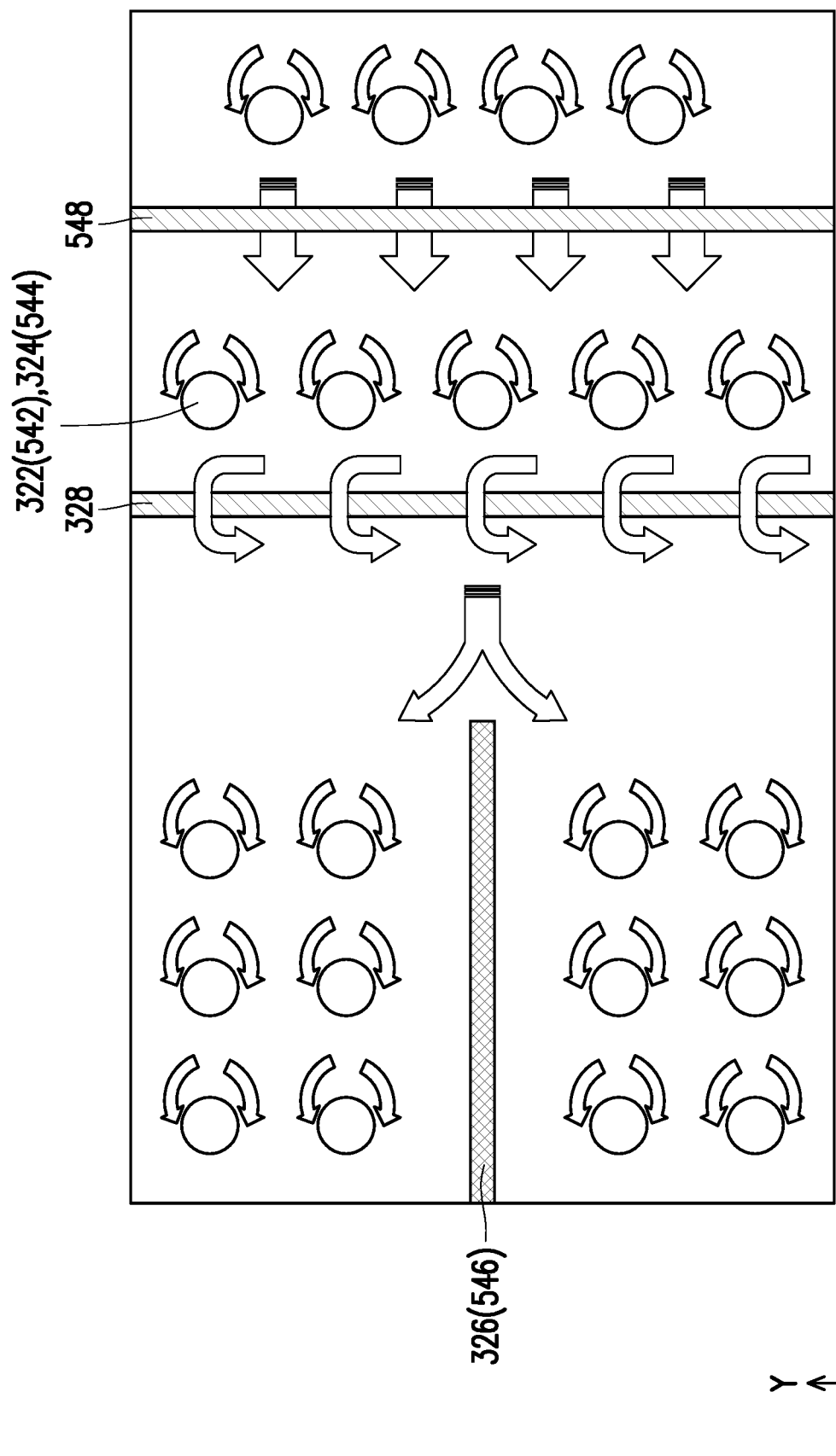
FIG. 33 is a schematic cross-sectional view illustrating fluidic movements inside a heat dissipating system of a package structure in accordance with some embodiments of the disclosure.

FIG. 1 through FIG. 4 are schematic cross-sectional views illustrating intermediate structures formed at various stages of a manufacturing method of a package structure in accordance with some embodiments of the disclosure. FIG. 5 is a top view illustrating the package structure depicted in FIG. 4, where FIG. 1 through FIG. 4 are the cross-sectional views taken along a line AA' depicted in FIG. 5. FIG. 6 through FIG. 13 are schematic cross-sectional views respectively illustrating a package structure in accordance with some other embodiments of the disclosure. FIG. 33 is a schematic cross-sectional view illustrating fluidic movements inside a heat dissipating system of a package structure in accordance with some embodiments of the disclosure. Referring to FIG. 1, in some embodiments, a semiconductor package 200 is provided, and a metallization layer 300 is located over a backside surface S200b of the semiconductor package 200.

For example, the semiconductor package 200 includes a plurality of semiconductor dies 210, a plurality of input/output (I/O) interface dies 220, an insulating encapsulation 230, a redistribution circuit structure 240 and a plurality of conductive elements 250, as shown in FIG. 1. In some embodiments, the conductive elements 250 are the interfaces for external connections to the semiconductor package 200. That is, the conductive elements 250 serve as the conductive terminals of the semiconductor package 200 to electrical connect with the external devices/apparatus (e.g., a circuit carrier such as a circuit board (such as an organic circuit structure, a printed circuit board (PCB)), a system board, or the like; another semiconductor package or device; addition connectors; or the like) for electric signals output and/or input. In alternative embodiments, a semiconductor device (now shown) is optionally bonded to the semiconductor package 200 in a manner similar to the conductive elements 250. The semiconductor device may be an integrated passive element (IPD) or a surface mount device (SMD), the disclosure is not limited thereto.

In some embodiments, the semiconductor package 200 is a wafer-form (or wafer-scale or a wafer-size) semiconductor package. If considering a top view on a X-Y plane extending along a plane perpendicular to a stacking direction (e.g., direction Z) of the redistribution circuit structure 240 and the insulating encapsulation 230, the semiconductor package 200 may have a size (e.g., a diameter D shown in FIG. 5) about 4 inches or more. For example, the semiconductor package 200 has a diameter of about 6 inches. In some examples, the semiconductor package 200 has a diameter of about 8 inches. In some other examples, the semiconductor package 200 may have a diameter of about 12 inches.

The semiconductor dies 210 and the I/O interface dies 220 may be arranged aside to each other along the direction X. The semiconductor dies 210 and the I/O interface dies 220 may be arranged aside to each other along the direction Y. The direction X and the direction Y are not the same to each other and are not the same as the direction Z. For example, the direction X and the direction Y are perpendicular to each other and are respectively perpendicular to the direction Z. In some embodiments, the semiconductor dies 210 are arranged in the form of a matrix, such as a N×N array or a N×M array (N, M>0, N may or may not be equal to M), while the I/O interface dies 220 are arranged to surround the semiconductor dies 210 (arranged into the array/matrix) for providing additional input/output circuitries thereto, and thus more I/O counts are provided to the semiconductor dies 210. The matrix of the I/O interface dies 220 may be a N'×N' array or a N'×M' array (N', M'>0, N' may or may not be equal to M'). That is, in such embodiments, the I/O interface dies 220 are arranged into a matrix surrounding the perimeter of the matrix of the semiconductor dies 210.

However, the disclosure is not limited thereto, in an alternative embodiment, the semiconductor dies 210 and the I/O interface dies 220 are arranged in the form of a matrix, such as the N"×N" array or N"×M" arrays (N", M">0, N" may or may not be equal to M"). With such embodiments, the semiconductor dies 210 and the I/O interface dies 220 are arranged into the matrix in an alternation manner. In a further alternative embodiment, the semiconductor dies 210 are arranged in the form of a first matrix and the I/O interface dies 220 are arranged in the form of a second matrix, where the first and second matrices are N'''×N''' array or N'''×M''' arrays (N''', M'''>0, N''' may or may not be equal to M'''), and the first and second matrices are positioned next to each other along the direction X or the direction Y.

In some embodiments, the semiconductor dies 210 have a plurality of conductive vias 212, where the conductive vias 212 serve as conductive terminals of the semiconductor dies 210 for electrical connection to other devices/elements (e.g., the redistribution circuit structure 240. The semiconductor dies 210 each described herein may be referred to as a semiconductor chip or an integrated circuit (IC). For example, the semiconductor dies 210, independently, are a logic chip, such as a central processing unit (CPU), graphics processing unit (GPU), system-on-chip (SoC), system-on-integrated-circuit (SoIC), microcontroller, or the like. However, the disclosure is not limited thereto; in alternative embodiments, the semiconductor dies 210, independently, are a digital chip, analog chip or mixed signal chip, such as an application-specific integrated circuit ("ASIC") chip, a sensor chips, a wireless and radio frequency (RF) chip, a baseband (BB) chip, a memory chip (such as high bandwidth memory (HBM) dies) or a voltage regulator chip. In further alternative embodiments, the semiconductor dies 210, independently, are referred to as a chip or an IC of combination-type, such as a WiFi chip simultaneously including both of a RF chip and a digital chip. In some embodiments, a type of a first group of the semiconductor dies 210 are different from a type of a second group of the semiconductor dies 210. In other words, the semiconductor dies 210 may include semiconductor chips or ICs of different types and/or the same type; the disclosure is not limited thereto.

In some embodiments, the I/O interface dies 220, independently, have a plurality of conductive vias 222, where the conductive vias 222 serve as conductive terminals of the I/O interface dies 220 for electrical connection to other devices/elements (e.g., the redistribution circuit structure 240. As shown in FIG. 1, only four semiconductor dies 210 and two I/O interface dies 220 are presented for illustrative purposes, however, it should be noted that the number of the semiconductor dies 210 and the number of the I/O interface dies 220 may be one or more than one, the disclosure is not limited thereto.

In some embodiments, the semiconductor dies 210 and the I/O interface dies 220 are encapsulated in the insulating encapsulation 230. The insulating encapsulation 230 laterally wrapped around the semiconductor dies 210 and the I/O interface dies 220, where the conductive vias 212 of the semiconductor dies 210 and the conductive vias 222 of the I/O interface dies 220 are exposed by the insulating encapsulation 230, for example, as shown in FIG. 1. In some embodiments, a sidewall of each conductive via 212 of the semiconductor dies 210 is partially covered (e.g. in physical contact with) by the insulating encapsulation 230. In some embodiments, a sidewall of each conductive via 222 of the I/O interface dies 220 is partially covered (e.g. in physical contact with) by the insulating encapsulation 230. For example, as shown in FIG. 1, illustrated top surfaces of the conductive vias 212 and the conductive vias 222 are substantially leveled with an illustrated top surface of the insulating encapsulation 230. That is, in some embodiments, the illustrated top surfaces of the conductive vias 212, the illustrated top surfaces of the conductive vias 222 and the illustrated top surface of the insulating encapsulation 230 are substantially coplanar to each other for achieving a high degree of coplanarity to facilitate the formation of a later-formed element (e.g., the redistribution circuit structure 240).

However, the disclosure is not specifically limited. In alternative embodiments, the sidewall of each conductive via 212 of the semiconductor dies 210 is partially covered (e.g. in physical contact with) by the insulating encapsulation 230, while the sidewall of each conductive via 222 of the I/O interface dies 220 is not covered by the insulating encapsulation 230. In other embodiments, the sidewall of each conductive via 212 of the semiconductor dies 210 is not covered by the insulating encapsulation 230, while the sidewall of each conductive via 222 of the I/O interface dies 220 is partially covered (e.g. in physical contact with) by the insulating encapsulation 230. Or, in further alternative embodiments, the sidewall of each conductive via 212 of the semiconductor dies 210 is not covered by the insulating encapsulation 230, while the sidewall of each conductive via 222 of the I/O interface dies 220 is also not covered by the insulating encapsulation 230.

The insulating encapsulation 230 may include an acceptable insulating encapsulation material. The insulating encapsulation 230, for example, includes polymers (such as epoxy resins, phenolic resins, silicon-containing resins, or other suitable resins), dielectric materials, or other suitable materials. The insulating encapsulation 230 may be a molding compound formed by a molding process. The insulating encapsulation 230 may further include inorganic filler or inorganic compound (e.g. silica, clay, and so on) which can be added therein to optimize coefficient of thermal expansion (CTE) of the insulating encapsulation 230. The disclosure is not limited thereto.

In some embodiments, the redistribution circuit structure 240 is formed over the semiconductor dies 210, the I/O interface dies 220 and the insulating encapsulation 230. As shown in FIG. 1, the redistribution circuit structure 240, for example, includes a fine-featured portion 240A and a coarse-featured portion 240B, and is electrically connected to the semiconductor dies 210 and the I/O interface dies 220 through connecting to the conductive vias 212 of the semiconductor dies 210 and the conductive vias 222 of the I/O interface dies 220 exposed by the insulating encapsulation 230. In some embodiments, the fine-featured portion 240A is located between the coarse-featured portion 240B and the semiconductor dies 210 and between the coarse-featured portion 240B and the I/O interface dies 220. In some embodiments, the fine-featured portion 240A of the redistribution circuit structure 240 is formed over and electrically coupled to the semiconductor dies 210 and the I/O interface dies 220, and the coarse-featured portion 240B is electrically coupled to the semiconductor dies 210 and the I/O interface dies 220 through the fine-featured portion 240A. In some embodiments, as shown in FIG. 1, the fine-featured portion 240A is capable of providing local electrical communications between the semiconductor dies 210, between the I/O interface dies 220 and between the semiconductor dies 210 and the I/O interface dies 220, while the coarse-featured portion 240B is capable of providing global electrical communications between external devices/apparatus electrically connected to the conductive elements 250 and the semiconductor dies 210 and/or the I/O interface dies 220.

For example, the fine-featured portion 240A includes a dielectric structure 242A and a metallization pattern 244A located in the dielectric structure 242A, and the coarse-featured portion 240B includes a dielectric structure 242B and a metallization pattern 244B located in the dielectric structure 242B. The metallization patterns 244A and the metallization patterns 244B independently may include one or more patterned conductive layers (which being individually referred to as redistribution layers or redistribution lines having line portions (also referred to as conductive lines or traces) on and extending on the X-Y plane and via portions (also referred to as conductive vias) extending on the direction Z), while the dielectric structures 242A and the dielectric structures 242B independently may include one or more dielectric layers arranged alternatively with the patterned conductive layers. The number of the dielectric layers included in one dielectric structure 242A or 242B and the number of the patterned conductive layers included in one metallization pattern 244A or 244B may not be limited to the drawings of the disclosure, and may be selected and designated based on the demand and design requirements.

The fine-featured portion 240A and the coarse-featured portion 240B of the redistribution circuit structure 240 include metallization patterns and dielectric structures of differing sizes, as shown in FIG. 1, for example. In certain embodiments, the patterned conductive layers included in the metallization pattern 244A are formed from a same conductive material, and are formed to a same thickness (e.g., a first thickness) and a same line width (e.g., a first line width), and the patterned conductive layers included in the metallization pattern 244B are formed from a same conductive material, and are formed to a same thickness (e.g., a second thickness) and a same line width (e.g., a second line width). Likewise, in some embodiments, the dielectric layers included in the dielectric structure 242A are formed from a same dielectric material and are formed to a same thickness, and the dielectric layers included in the dielectric structure 242B are formed from a same dielectric material and are formed to a same thickness. In some embodiments, along the direction Z, the patterned conductive layers included in the metallization pattern 244A have the first thickness that is smaller than the second thickness of the patterned conductive layers included in the metallization pattern 244B. On the other hand, on the top view (e.g., on the X-Y plane), the patterned conductive layers included in the metallization pattern 244A have the first line width that is smaller than the second line width of the patterned conductive layers included in the metallization pattern 244B.

The material of the dielectric structures 242A, 242B may include polyimide, epoxy resin, acrylic resin, phenol resin, benzocyclobutene (BCB), polybenzoxazole (PBO), or any other suitable polymer-based dielectric material, and may be formed by deposition, lamination or spin-coating. The material of the metallization patterns 244A, 244B may include aluminum, titanium, copper, nickel, tungsten, and/or alloys thereof, and may be formed by electroplating or deposition. The disclosure is not limited thereto. The dielectric structures 242A, 242B and the metallization patterns 244A, 244B independently may also be patterned by a photolithography and etching process.

The material of the dielectric structure 242A is, for example, as the same as the material of the dielectric structure 242B. For another example, the materials of the dielectric structures 242A and 242B are different from one another. The material of the metallization pattern 244A is, for example, as the same as the material of the metallization pattern 244B. For another example, the materials of the metallization patterns 244A and 244B are different from one another. The disclosure is not limited thereto. In alternative embodiments, the redistribution circuit structure 240 may include metallization patterns of same size and dielectric structures of same size.

In some embodiments, the conductive elements 250 are attached to the redistribution circuit structure 240 for electrically coupling therebetween, as shown in FIG. 1. For example, twelve conductive elements 250 are shown in FIG. 1 for illustrative proposes, however the number of the conductive elements 250 is not limited to the drawings of the disclosure, and may be selected and designed based on the demand. In some embodiments, through the redistribution circuit structure 240, some of the conductive elements 250 are electrically connected to the semiconductor dies 210, and some of the conductive elements 250 are electrically connected to the I/O interface dies 220. Besides, some of the conductive elements 250 may be electrically floated or grounded, the disclosure is not limited thereto. The conductive elements 250 may be disposed on the redistribution circuit structure 240 by ball placement process or reflow process. The conductive elements 250 are, for example, solder balls or ball grid array (BGA) balls or bumps. Alternatively, the conductive elements 250 may include micro-bumps, metal pillars, electroless nickel-electroless palladium-immersion gold (ENEPIG) formed bumps, controlled collapse chip connection (C4) bumps, or the like; and may be formed by plating. The conductive elements 250 may be solder free. In the alternative embodiments of which the semiconductor device(s) is included, the semiconductor device may be disposed on the redistribution circuit structure 240 by flip-chip bonding technology or surface device mounting technology.

In some alternative embodiments (not shown), before disposing/forming the conductive elements 250 on the redistribution circuit structure 240, a plurality of under-ball metallurgy (UBM) patterns are optionally formed on and electrically coupled to the redistribution circuit structure 240, where the strength of connection between the conductive elements 250 and the redistribution circuit structure 240 is enhanced. The conductive elements 250 may be placed on the UBM patterns through ball placement process. That is, the conductive elements 250 may be electrically coupled to the redistribution circuit structure 240 through the UBM patterns. In some embodiments, the UBM patterns are made of a metal layer including a single layer or a metallization layer including a composite layer with a plurality of sub-layers formed of different materials. In some embodiments, the UBM patterns include copper, nickel, molybdenum, titanium, tungsten, titanium nitride, titanium tungsten, combinations thereof, or the like. For example, the UBM patterns include a titanium layer and a copper layer over the titanium layer. The UBM patterns may be formed using, for example, electroplating, sputtering, physical vapor deposition (PVD), or the like. However, the UBM patterns may be omitted from the redistribution circuit structure 240, the disclosure is not limited thereto.

Continued on FIG. 1, in some embodiments, the metallization layer 300 is formed on the backside surfaces S200b of the semiconductor package 200. In some embodiments, the metallization layer 300 may be a single layer or a composite layer having a plurality of sub-layers formed of different materials made of metal or metal alloy, which may include copper, nickel, titanium, tungsten, alloys thereof or other suitable choice of materials. The metallization layer 300 may be, for example, formed through a sputtering process, a PVD process, or the like. In some embodiments, the metallization layer 300 is conformally formed to be in direct contact with the backside surfaces S200b of the semiconductor package 200. As shown in FIG. 1, the metallization layer 300 is formed in a form of a blanket layer to be in physical contact with and covering illustrated backside surfaces S210b of the semiconductor dies 210, illustrated backside surfaces S220b of the I/O interface dies 220 and an illustrated backside surface S230b of the insulating encapsulation 230, where the metallization layer 300 is thermally coupled to and electrically isolated from the semiconductor dies 210 and the I/O interface dies 220. In some embodiments, a thickness T300 of the metallization layer 300 is approximately ranging from 5 µm to 1 mm.

Figure 2:
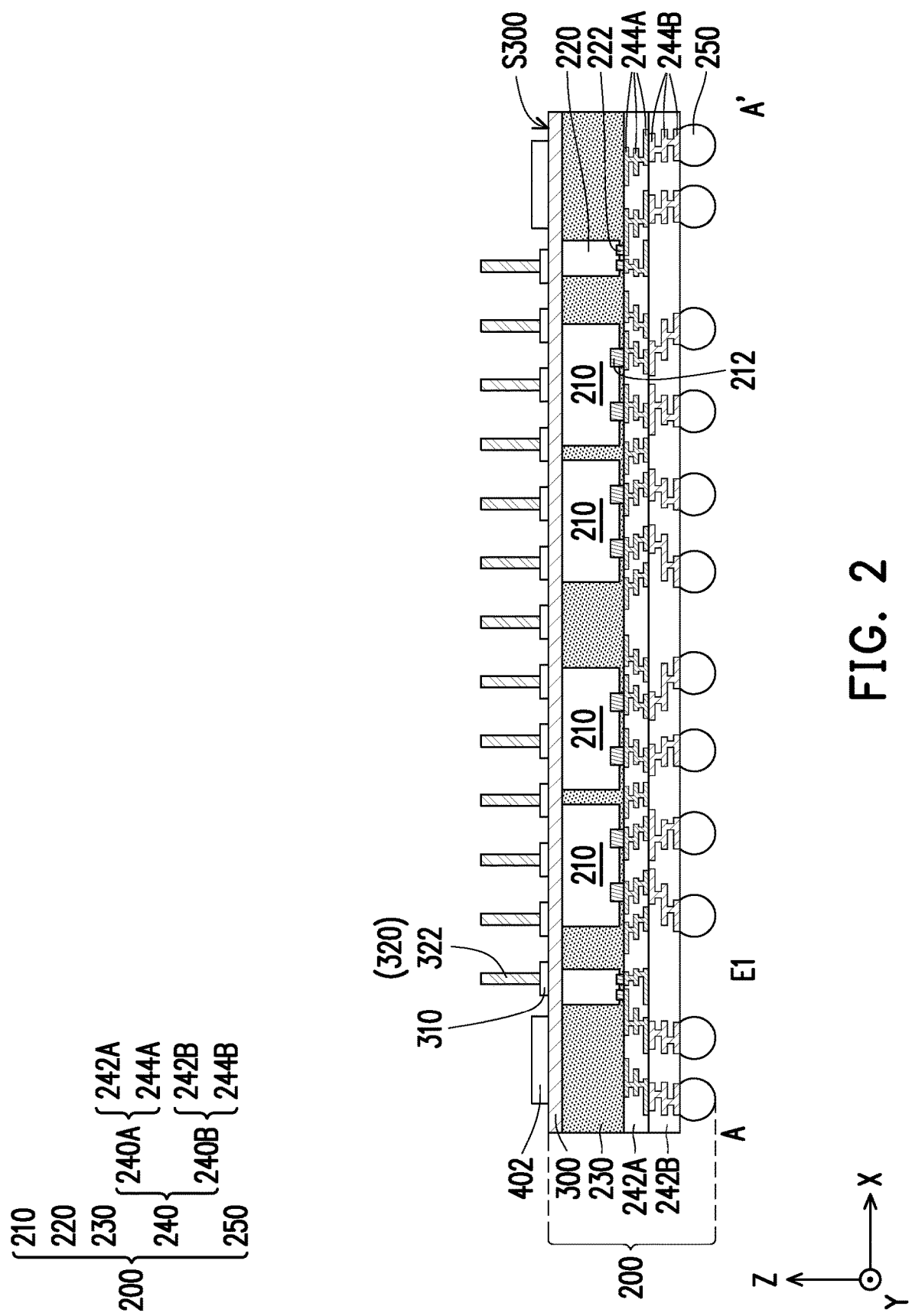

Referring to FIG. 2, in some embodiments, a plurality of bonding pads 310 and a bonding pad 402 are disposed on and distributed over the metallization layer 300. For example, the bonding pads 310 and the bonding pad 402 are, disposed over the semiconductor package 200, on a surface S300 of the metallization layer 300. The bonding pads 310 are surrounded by the bonding pad 402, where the bonding pad 402 is in a closed frame shape, and the bonding pads 310 are placed within a region surrounded by the closed frame shape of the bonding pad 402. In one embodiment, the bonding pads 310 are arranged in the form of a matrix, such as a N""×N"" array or a N"×M" array (N", M">0, N" may or may not be equal to M""). In an alternative embodiment, the bonding pads 310 are arranged randomly. In a further alternative embodiment, the bonding pads 310 are arranged into a pre-determined pattern in correspondence of positioning locations of later-formed elements, e.g. microstructures (e.g. pillars 322, splitters 324, baffles 326, fins 328 or combinations thereof, which will be further described later in FIG. 4, FIG. 11, FIG. 12, and FIG. 13). The shapes of the bonding pads 310 may be circular shapes, rectangular shapes, square shapes, ellipse shapes, polygonal shapes, or the like; the disclosure is not limited thereto.

A material of the bonding pads 310 may include a thermally conductive adhesive material, such as solder paste, for bonding with later-formed elements overlying thereto. In some embodiments, the bonding pads 310 is provided through a printing step (e.g., via stencil printing). For example, the bonding pads 310 include metallic pads made of solder paste by solder printing.

In some embodiments, the bonding pad 402 is formed in a manner of a continuous pad having an annular shape located on the metallization layer 300. The closed frame shape of the bonding pad 402 may be in a circular, a rectangular, ellipse, or polygonal form. A material of the bonding pad 402 is not particularly limited, and may be chosen as a function of a material used for adhering the metallization layer 300 and a heat dissipating element (e.g. a heat dissipation module 500A shown in FIG. 4), where the bonding pad 402 has to secure the metallization layer 300 and the heat dissipation module 500A together. For example, a material of the bonding pad 402 includes a thermo-curable adhesive, photocurable adhesive, thermally conductive adhesive, thermosetting resin, waterproof adhesive, lamination adhesive or a combination thereof. In some embodiments, the material of the bonding pad 402 includes a thermally conductive adhesive. For another example, the bonding pad 402 includes a die attach film (DAF). According to the type of material used, the bonding pad 402 may be formed by deposition, lamination, printing, plating, or any other suitable technique. In some embodiments, the material of the bonding pad 402 is different from the material of the bonding pads 310. In some alternative embodiments, the material of the bonding pad 402 is the same as the material of the bonding pads 310. In an alternative embodiment, the bonding pad 402 is an O-ring for wafer-edge sealing of the wafer-form semiconductor package.

In some embodiments, the bonding pads 310 and the bonding pad 402 are formed in a same step. In some embodiments, the bonding pads 310 and the bonding pad 402 are formed in different steps. The bonding pads 310 may be formed prior to the formation of the bonding pad 402. Alternatively, bonding pads 310 may be formed after the formation of the bonding pad 402. The disclosure is not limited thereto.

Continued on FIG. 2, in some embodiments, after the formation of the bonding pads 310 and the bonding pad 402, a microstructure 320, such as a plurality of pillars 322, is formed on the bonding pads 310 and are thermally coupled to the metallization layer 300 through the bonding pads 310. For example, the pillars 322 are formed over (implanted on) the metallization layer 300 by performing pick-and-place pre-fabricated pillars onto the bonding pads 310 and performing soldering process to secure the pre-fabricated pillars and the bonding pads 310. In some embodiments, a material of the pillars 322 includes metals or metal alloys. However, the disclosure is not limited thereto; in some alternative embodiments, the pillars 322 are directly grown on the metallization layer 300, for example via a deposition or a plating step. For example, as shown in FIG. 2, the pillars 322 protrude directly from the metallization layer 300. In the disclosure, the pillars 322 are referred to as the microstructure 320 for heat dissipating, as the pillars 322 are thermally coupled to the semiconductor package 200 via the bonding pads 310 and the metallization layer 300.

In some embodiments, as show in FIG. 2, along the direction Z, thicknesses (e.g., T322 depicted in FIG. 11) of the pillars 322 are the same. However, the disclosure is not limited thereto; alternatively, the thicknesses of the pillars 322 may be different from each other.

Referring to FIG. 3, in some embodiments, a heat dissipating module 500A is provided and bonded to the metallization layer 300 through the bonding pad 402. For example, the heat dissipating module 500A includes a cover 510A having a central portion 512A and a flange portion 514A at the periphery of the central portion 512A. In some embodiments, the cover 510A is bonded to the metallization layer 300 by connecting the flange portion 514A to the boding pad 402, where the bonding pad 402 is disposed on the metallization layer 300 only where the flange portion 514A is expected to contact the metallization layer 300. For example, the central portion 512A is disposed over the semiconductor package 200 and extends substantially parallel to the metallization layer 300. For example, the flange portion 514A is disposed over the semiconductor package 200 and located at an edge of the central portion 512A, and projected towards the metallization layer 300. In some embodiments, the flange portion 514A extends in a direction perpendicular to the plane defined by the central portion 512A. For example, the flange portion 514A is in contact with the edge of the central portion 512A. In some embodiments, the flange portion 514A and the central portion 512A describe a right angle at their joint, but the disclosure is not limited thereto. In some embodiments, the flange portion 514A is joined to the central portion 512A at different angles than 90 degrees. In some embodiments, as illustrated in FIG. 3, the microstructure 320 (e.g., the pillars 322) is surrounded by the flange portion 514A, and are individually spacing apart from the central portion 512A by a distance. However, the disclosure is not limited thereto, the microstructure 320 (e.g., the pillars 322) may in contact with the central portion 512A of the cover 510A, alternatively.

In some embodiments, the metallization layer 300 and the heat dissipating module 500A including the cover 510A (having the central portion 512A and the flange portion 514A) together define an enclosure E1 of a heat dissipating system, where the enclosure E1 surrounds the microstructure 320 on all sides, and a fluidic channel 1001 is confined by the enclosure E1. In other words, the microstructure 320 is disposed inside the fluidic channel 1001. In some embodiments, the enclosure E1 serves as an accommodating container of a coolant CL (shown in FIG. 4), where the coolant CL is in contact with the pillars 322 placed inside the fluidic channel 1001 to achieve heat transfer from the pillars 322 to the coolant CL for the purpose of heat dissipating.

The central portion 512A may present regions of one or more thicknesses defining no recess, one recess or more recesses. For example, as shown in FIG. 4, when extending over the metallization layer 300, the central portion 512A presents one or more regions with a thickness T512 (as measured along the direction Z) without recesses and one or more regions of another thickness T1 (as measured along the direction Z) with recesses (e.g. R1). In some embodiments, a region of the thickness T1 (which is smaller than the thickness T512) defines a circulation recess R1 over the semiconductor package 200. The thickness T512 and the thickness T1 may be selected and designated based on the demand and/or design requirement, the disclosure is not limited thereto; where the thickness T1 is less than the thickness T512. In some embodiments, the circulation recesses R1 individually are referred to as a fluidic storage or catchment. Owing to the recesses R1, more coolant CL is able to present inside the heat dissipating system for heat dissipation of the package structure 10A. However, the disclosure is not limited thereto; in alternative embodiments, the central portion may have no recess or other recesses different from the recesses R1 (e.g., FIG. 7 through FIG. 10, which will be further described later in detail).

The flange portion 514A may present regions of one or more thicknesses defining no recess, one recess or more recesses. For example, as shown in FIG. 4, the flange portion 514A presents a thickness T514 (as measured along the direction Z) when extending towards the semiconductor package 200 without recesses. The thickness T514 may be selected and designated based on the demand and/or design requirement, the disclosure is not limited thereto; where the thickness T512 is less than the thickness T514. However, the disclosure is not limited thereto; the flange portion may also include one or more recesses (e.g., FIG. 6 and FIG. 7, which will be further described later in detail).

In some embodiments, the central portion 512A includes one or more channels (e.g., 910 and 920) spatially communicated with the fluidic channel 1001. In the disclosure, the channel 910 may be referred to as one of an inflow channel and an outflow channel of the enclosure E1 included in the heat dissipating system, and the channels 920 each may be referred to as other one of an inflow channel and an outflow channel of the enclosure E1 included in the heat dissipating system, there is no specific limitations to the use of the channels 910 and 920. Throughout the disclosure, for illustrative purposes (with the arrows F indicating the flow direction of coolant CL depicted in FIG. 4), the channel 910 is the outflow channel of the coolant CL while the channels 920 are the inflow channels of the coolant CL, for example. However, alternatively, the channel 910 may be the inflow channel of the coolant CL while the channels 920 may be the outflow channels of the coolant CL.

For illustrative purposes, only one channel 910 and only four channels 920 are shown; however, the number of the channel 910 and the number of the channel 920 may not be specifically limited to examples as described in the disclosure, and may be selected and designated based on the demand and/or design requirement. That is, the number of the inflow channels may be greater than, less than or substantially equal to the number of the outflow channels. For example, the number of the channel 910 is different from (e.g. less than (as shown in FIG. 3) or greater than (not shown)) the number of the channel 920. For another example (not shown), the number of the channel 910 is the same as the number of the channel 920.

In some embodiments, the channels (e.g. 910 and/or 920) formed over the components of the semiconductor package 200 generating more heat during usage are used as outflow channels. However, the disclosure is not limited thereto; the channels (e.g. 910 and/or 920) formed over the components of the semiconductor package 200 generating more heat during usage may be used as inflow channels. The positioning configurations of inflow/outflow channel may be determined based on the demand and design requirement (such as a hot spot inside the semiconductor package 200), and may not be limited to the drawings as described in the disclosure.

In some embodiments, a size of the outflow channels may be at least as large as a size of the inflow channels. In alternative embodiments, the size of the outflow channels may be larger (has a wider opening) than the size of the inflow channels. In further alternative embodiments, the size of the outflow channels may be smaller (has a narrow opening) than the size of the inflow channels.

The inflow and/or outflow channels (e.g. 910, 920), one or more than one, may open with the circulation recess R1. For example, as shown in FIG. 3, the channel 910 is not opening with the recess R1 while the channels 920 are opening with the recesses R1. However, the disclosure is not limited thereto; the channels 910 and 920 may be, all or in part, not opening with the recess R1 or with other types of recesses (such as a recess R3 shown in FIG. 8, a recess R4 shown in FIG. 9 or the like).

For example, the channels 910, 920 may be open holes having a substantially vertical profile in the thickness direction, but the disclosure is not limited thereto. In some embodiments, at least a portion of one of the channels 910, 920 may run within the central portion 512A along a direction tilted rather than vertical. In some embodiments, portions of the channels 910, 920 may run parallel to the metallization layer 300. As explained in further detail below, the channels 910, 920 may be filled by the coolant CL (shown in FIG. 4) flowing through the fluidic channel 1001 inside the enclosure E1.

In some embodiments, a material of the central region 512A includes a thermally conductive material. In some embodiments, the material of the central region 512A includes metals or metal alloys, such as copper, aluminum, their alloys, the combinations thereof or the like. In some alternatively embodiments, the material of the central region 512A includes a plastic material, glass, ceramics, or the like. In some other embodiments, the material of the central region 512A includes a semiconductor material such as silicon. In some embodiments, the material of the central region 512A includes polyimide, epoxy resin, acrylic resin (e.g., polymethylmethacrylate, PMMA), phenol resin, BCB, PBO, or any other suitable polymer-based material. In some embodiments, a material of the flange portion 514A may be selected from the same materials listed above for the central region 512A.

In some embodiments, the material of the central region 512A is the same as the material of the flange portion 514A. For example, the central region 512A and the flange portion 514A are produced as a single piece (integrally formed). That is, the flange portion 514A and the central region 512A may be fabricated from the same material, and no interface or clear boundary may be visible between the flange portion 514A and the central region 512A. However, the disclosure is not limited thereto; the material of the flange portion 514A may be different from the material of the central region 512A. A method of forming the cover 510A may be selected according to the material(s) chosen for the central region 512A and the flange portion 514A. In some embodiments, the cover 510A is molded, forged, 3D-printed, grown, or fabricated according to any other suitable technique. In some embodiments, the central region 512A and the flange portion 514A are fabricated separately and then assembled to produce the cover 510A.

Referring to FIG. 4, in some embodiments, a fluid circulation system 700 is installed on the heat dissipating module 500A in correspondence with the channels 910, 920 to form a package structure 10A. That is, for example, with the fluid circulation system 700, the coolant CL flow (in and/or out of the enclosure E1 of the heating dissipating system) is facilitated, thereby ensuring the heat dissipation of the package structure 10A. The cover 510A may be fabricated with washer(s) fitted into the channels 910, 920 for subsequent connection with pipes or tubes. For example, the fluid circulation system 700 includes a plurality of pipes 710 connected to the cover 510A of the heat dissipation module 500A and, optionally, a plurality of washers 720, that secure the attachment of the pipes 710 to the cover 510A. In some embodiments, the pipes 710 and the channels 910, 920 present matching treads (not shown), so that the pipes 710 can be securely fastened into the channels 910, 920, either directly or through intervening pipe connectors (not shown). The pipe connectors may include one-way valves that direct the flow of the coolant CL through the fluidic channel 1001. That is, for example, the pipes 710 are connected with the channels 910, 920 formed in the cover 510A to allow the coolant CL to flow into the enclosure E1 and to flow out of the enclosure E1 for removing heat generated by the semiconductor package 200 of the package structure 10A during usage/operation.

In some embodiments, the coolant CL flows into the enclosure E1 from the channels 920, flows through the microstructure 320 inside the fluidic channel 1001, and flows out of the enclosure E1 from the channel 910. In some embodiments, a stopper (not shown) may be used to seal any of the channels 910, 920 if so required by the design of the fluid circulation system 700. In some embodiments, the coolant CL is a liquid. In some embodiments, the coolant CL is water. Additives may be added to the water to produce a cooling fluid used as the coolant CL. Examples of additives include surfactants, corrosion inhibitors, biocides, antifreeze, and the like.

Continued on FIG. 4, in some embodiments, an underfill 404 is formed on the metallization layer 300 exposed by the heat dissipating module 500A. For example, the underfill 404 at least partially wraps sidewalls of the heat dissipating module 500A (e.g., a sidewall of the flange portion 514A). The underfill 404 may be any acceptable material, such as a polymer, epoxy, molding underfill, or the like, for example. In one embodiment, the underfill 404 is formed by underfill dispensing or any other suitable method. Owing to the underfill 404, the bonding strength between the metallization layer 300 and the heat dissipating module 500A is enhanced, thereby improving the reliability of the package structure 10A.

Up to here, the package structure 10A, which is installed with the heat dissipating system having the heating dissipating module 500A and the metallization layer 300 with the microstructure 320 disposed thereon, is manufactured. In some embodiments, the microstructure 320 defines a network of interstices in fluidic communication inside the heat dissipating system. For example, some of the pillars 322 (e.g. the microstructure 320) located on the metallization layer 300 are positioned underneath the openings of the channels 920, where the coolant CL flows into the heat dissipating system through the channels 920 and is further divided into sub-flows of different directions due to the presence of such microstructure 320. Owing to the microstructure 320 positioned underneath the openings of the channels in the heat dissipating system, the distribution of the coolant flow is improved, thereby enhancing the heat dissipation of the package structure 10A.

However, the disclosure is not limited thereto. The heat dissipating system may be modified by adopting changes in the heat dissipating module and/or by adopting changes in the microstructures. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 6:
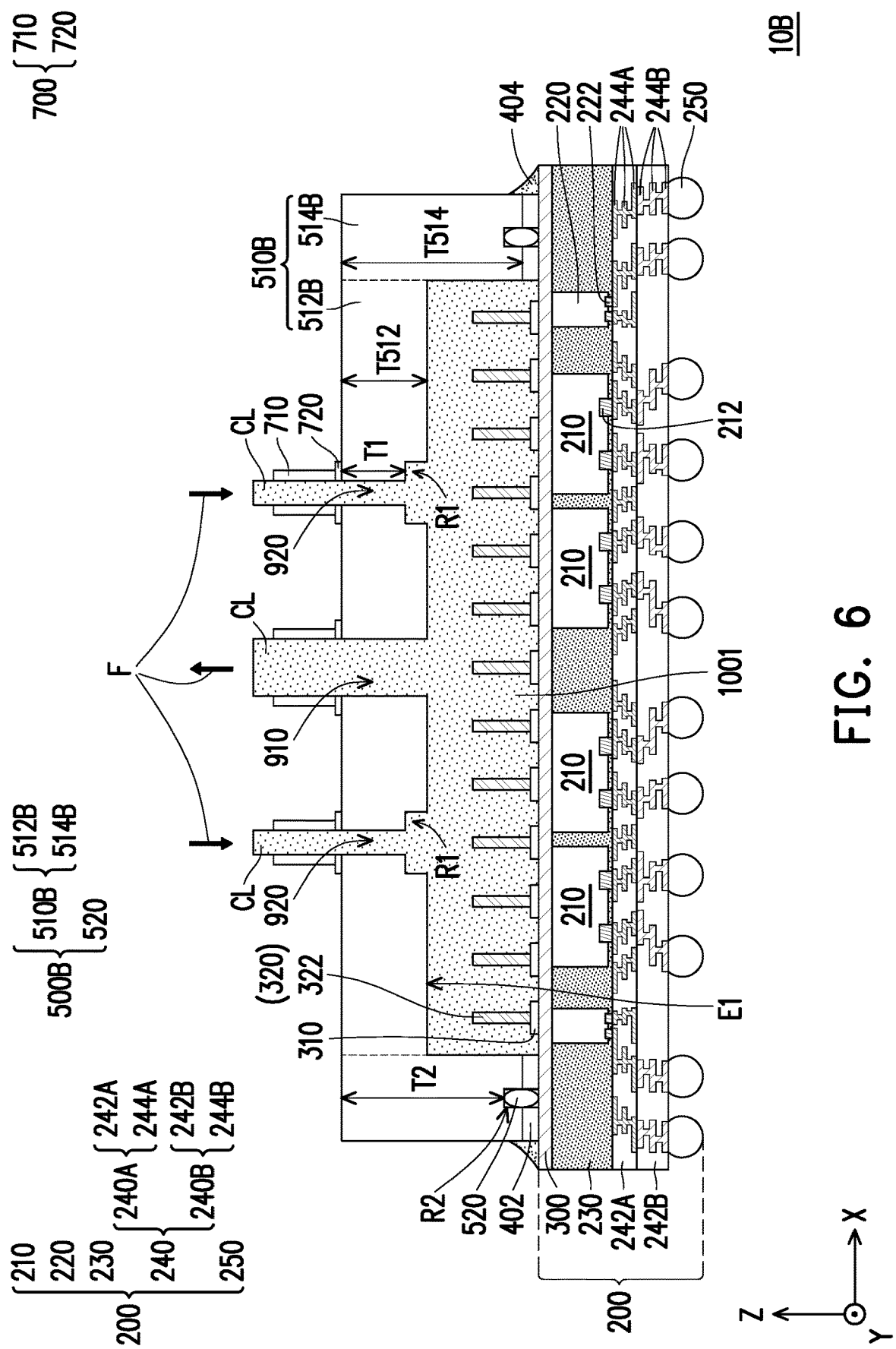
FIG. 6 through FIG. 13 are schematic cross-sectional views respectively illustrating a package structure in accordance with some embodiments of the disclosure.
Figure 7:
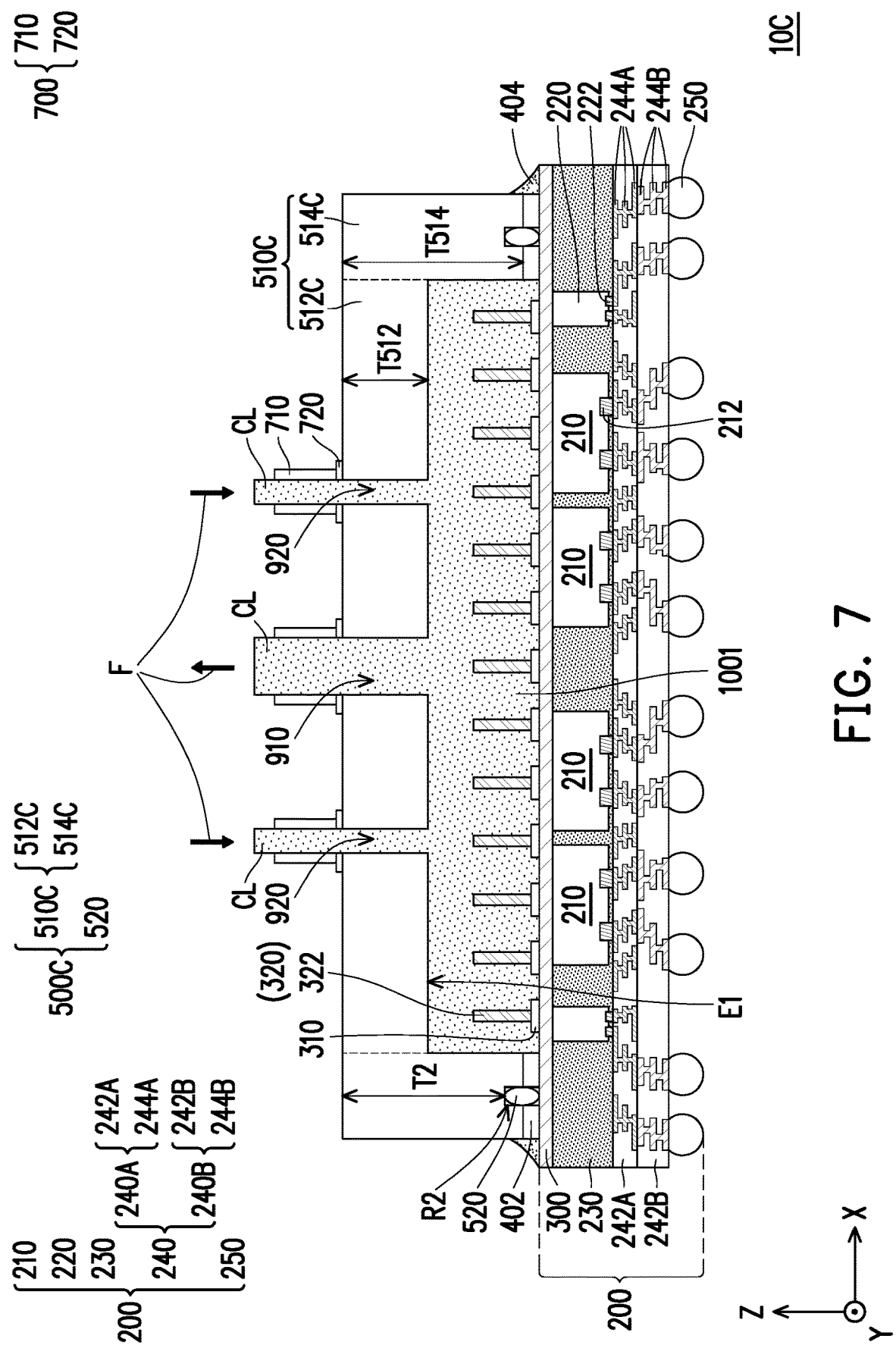

The non-limiting examples of the modifications to the heat dissipating module in the disclosure are shown in FIG. 6 to FIG. 10 for illustrative purposes, and are not intended to limit the scope of the disclosure. Referring to FIG. 4 and FIG. 6 together, the package structure 10A depicted in FIG. 4 and a package structure 10B depicted in FIG. 6 are similar; the difference is that, in the package structure 10B, the heat dissipating module 500A is substituted by a heat dissipating module 500B.

As illustrated in the package structure 10B of FIG. 6, in some embodiments, the heat dissipating module 500B includes a seal 520 in addition to a cover 510B having a central portion 512B and a flange portion 514B at the periphery of the central portion 512B. For example, the central portion 512B and the flange portion 514B are respectively similar to or the same as the central portion 512A and the flange portion 514A as described in FIG. 3, and the difference is that the flange portion 514B not only presents a region having the thickness T514 (as measured along the direction Z) without recesses formed therein but also presents one or more regions of different thickness (e.g., T2 as measured along the direction Z) with a recess (e.g., R2) formed therein. In some embodiments, a region of thickness T2 smaller than the thickness T514 defines an annular recess R2 in the flange portion 514B over the semiconductor package 200, where the recess R2 has a shape similar to (in correspondence of) the shape of the flange portion 514B. The thickness T2 may be selected and designated based on the demand and/or design requirement, the disclosure is not limited thereto; where the thickness T2 is less than the thickness T514. For example, thickness T2 may be determined based on the thickness T322 of the pillars 322 and/or a gap between the flange portion 514B and a nearby pillar 322. In some embodiments, the annular recess R2 is referred to as a seal groove for accommodating the seal 520, as shown in FIG. 6). In some embodiments, the seal 520 is accommodated within the annular recess R2 and physically contacts (or is slightly compressed by) the central portion 512B and the bonding pad 402 over the metallization layer 300. In some embodiments, the seal 520 is a seal ring made of a polymeric material, such as an organic resin or rubber, and provides closure and segregation for avoiding fluid leakage from the enclosure E1. In some embodiments, the seal 520 may include a silicone filling.

Alternatively, the bonding pad 402 may be optionally omitted form the package structure 10B. In such alternative embodiments, a clamping fixture (not shown) is used to providing external pressure to secure the metallization layer 300 and the heat dissipation module 500B together. The clamping fixture may have a configuration similar to a supporting module 600 (will be described later in conjunction with FIG. 16).

Figure 10:
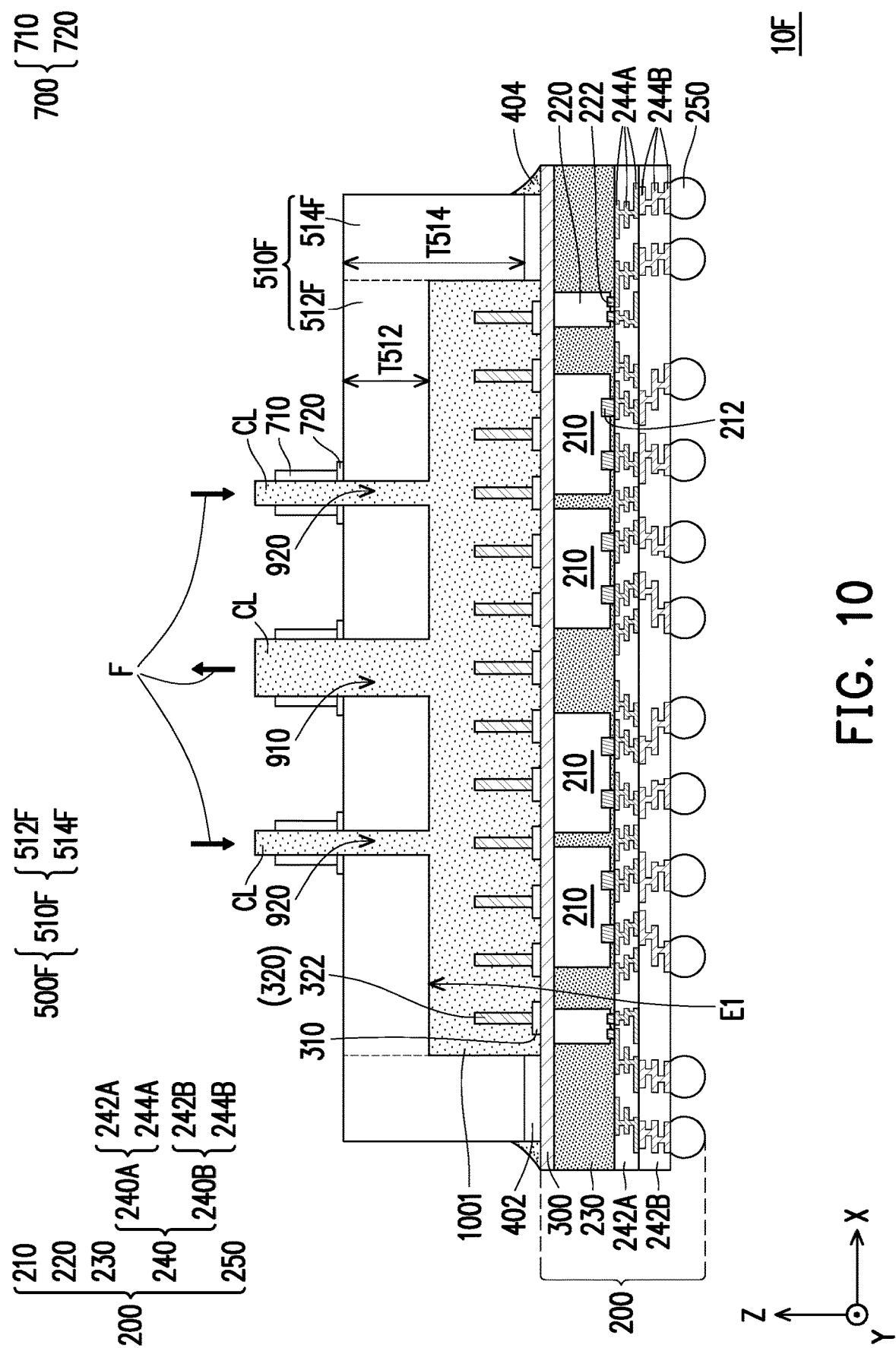

The recesses R1 may be omitted from the package structure 10B (see a package structure 10C depicted in FIG. 7) or from the package structure 10A (see a package structure 10F depicted in FIG. 10). As illustrated in the package structure 10C of FIG. 7, in some embodiments, a heat dissipating module 500C includes a cover 510C having a central portion 512C and a flange portion 514C at the periphery of the central portion 512C. For example, the central portion 512C and the flange portion 514C are respectively similar to or the same as the central portion 512B and the flange portion 514B as described in FIG. 6, and the difference is that the central portion 512C has no recess (e.g. R1). As illustrated in the package structure 10F of FIG. 10, in some embodiments, a heat dissipating module 500F includes a cover 510F having a central portion 512F and a flange portion 514F at the periphery of the central portion 512F. For example, the central portion 512F and the flange portion 514F are respectively similar to or the same as of the central portion 512A and the flange portion 514A as described in FIG. 4, and the difference is that the central portion 512F has no recess (e.g. R1).

Figure 8:
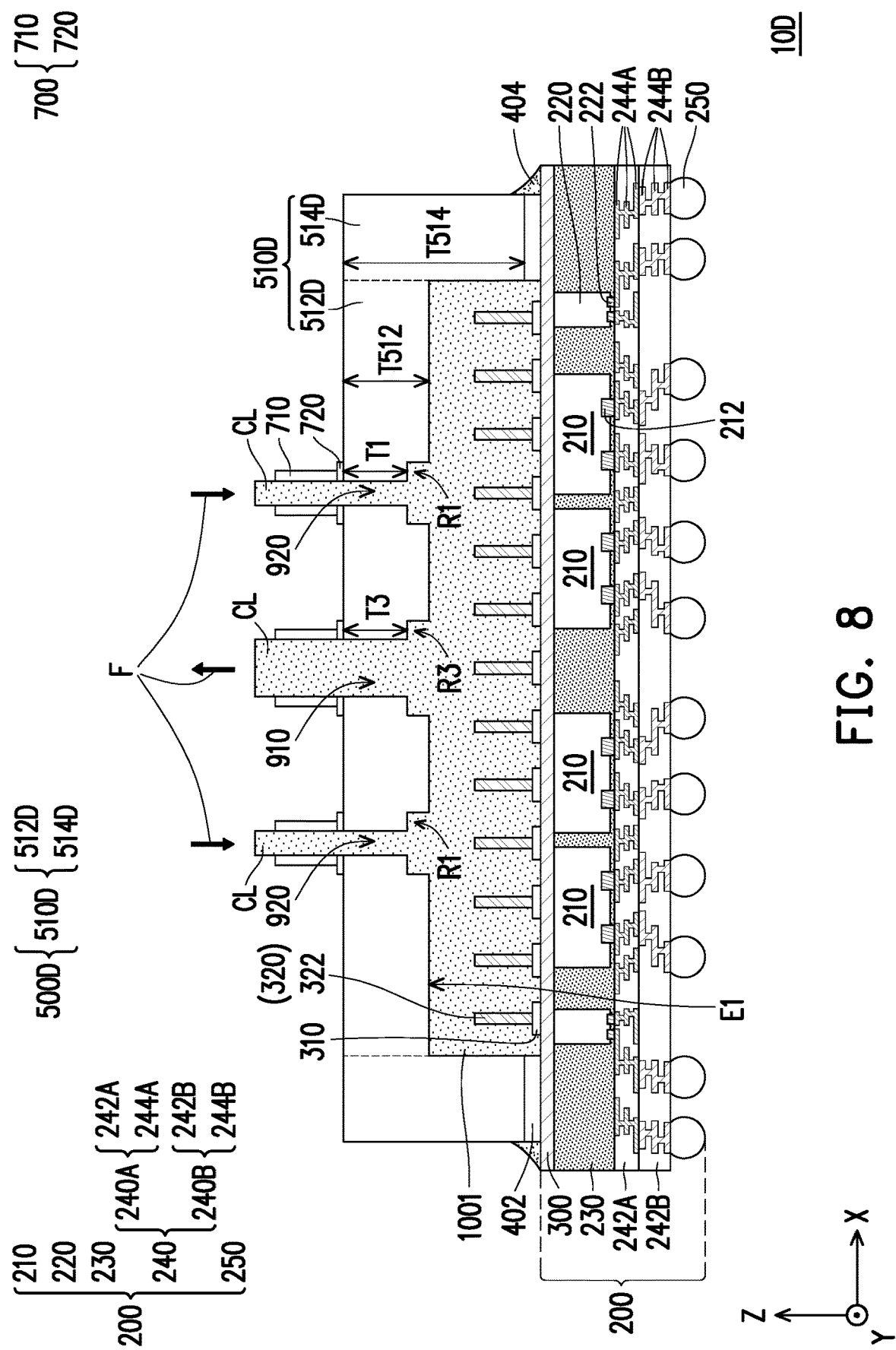
Figure 9:
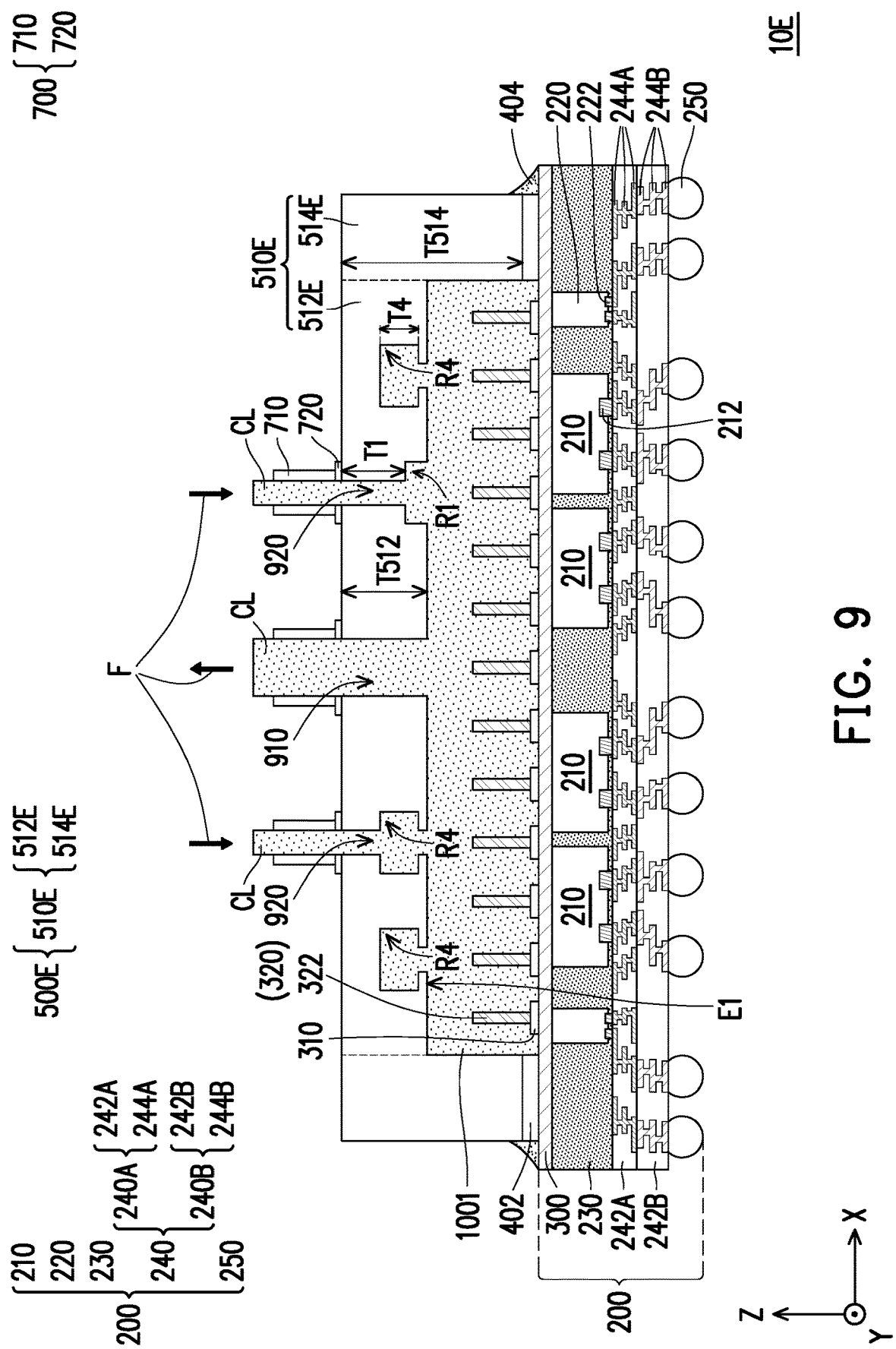

Alternatively, additional recesses may be included to the package structure 10A (see the recess R3 shown in a package structure 10D depicted in FIG. 8 and a recess R4 shown in a package structure 10E depicted in FIG. 9). As illustrated in the package structure 10D of FIG. 8, for example, a heat dissipating module 500D includes a cover 510D having a central portion 512D and a flange portion 514D at the periphery of the central portion 512D. For example, the central portion 512D and the flange portion 514D are respectively similar to or the same as the central portion 512A and the flange portion 514A as described in FIG. 4, and the difference is that the central portion 512D further include at least one recess R3 connected to the channel 910. That is, for example, as shown in FIG. 8, the central portion 512D not only presents the region of the thickness T512 without recesses and the regions of the thickness T1 with the recesses RE but also presents one or more regions of a thickness T3 extending over the metallization layer 300 with one or more recesses (e.g., R3) formed therein. In some embodiments, a region of thickness T3 smaller than the thickness T512 defines a circulation recess R3 over the semiconductor package 200. That is, for example, as shown in FIG. 8, the channel 910 opens with and spatially communicated with the recess R3. In some embodiments, the circulation recess R3 is referred to as a fluidic storage or catchment. Owing to the recess R3, more coolant CL is able to present inside the heat dissipating system for heat dissipation of the package structure 10D. The thickness T3 may be selected and designated based on the demand and/or design requirement, the disclosure is not limited thereto; where the thickness T3 is less than the thickness T512. However, the disclosure is not limited thereto; in alternative embodiments, the central portion 512D may have no other recess except the recess R3.

In other embodiments, as illustrated in the package structure 10E of FIG. 9, a heat dissipating module 500E includes a cover 510E having a central portion 512E and a flange portion 514E at the periphery of the central portion 512E. For example, the central portion 512E and the flange portion 514E are respectively similar to or the same as the central portion 512A and the flange portion 514A as described in FIG. 4, and the difference is that the central portion 512E further include at least one recess R4. That is, for example, as shown in FIG. 9, the central portion 512E not only presents the region of the thickness T512 without recesses and the regions of the thickness T1, but also presents one or more regions extending over the metallization layer 300 with one or more recesses (e.g., R4) formed therein. The thickness T4 may be selected and designated based on the demand and/or design requirement, the disclosure is not limited thereto; where the thickness T4 is less than the thickness T512. The recesses R4 may be additionally included in the central portion 512E or adopted for replacing at least one recess R1 depicted in FIG. 4. For example, as shown in FIG. 9, the channel 920 opens with and spatially communicated with the recess R4 instead of the recess RE while additional recesses R4 are further adopted to ensure the coolant flow distribution and movement. In some embodiments, the recesses R4 are individually referred to as a fluidic slot. Owing to the recesses R4, not only more coolant CL is able to present inside the heat dissipating system for heat dissipation of the package structure 10D, but also the coolant flow distribution and movement is further ensured. However, the disclosure is not limited thereto; in alternative embodiments, the central portion 512E may have no other recess except the recesses R4.

Figure 11:
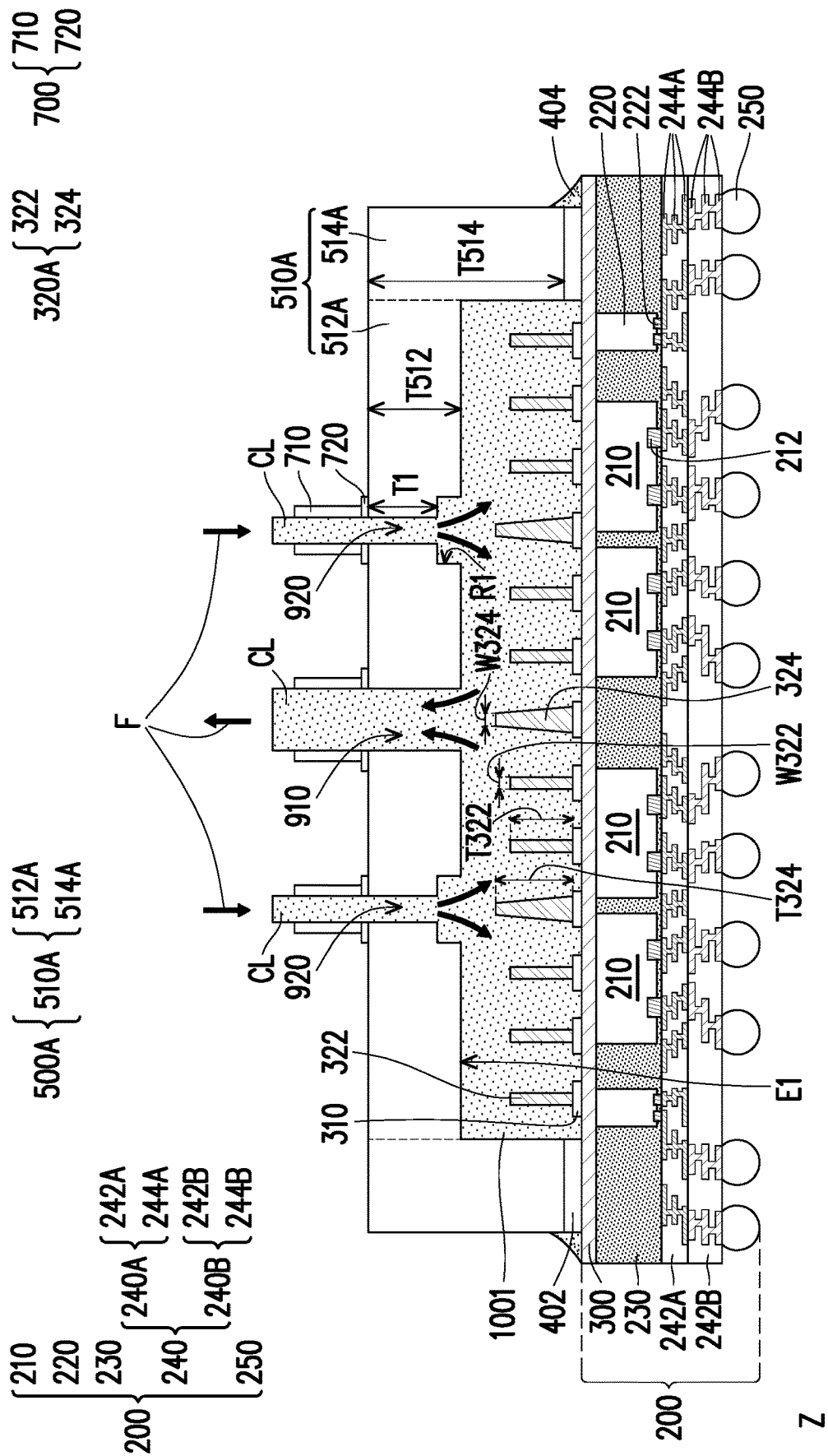
Figure 12:
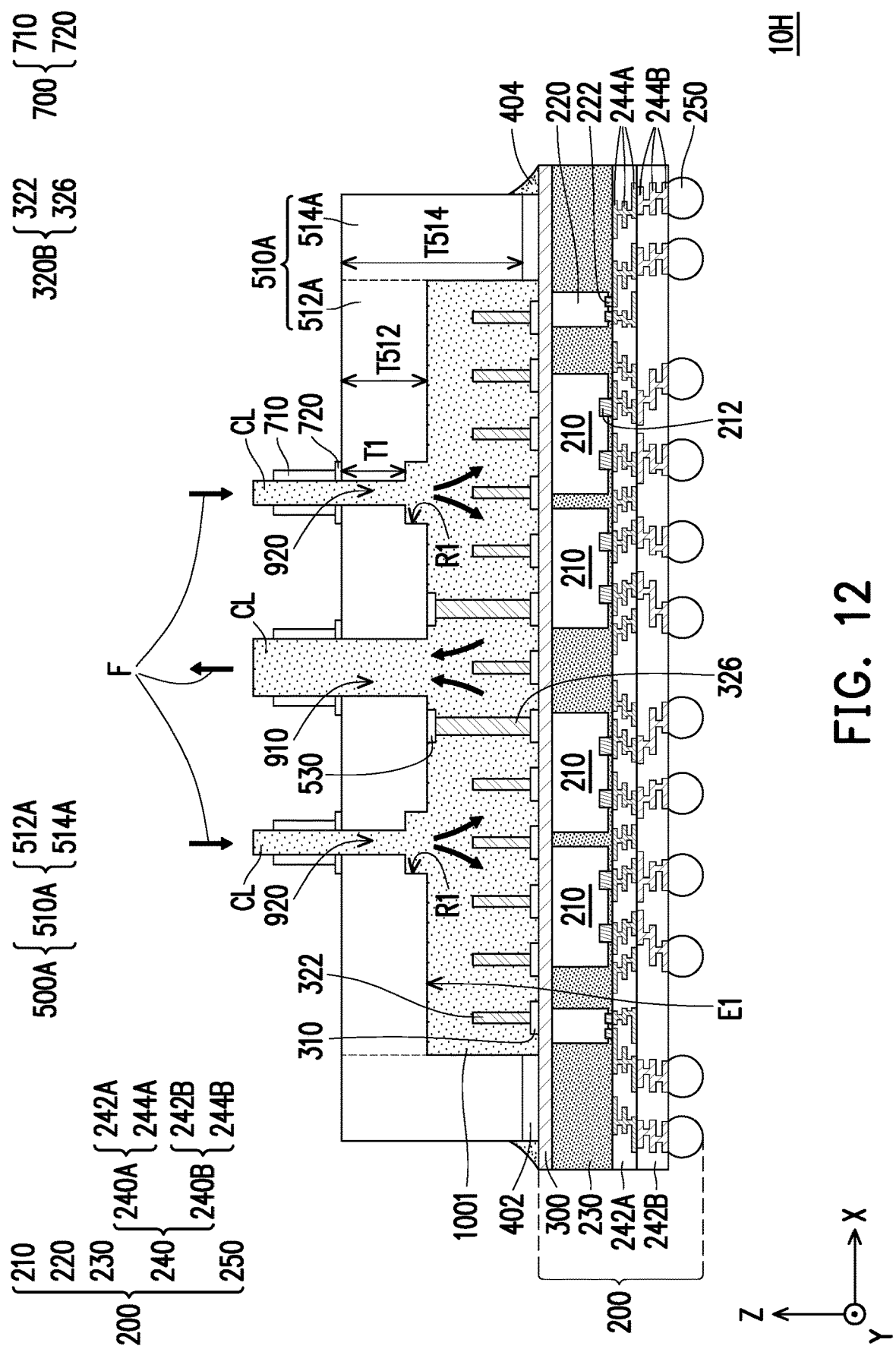
Figure 13:
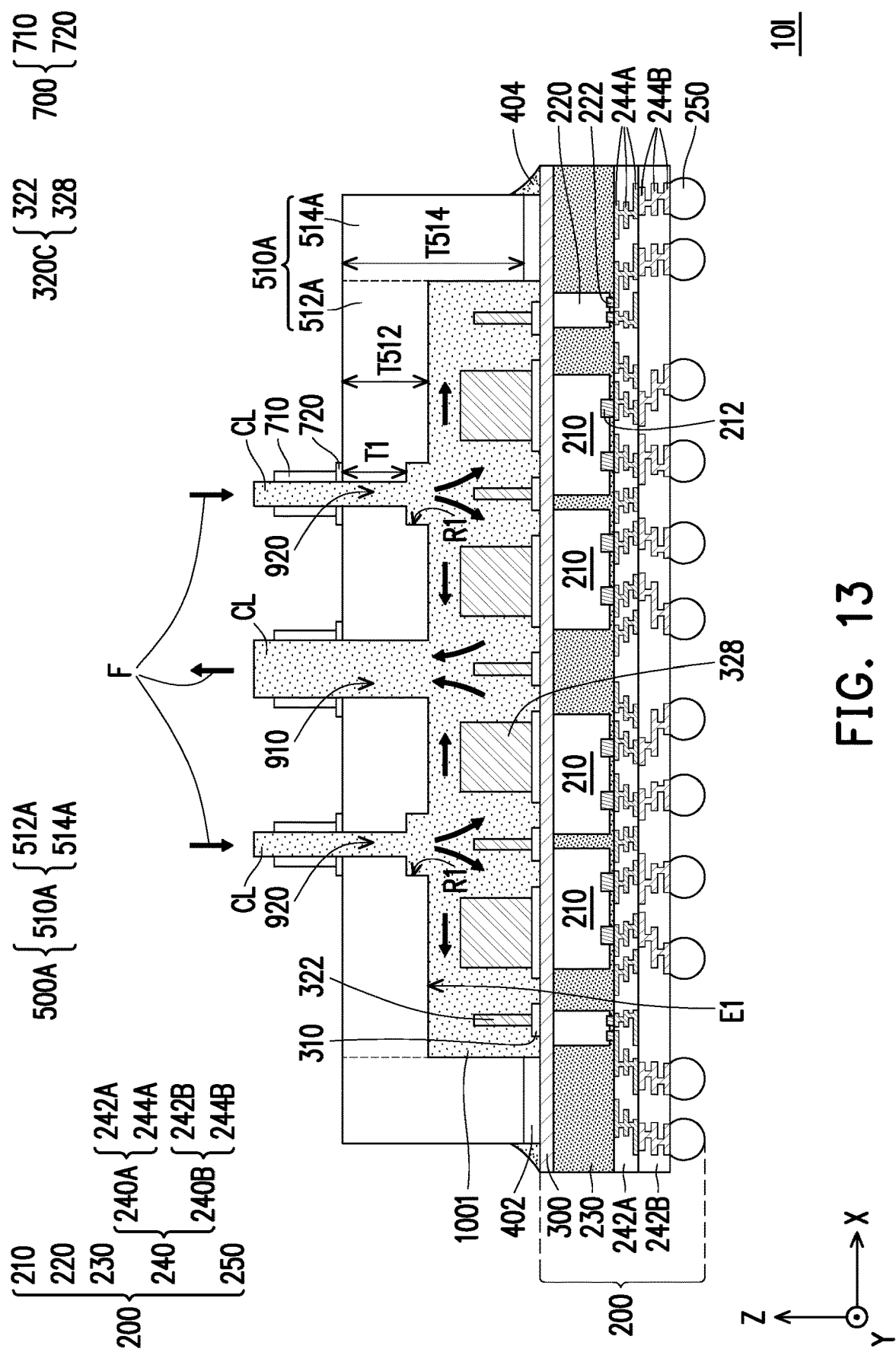

The non-limiting examples of the modifications to the microstructures in the disclosure are shown in FIG. 11 to FIG. 13 for illustrative purposes, and are not intended to limit the scope of the disclosure. For example, a package structure 10G depicted in FIG. 11 is similar to the package structure 10A depicted in FIG. 4, and the difference is that, instead of the microstructure 320, the package structure 10G includes a microstructure 320A. In some embodiments, the microstructure 320A includes a plurality of pillars 322 and a plurality of splitters 324, where the splitters 324 are at least positioned underneath the openings of the channels 910, 920. Due to the splitters 324, the distribution of the coolant flow is further improved, thereby further enhancing the heat dissipation of the package structure 10G. In some embodiments, the pillars 322 individually has a constant width W322 as measured along the direction X and a thickness T322 as measured along the direction Z, where the width W322 and the thickness T322 may be selected and designated based on the demand and/or design requirement, the disclosure is not limited thereto. For example, the pillars 322 are micro-pillars having the constant width along the direction Z from the metallization layer 300 toward the central portion 512A. In some embodiments, the splitters 324 individually has a non-constant width W324 as measured along the direction X and a thickness T324 as measured along the direction Z, where the width W324 and the thickness T324 may be selected and designated based on the demand and/or design requirement, the disclosure is not limited thereto. For example, the splitters 324 are micro-pillars having the width increased along the direction Z from the metallization layer 300 toward the central portion 512A. The material and formation of the pillars 322 have been described in FIG. 2, and thus are not repeated herein for brevity. The formation and material of the splitters 324 may be the same or similar to the formation and material of the pillars 322. Similar to the pillars 322, the splitters 324 are individually spacing apart from the central portion 512A by a distance, for example.

Alternatively, the microstructure 320 may be substituted by a microstructure 320B. For example, a package structure 10H depicted in FIG. 12 is similar to the package structure 10A depicted in FIG. 4, and the difference is that, instead of the microstructure 320, the package structure 10H includes the microstructure 320B. In some embodiments, the microstructure 320B includes a plurality of pillars 322 and a plurality of baffles 326, where the baffles 326 are free from portions of the metallization layer 300 underneath the openings of the channels 910, 920. In some embodiments, two adjacent baffles 326 together confine a partition space (not labeled) inside the fluidic channel 1001. That is, two adjacent baffles 326 define a micro-chamber in between. The number of the partition spaces inside the fluidic channel 1001 is not limited in the disclosure, and may be designated and selected based on the demand. Due to the baffles 326, the movement of the coolant flow is controllable, which leads to a fast heat dissipation, thereby further enhancing the heat dissipation of the package structure 10H. As shown in FIG. 12, the baffles 326 individually are bonded to the metallization layer 300 through the bonding pads 310 and bonded to the central portion 512A through bonding pads 530, for example. In some embodiments, the baffles 326 individually has a constant width (not labeled) as measured along the direction X, where the width of the baffles 326 may be selected and designated based on the demand and/or design requirement, the disclosure is not limited thereto. The formation and material of the baffles 326 may be the same or similar to the formation and material of the pillars 322, and thus are not repeated herein. In some further embodiments, the microstructure 320B further includes the splitters 324.

Furthermore, the microstructure 320 may be substituted by a microstructure 320C. For example, a package structure 10I depicted in FIG. 13 is similar to the package structure 10A depicted in FIG. 4, and the difference is that, instead of the microstructure 320, the package structure 10I includes the microstructure 320C. In some embodiments, the microstructure 320C includes a plurality of pillars 322 and a plurality of fins 328, where the fins 328 are free from portions of the metallization layer 300 underneath the openings of the channels 910, 920. In some embodiments, two adjacent fins 328 together confine a serpentine path (not labeled) inside the fluidic channel 1001. That is, two adjacent fins 328 define a micro-trench in between. The number of the serpentine path inside the fluidic channel 1001 is not limited in the disclosure, and may be designated and selected based on the demand. Due to the fins 328, the movement of the coolant flow is further controllable, thereby further enhancing the heat dissipation of the package structure 10I. As shown in FIG. 13, the fins 328 individually are bonded to the metallization layer 300 through the bonding pads 310 and spacing apart from the central portion 512A via a distance to allowing the coolant CL passing therethrough, for example. In some embodiments, the fins 328 individually has a constant width (not labeled) as measured along the direction X, where the width of the baffles 326 may be selected and designated based on the demand and/or design requirement, the disclosure is not limited thereto. The formation and material of the fins 328 may be the same or similar to the formation and material of the pillars 322, and thus are not repeated herein. In some further embodiments, the microstructure 320C further includes the splitters 324, the baffles 326, or a combination thereof.

For example, the flow movements of the coolant CL due to the presences of the microstructures 320, 320A, 320B, or 320C (e.g., 322, 324, 326, 328) inside the heat dissipating system are demonstrated in FIG. 33 for illustrative purposes, where an arrangement of the microstructures (e.g., 322, 324, 326, 328) is not specifically limited thereto. The non-limiting examples of possible arrangements of the microstructures (e.g., 322, 324, 326, 328) will be discussed in view of FIG. 34 through FIG. 45 (further discussed in detail below). Referring to FIG. 33, in some embodiments, if assuming the coolant CL proceeds from the right side of the drawing towards the left side of the drawing (along the direction X), the incident flow (indicated by arrows) is deviated by the pillars 322 and the splitters 324, forced to pass above the fins 328, and deviated by the baffle 326. In some embodiments, the incident flow of the coolant CL flows in a space between two baffles 326, between two fins 328 or between one baffle 326 and one fin 328, and passes above the pillars 322 and the splitters 324. As show in FIG. 33, the microstructures (e.g., 322, 324, 326, 328) are separated from each other on the X-Y plane, for example. In other words, the microstructures (e.g., 322, 324, 326, 328) are not overlapped to each other in direction Z. In addition, the presences of the microstructures (e.g., 322, 324, 326, 328) along with the metallization layer 300 thermally coupled to the semiconductor package 200 greatly increases the heat dissipation in the direction Z for the semiconductor package 200.

It is appreciated that in the disclosure, the recesses R1, R2, R3, R4 or combinations thereof along with the microstructures (e.g., 322, 324, 326 and 328) may be adopted to the heat dissipating system based on the demand and design layout, as long as there is at least one micro-pillar (e.g., 322 or 324) disposed at a location corresponding to (e.g., underneath) the opening of each of the inflow/outflow channels of the heat dissipating system for splitting the coolant CL into different sub-flows. The numbers of the recesses R1, R2, R3 and R4 and the numbers of the microstructures (e.g., 322, 324, 326 and 328) are not limited to the drawings of the disclosure, and may be selected and designated based on the demand and design layout. In some embodiments, the microstructures (e.g., 322, 324, 326 and 328) may be coated with a thermally conductive material. In some embodiments, the coating material includes graphene or diamond-like carbon (DLC). In some alternative embodiments, the coating material includes metals such as copper or aluminum.

Figure 14:
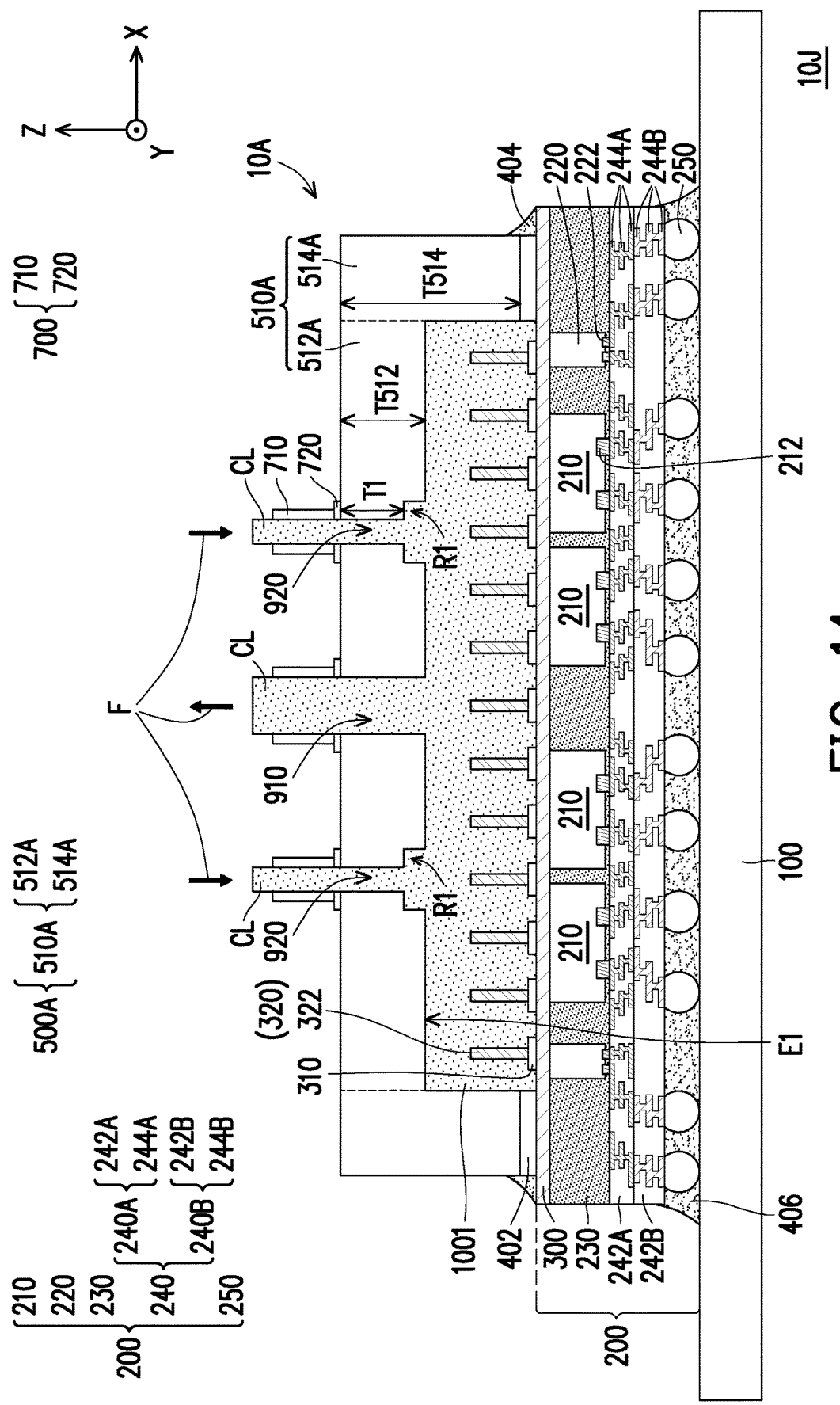
FIG. 14 is a schematic cross-sectional view illustrating a package structure in accordance with some embodiments of the disclosure.

The package structures 10A through 10I may be further mounted with a circuit component (such as a circuit substrate) or other electronic devices to form a stacked package structure through the conductive elements 250 and/or other additional connectors based on the design layout and the demand. For illustration, a non-limiting example is provided as a package structure 10J of a stacked structure in FIG. 14, but the disclosure is not limited thereto. FIG. 14 is a schematic cross-sectional view illustrating a package structure in accordance with some embodiments of the disclosure. Like elements are designated with the same reference numbers for ease of understanding and the details thereof are not repeated herein. Referring to FIG. 14, for example, the (stacked) package structure 10J including a circuit component 100 and the package structure 10A disposed over the circuit component 100 is provided. The circuit component 100 may be or may include an interposer, a package substrate, a printed circuit board (PCB), a printed wiring board, and/or other carrier that is capable of carrying a wafer-form semiconductor package and providing a certain level of circuitry thereto. In the embodiments shown in FIG. 14, the package structure 10A is mounted on the circuit component 100 through the conductive elements 250. In other words, the package structure 10A is electrically coupled to the circuit component 100 through the conductive elements 250, for example. The package structure 10A mounted on the circuit component 100 may be substituted by one of the package structures 10B-10I described above.

In some embodiments, an underfill 406 is formed between the gap of the circuit component 100 and the package structure 10A to at least laterally cover the conductive elements 250. Alternatively, the underfill layer 406 is omitted. In one embodiment, the underfill 406 may be formed by underfill dispensing or any other suitable method. In some embodiments, a material of the underfill 406 may be the same or different from a material of the underfill 404, the disclosure is not limited thereto. Owing to the underfill 406, a bonding strength between the circuit component 100 and the package structure 10A is enhanced, thereby improving the reliability of the package structure 10J.

Figure 15:
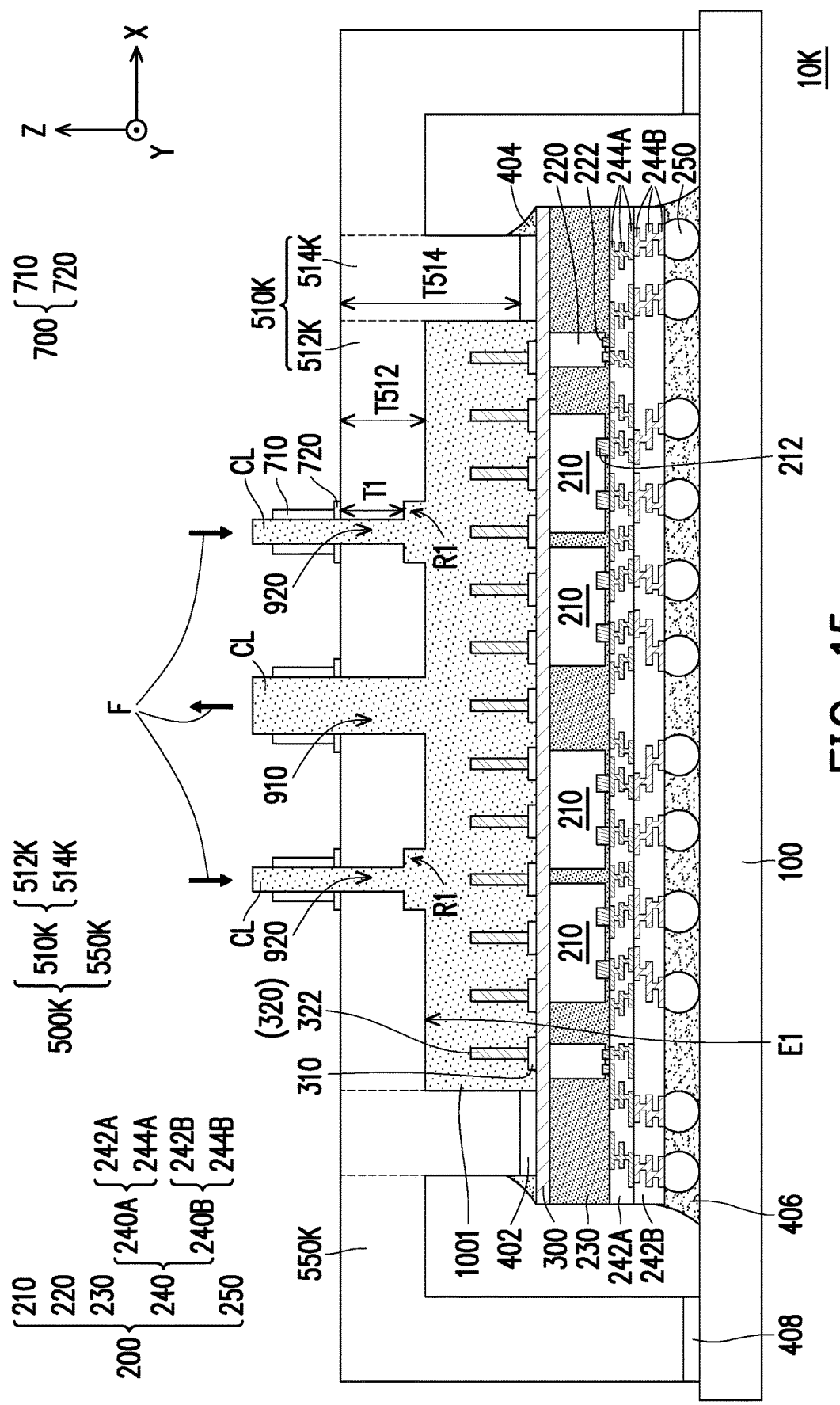
FIG. 15 is a schematic cross-sectional view illustrating a package structure in accordance with some embodiments of the disclosure.

FIG. 15 is a schematic cross-sectional view illustrating a package structure in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 14 and FIG. 15 together, the package structure 10J depicted in FIG. 14 is similar to a (stacked) package structure 10K depicted in FIG. 15; the difference is that, the heat dissipating module 500A is substituted by a heat dissipating module 500K, where the heat dissipating module 500K is not only bonded to the metallization layer 300 through the bonding pad 402 but also bonded to the circuit component 100 through at least one bonding pad 408. The formation and material of the bonding pad 408 is similar to or the same as the formation and material of the bonding pad 402, and thus are not repeated herein. The heat dissipating module 500K include a cover 510K and a flange 550K connected thereto, where the cover 510K includes a central portion 512K and a flange portion 514K at the periphery of the central portion 512K, and the flange 550K is connected to the edge of the cover 510K. In other words, on the X-Y plane, the cover 510K is surrounded by the flange 550K. The flange portion 514K is between the central portion 512A and the flange 550K along the X-Y plane. The central portion 512K and the flange portion 514K are respectively similar to or the same as the central portion 512A and the flange portion 514A as described in FIG. 3, and thus are not repeated herein for brevity.

In some embodiments, the flange 550K have a planar portion (not labeled) extending substantially parallel to the metallization layer 300 and a protrusion portion (not labeled) extending in a direction perpendicular to the plane defined by the planar portion. For example, as shown in FIG. 15, one end of the planar portion is connected to one end of the protrusion portion, where other end of the planar portion is connected to the flange portion 514K, and other end of the protrusion portion is connected to the circuit component 100 through the bonding pad 408. In some embodiments, the protrusion portion and the planar portion describe a right angle at their joint, but the disclosure is not limited thereto. In some embodiments, the protrusion portion is joined to the planar portion at different angles than 90 degrees. In some embodiments, a material of the flange 550K is the same or similar to the material of the cover 510K. For example, the flange 550K and the cover 510K are produced as a single piece (integrally formed). In an alternative embodiment, the flange 550K and the cover 510K are fabricated separately and then assembled to produce the heat dissipating module 500K. Owing to the flange 550K, the bonding strength between the metallization layer 300 and the heat dissipating module 500K is further ensured, thereby improving the reliability of the package structure 10K.

Figure 16:
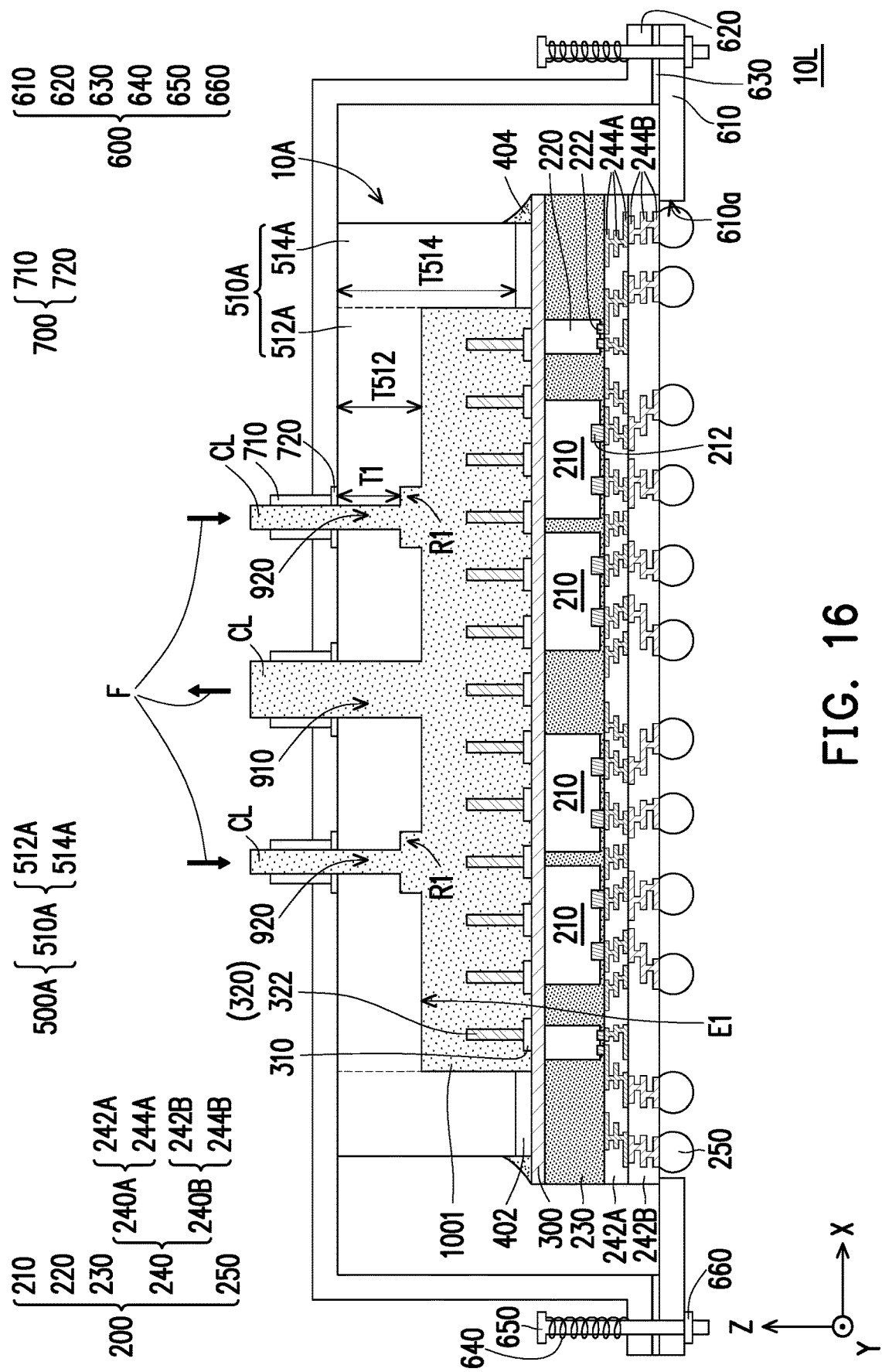
FIG. 16 is a schematic cross-sectional view illustrating a package structure in accordance with some embodiments of the disclosure.

However, the disclosure is not limited thereto; an additional element may be adopted to secure the bonding strength between the heat dissipating module and the metallization layer to improve the reliability of the package structure in the disclosure. For illustration, a non-limiting example is provided as a package structure 10L in FIG. 16. FIG. 16 is a schematic cross-sectional view illustrating a package structure in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein.

Referring to FIG. 16, in some embodiments, a package structure 10L including a supporting module 600 and the package structure 10A disposed inside of the supporting module 600 is provided. The package structure 10A includes the semiconductor package 200 and the heat dissipating system (having the metallization layer 300 and the heat dissipating module 500A), where the heat dissipating system is located on and thermally coupled to the semiconductor package 200, and the semiconductor package 200 and the heat dissipating system disposed thereon are together placed into an accommodating space in the supporting module 600. The detail of the semiconductor package 200 has been described in FIG. 1 while the detail of the heat dissipating system (having the metallization layer 300 and the heat dissipating module 500A) has been described in FIG. 2 through FIG. 4, and thus are not repeated herein.

For example, the supporting module 600 includes a first plate 610, a second plate 620, a buffer element 630, a plurality of elastic elements 640, a plurality of bolts 650 and a plurality of fasteners 660, as shown in FIG. 16. In some embodiments, the buffer element 630 is sandwiched between the first plate 610 and the second plate 620 to avoid damages caused by directly physical contacts therebetween. A material of the elastic element 630 may include an elastic material capable of dissipating heat, such as a thermal foam, a thermal rubber, or a thermal cushion. In some embodiments, the bolts 650 penetrate through the first plate 610, the second plate 620 and the buffer element 630 sandwiched thereto, and the fasteners 660 are respectively threaded onto the bolts 650 and tightened to clamp the first plate 610 and the second plate 620. In some embodiments, the elastic elements 640 are individually located between one bolt 650 and the second plate 620 to avoid damages caused by directly physical contacts therebetween. The elastic elements 640 may be springs or the like. The fasteners 660 may be, e.g., nuts that thread to the bolts 650. In some embodiments, the accommodating space is confined by the clamped first plate 610 and second plate 620, where a plurality of openings (not shown) formed in the second plate 620 for allowing the pipes 710 passing through and protruding out of the supporting module 600 to facilitate flow-in or flow-out of the coolant CL, and an opening hole 610a is formed in the first plate 610 for allowing the conductive elements 250 passing through and protruded out of the supporting module 600 for electrical connections to other external elements. For example, as shown in FIG. 16, the conductive elements 250 are exposed through the opening 610a of the supporting module 600. In some embodiments, the first plate 610 is formed in a frame shape, such as a ring-shape. Owing to the supporting module 600, an addition exerted force is applied to the package structure 10L, the bonding strength between the metallization layer 300 and the heat dissipating module 500A is greatly ensured, thereby improving the reliability of the package structure 10L.

In some embodiments, as shown in FIG. 16, the first plate 610 is located on the redistribution circuit structure 240 of the semiconductor package 200 while the second plate 620 is in contact with the heat dissipating module 500A. For one example, the supporting module 600 is thermally coupled to and electrically isolated from the semiconductor package 200. For another example, the supporting module 600 is thermally isolated and electrically isolated from the semiconductor package 200. The material of the first plate 610 may be different form the material of the second plate 620. Alternatively, the material of the first plate 610 may be the same as the material of the second plate 620. For example, a material of the supporting module 600 includes acrylic, aluminum, stainless steel, or the like, the disclosure is not limited thereto.

In one embodiment, the material of the first plate 610 and the material of the second plate 620 are independently different from the material of the central portion 512A of the cover 510A and/or the material of the flange portion 514A of the cover 510A. In an alternative embodiment, the material of the first plate 610 and the material of the second plate 620 are independently the same or similar to the material of the central portion 512A of the cover 510A and/or the material of the flange portion 514A of the cover 510A. The disclosure is not limited thereto, as long as the supporting module 600 is electrically isolated from the semiconductor package 200.

For example, as shown in FIG. 16, the second plate 620, the central portion 512A and the flange portion 514A are fabricated separately and then assembled together, where an additional first seal element (not shown) is further adopted between the second plate 620 and the central portion 512A and between the second plate 620 and the flange portion 514A to avoid damages caused by directly physical contacts therebetween. Alternatively, the second plate 620, the central portion 512A and the flange portion 514A may be produced as a single piece (integrally formed), where the additional first seal element is omitted therefrom. Besides, in some embodiments, an additional second seal element (not shown) is adopted between the first plate 610 and the redistribution circuit structure 240 of the semiconductor package 200 to avoid damages caused by directly physical contacts therebetween. The additional first and second seal elements, independently, may include a seal ring made of a polymeric material or the like, the disclosure is not limited thereto.

In the disclosure, if considering the structures of the heat dissipating modules 500A through 500F mentioned above, the cover 510A through the cover 510F independently may be considered as a structure of a single piece. However, in the disclosure, a cover of the heat dissipating module may include a structure of a two-piece, see FIG. 17A and FIGS. 19A-19B as described below in detail.

Figure 17A:
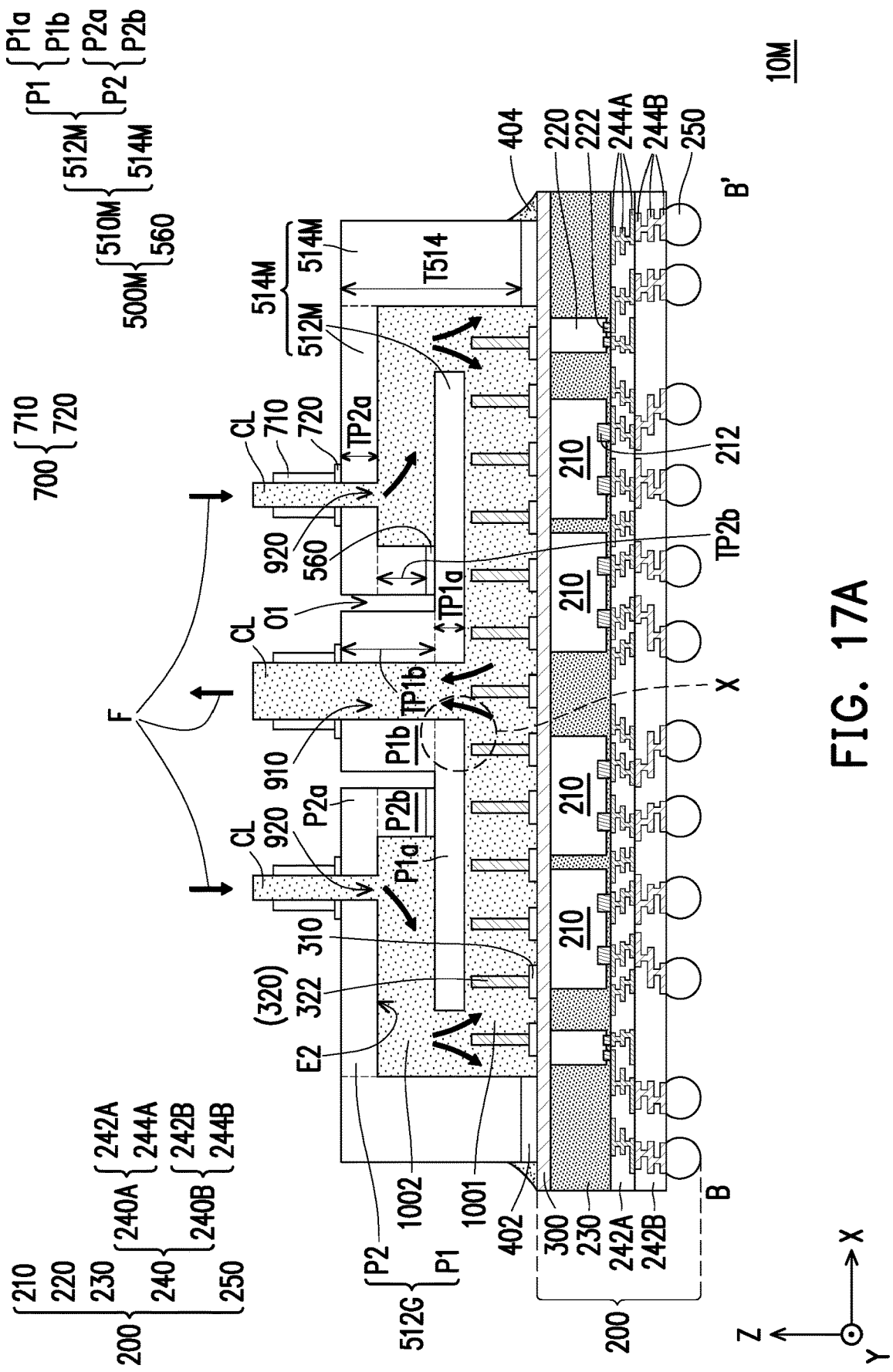
FIG. 17A is a schematic cross-sectional view illustrating a package structure in accordance with some embodiments of the disclosure.
Figure 17B:
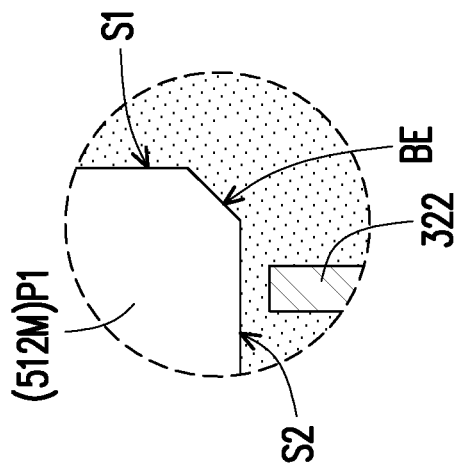
FIG. 17B is an enlarged and schematic cross-sectional view illustrating a configuration of a portion of the heat dissipating module depicted in FIG. 17A.
Figure 17C:
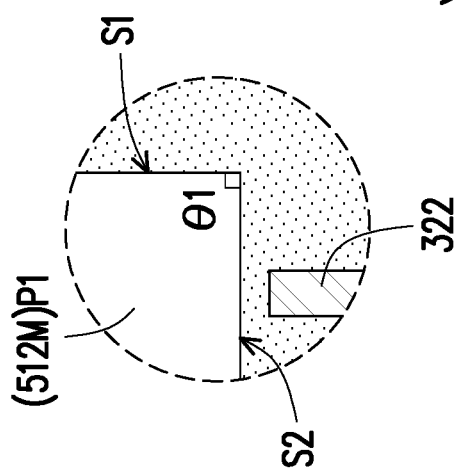
FIG. 17C is an enlarged and schematic cross-sectional view illustrating a configuration of a portion of the heat dissipating module depicted in FIG. 17A.
Figure 18C:
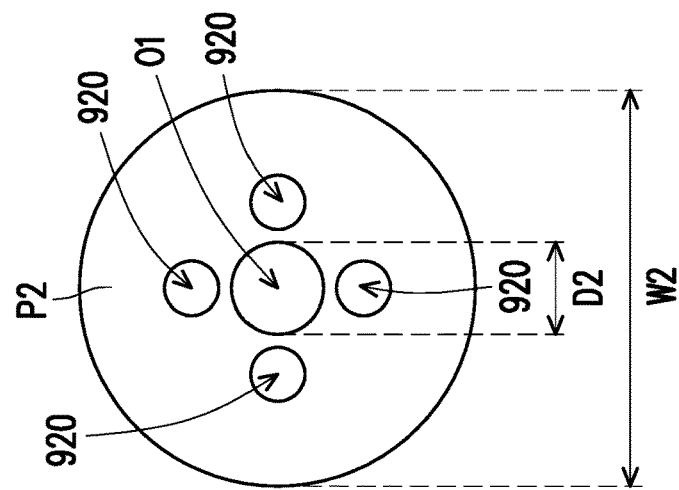
FIG. 18B and FIG. 18C are schematic top views respectively illustrating different parts of a heat dissipating module in the package structure depicted in FIG. 17A.
Figure 18B:
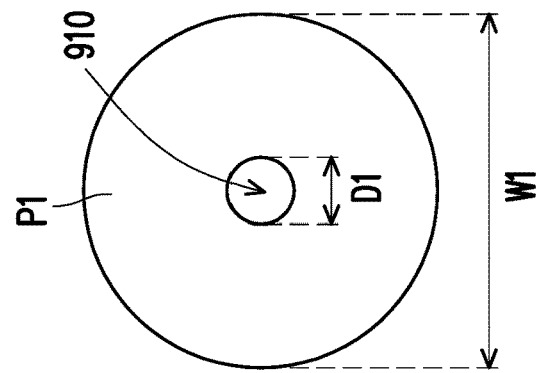
Figure 18A:
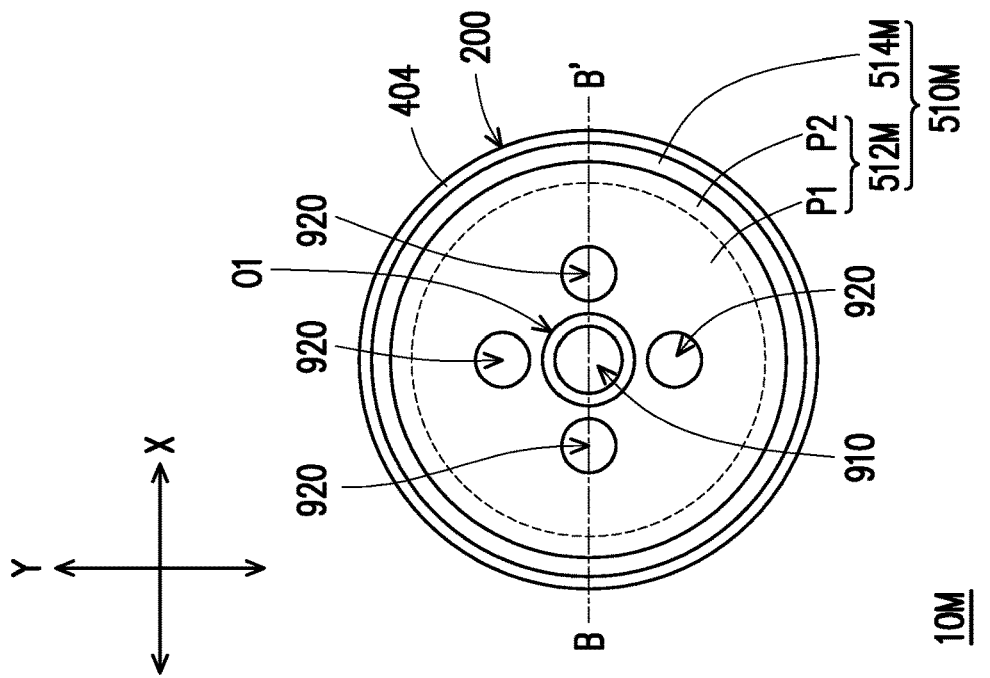
FIG. 18A is a schematic top view illustrating the package structure depicted in FIG. 17A.

FIG. 17A is a schematic cross-sectional view illustrating a package structure in accordance with some embodiments of the disclosure. FIG. 17B and FIG. 17C are enlarged and schematic cross-sectional views illustrating a configuration of a portion of the heat dissipating module depicted in FIG. 17A. FIG. 18A is a schematic top view illustrating the package structure depicted in FIG. 17A, where FIG. 17A is the cross-sectional view taken along a line BB' depicted in FIG. 18A. FIG. 18B and FIG. 18C are schematic top views respectively illustrating different parts of a heat dissipating module in the package structure depicted in FIG. 17A. Referring to FIG. 17A and FIG. 18A, in some embodiments, a package structure 10M includes a semiconductor package 200 and a heat dissipating system thermally coupled to the semiconductor package 200. For example, the heat dissipating system includes a metallization layer 300 (with the pillars 322 (e.g. microstructure 320) disposed thereon via the bonding pads 310) and a heat dissipating module 500M, where the metallization layer 300 is located on and thermally coupled to the semiconductor package 200, and the heat dissipating module 500M is bonded to the metallization layer 300 through the bonding pad 402 to form the heat dissipating system thermally coupled to the semiconductor package 200. The underfill 404 are formed over the metallization layer 300 exposed by the heat dissipating module 500M, where the underfill 404 surrounds the sidewall of the heat dissipating module 500M, for example. The details of the semiconductor package 200, the metallization layer 300, the bonding pads 310/402, the microstructure 320 and the underfill 404 have described in FIG. 1 through FIG. 4, and thus are not repeated herein for simplicity.

In some embodiments, the heat dissipating module 500M includes a cover 510M having a central portion 512M and a flange portion 514M at the periphery of the central portion 512M. In some embodiments, the central portion 512M includes a first portion P1 and a second portion P2 connected thereto. In some embodiments, the first portion P1 has a planar portion P1a and a protrusion portion P1b connected thereto, where the planar portion P1a extends substantially parallel to the metallization layer 300 and the protrusion portion P1b extends in a direction substantially perpendicular to a plane defined by the planar portion P1a. In some embodiments, the second portion P2 has a planar portion P2a and a protrusion portion P2b connected thereto, where the planar portion P2a extends substantially parallel to the metallization layer 300 and the protrusion portion P2b extends in a direction substantially perpendicular to a plane defined by the planar portion P2a. As shown in FIG. 17A, for example, the protrusion portion P2b of the second portion P2 is connected to the planar portion P1a of the first portion P1 through bonding pads 560 to construct the cover 510M having the structure of two-piece while the planar portion P2a of the second portion P2 is connected to the flange portion 514M.

The flange portion 514M is similar to the flange portion 514A as described in FIG. 3, and thus is not repeated herein. The materials and formations of the first portion P1 and the second portion P2 of the cover 510M are independently similar to the material and formation of the cover 510A described in FIG. 3, and thus are not repeated herein. In one embodiment, the second portion P2 and the flange portion 514M are integrally formed. In an alternative embodiment, the second portion P2 and the flange portion 514M are fabricated separately and then assembled together.

The material of the bonding pads 560 may be the same or similar to the material of the bonding pads 310 or the material of the bonding pads 402, the disclosure is not limited thereto, as along as the first portion P1 and the second portion P2 are securely and mechanically coupled to each other. Alternatively, if considering the materials of the first portion P1 and the second portion P2 are metals or metal alloys, the first portion P1 and the second portion P2 may be bonded to each other through brazing process, instead of bonding pads 560.

In some embodiments, the microstructure 320 (e.g., the pillars 322) is bonded to the metallization layer 300 through the bonding pads 310 and located inside an enclosure E2 of the heat dissipating system, where the microstructure 320 serves as part of the heat dissipating system. For example, the enclosure E2 of the heat dissipating system includes two fluidic channels 1001 and 1002 extending substantially parallel to the metallization layer 300 and spatially communicated in a vertical direction, where the pillars 322 are located in the fluidic channel 1001 confined by the metallization layer 300 and the first portion P1. The fluidic flowing channel 1002 confined by the first portion P1 and the second portion P2 may be free of the microstructures. The incident flow of the coolant CL enters the heat dissipating system via the channels 920 and passes through the fluidic flowing channel 1002 and then the fluidic channel 1001, where the incident flow is divided into different directions by the pillars 322, see the flow direction indicated by the arrows F. Owing to the two fluidic channels 1001 and 1002, the remaining time of the coolant flow inside the heat dissipating system is increased, thereby enhancing the heat dissipating effect.

In some embodiments, the first portion P1 is overlapped with the second portion P2 on the X-Y plane, see the top view shown in FIG. 17A and FIG. 18A. For example, the first portion P1 has a size W1 (FIG. 18B) less than a width W2 (FIG. 18C) of the second portion P2, where the periphery of the first portion P1 is distant from the periphery of the second portion P2. In other words, a space, in an annular shape surrounding the periphery of the first portion P1, presents between the first portion P1 and the flange portion 514M to allow the coolant CL vertically flowing therethrough, which achieves the vertical communication between the fluidic channels 1001 and 1002. Continued on FIG. 18B and FIG. 18C, the first portion P1 includes the channel 910 (e.g., the outflow channel) while the second portion P2 includes an opening O1 and the channels 920 (e.g., the inflow channel) surrounding the opening O1, where a positioning location of the channel 910 is within a positioning location of the opening O1. On the X-Y plane, a size D1 of the channel 910 is less than a size D2 of the opening O1, for example. As shown in FIG. 17A, after assembling the first portion P1 and the second portion P2, a portion of the first portion P1 (involving the channel 910) is inserted into the opening O1 of the second portion P2 to facilitate the installation of the fluid circulation system 700, in some embodiments. In some embodiments, the pipes 710 are securely installed to the channels 910, 920 of the heat dissipating module 500M through the washers 720. The detail of the fluid circulation system 700 (including the pipes 710 and the washers 720) has described in FIG. 4, and thus is not repeated herein for simplicity.

As illustrated in FIG. 17A and FIG. 17B (showing an enlarged cross-sectional view indicated by a dashed box X in FIG. 17A), for example, the opening of the channel 910 to the enclosure E2 include a shape edge with an angle of 90°. In some alternative embodiments, in FIG. 17A and FIG. 17C (showing an enlarged cross-sectional view indicated by the dashed box X in FIG. 17A), the opening of the channel 910 to the enclosure E2 include a bevel edge BE. However, the disclosure is not limited thereto, the opening of the channel 910 to the enclosure E2 may include a rounded edge (not shown). As shown in FIG. 17A, for example, a thickness TP1a of the planar portion P1a and a thickness TP1b of the protrusion portion P1b in the first portion P1 and a thickness TP2a of the planar portion P2a and a thickness TP2b of the protrusion portion P2b in the second portion P2 may be selected and designated based on the demand and/or design requirement, the disclosure is not limited thereto.

Figure 19A:
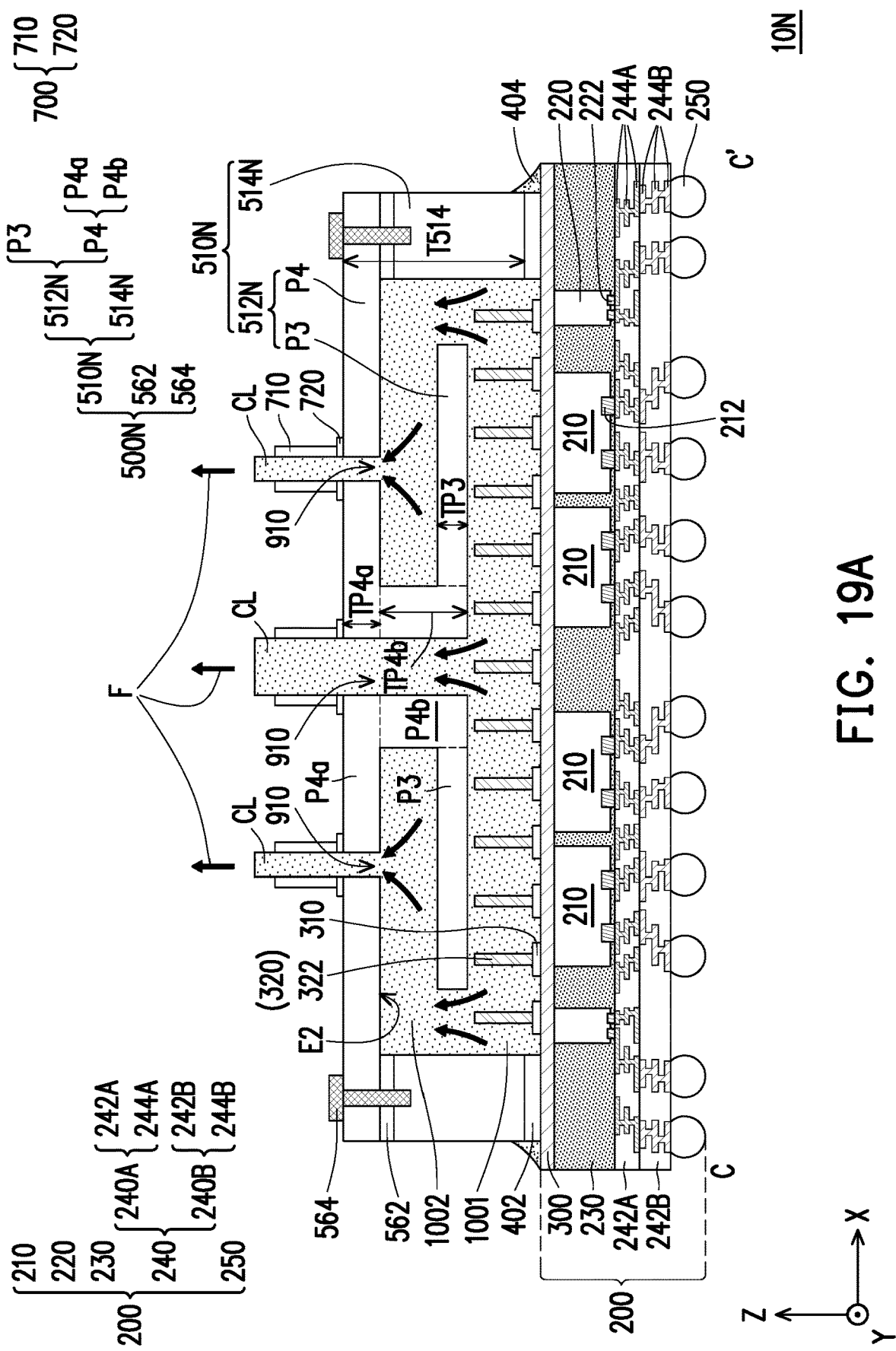
FIG. 19A is a schematic cross-sectional view illustrating a package structure in accordance with some embodiments of the disclosure.
Figure 19B:
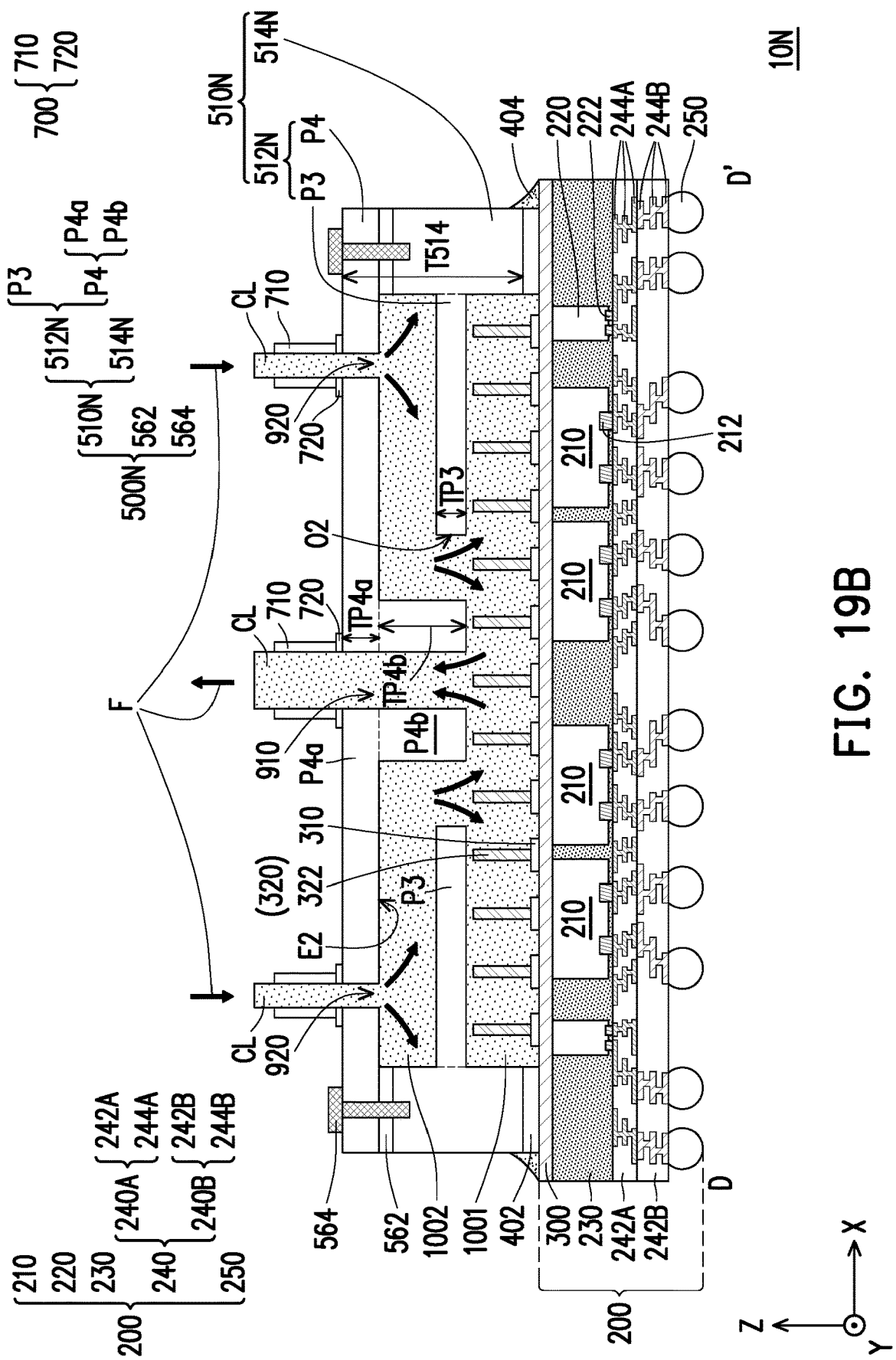
FIG. 19B is a schematic cross-sectional view illustrating a package structure in accordance with some embodiments of the disclosure.
Figure 20C:
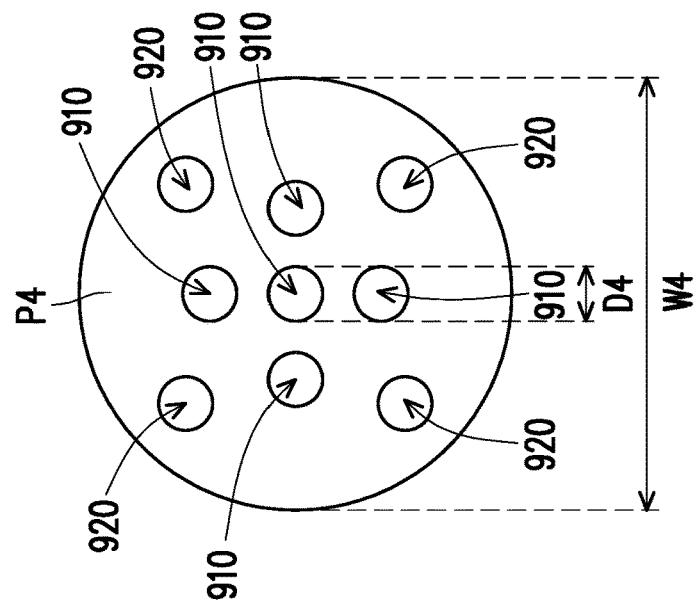
FIG. 20B and FIG. 20C are schematic top views respectively illustrating different parts of a heat dissipating module in the package structure depicted in FIG. 19.
Figure 20B:
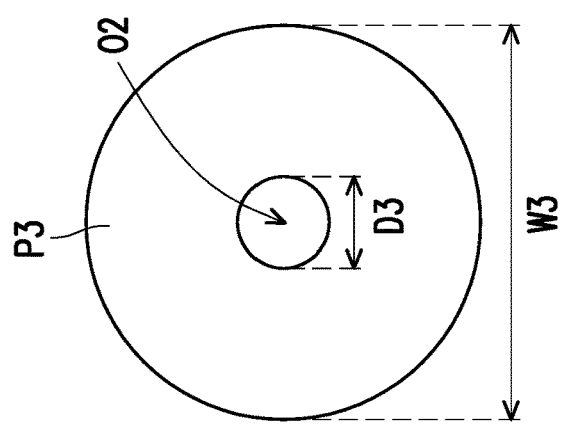
Figure 20A:
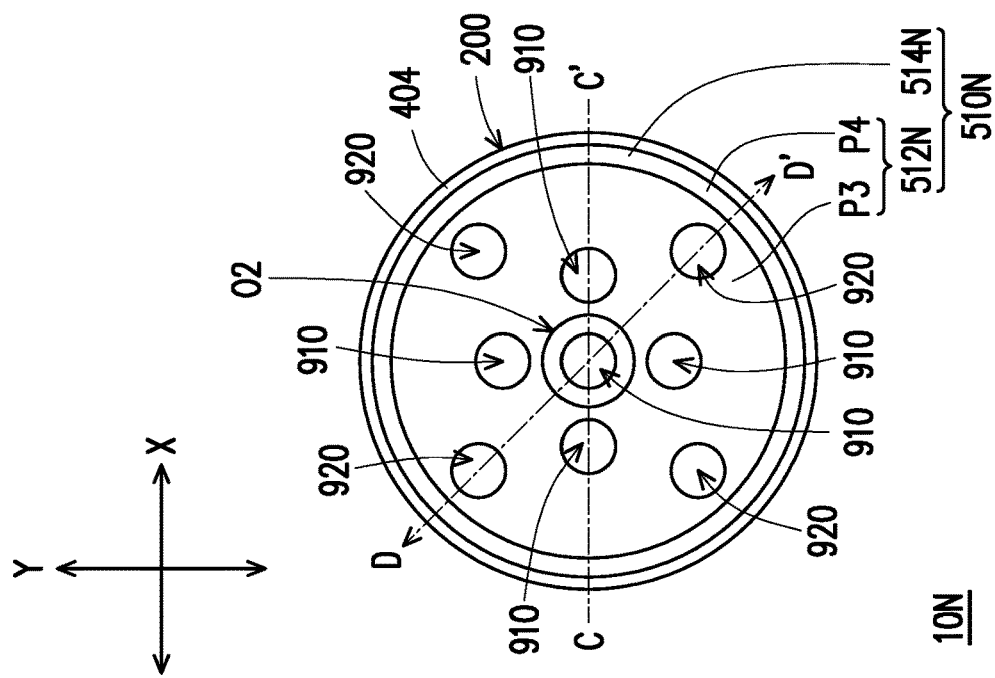
FIG. 20A is a schematic top view illustrating the package structure depicted in FIG. 19.

FIG. 19A and FIG. 19B are schematic cross-sectional views illustrating a package structure in accordance with some embodiments of the disclosure. FIG. 20A is a schematic top view illustrating the package structure depicted in FIG. 19A and FIG. 19B, where FIG. 19A is the cross-sectional view taken along a line CC' of FIG. 20A, and FIG. 19B is the cross-sectional view taken along a line DD' of FIG. 20A. FIG. 20B and FIG. 20C are schematic top views respectively illustrating different parts of a heat dissipating module in the package structure depicted in FIG. 19A and FIG. 19B. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 17A and FIG. 19A through FIG. 19B together, the package structure 10M depicted in FIG. 17A and a package structure 10N depicted in FIG. 19A and FIG. 19B are similar; the difference is that, in the package structure 10N of FIG. 19A and FIG. 19B, the heat dissipating module 500M used to be thermally coupled to and bonded to a semiconductor package 200 is substituted by the heat dissipating module 500N. The details of the semiconductor package 200 and the other components (e.g., the metallization layer 300, the bonding pads 310/402, the underfill 404, the fluid circulation system 700 or so on) shown in FIG. 19A and FIG. 19B have been described in FIG. 1 through FIG. 4, and thus are not repeated herein.

In some embodiments, the heat dissipating module 500N includes a cover 510N having a central portion 512N and a flange portion 514N at the periphery of the central portion 512N. In some embodiments, the central portion 512N includes a first portion P3 and a second portion P4, where the second portion P4 has a planar portion P4a and a protrusion portion P4b connected thereto. In some embodiments, the first portion P3 extends substantially parallel to the metallization layer 300, while the planar portion P4a of the second portion P4 extends substantially parallel to the metallization layer 300 and the protrusion portion P4b of the second portion P4 extends in a direction substantially perpendicular to a plane defined by the planar portion P4a. As shown in FIG. 19A and FIG. 19B, for example, an inner side of the first portion P3 is connected to (a sidewall of) the protrusion portion P4b of the second portion P4 while an outer side of the first portion P3 is connected to (a sidewall of) the flange portion 514N, and the planar portion P4a of the second portion P4 is connected to (one end of) the flange portion 514N via bolts 564 to construct the cover 510N having the structure of two-piece. The materials of the first portion P3 and the second portion P4 of the cover 510N are similar to the materials of the first portion P1 and the second portion P2 of the cover 510A described in FIG. 3, and thus are not repeated herein. The flange portion 514N is similar to the flange portion 514A as described in FIG. 3, and thus is not repeated herein.

In one embodiment, as shown in FIG. 19A and FIG. 19B, the first portion P3 and the flange portion 514N are integrally formed, where the first portion P3 are bonded to (the protrusion portion P4b of) the second portion P4 via an additional adhesive or by suitable technology (e.g. by brazing). In one alternative embodiment, the first portion P3 and second portion P4 are integrally formed, where the first portion P3 are bonded to the flange portion 514N via an additional adhesive or by suitable technology (e.g. by brazing).

In addition, for example, as shown in FIG. 19A and FIG. 19B, a buffer element 562 is sandwiched between the flange portion 514N and the planar portion P4a of the second portion P4 to avoid damages caused by directly physical contacts between the flange portion 514N and the second portion P4. The buffer element 562 and the bolts 564 are respectively similar to the buffer element 630 and the bolts 650 as described in FIG. 16, and thus are not repeated herein for brevity. Similar to the heat dissipating system depicted in FIG. 17A, the enclosure E2 of the heat dissipating system in the FIG. 19A and FIG. 19B includes two fluidic channels 1001 and 1002 extending substantially parallel to the metallization layer 300 and spatially communicated in a vertical direction, where the pillars 322 are located in the fluidic channel 1001 confined by the metallization layer 300 and the first portion P3. The fluidic flowing channel 1002 confined by the first portion P3 and the second portion P4 may be free of the microstructures. In some embodiments, the incident flow of the coolant CL enters the heat dissipating system via the channels 920 and passes through the fluidic flowing channel 1002 and then the fluidic channel 1001, where the incident flow is divided into different directions by the pillars 322, see the flow direction F shown in FIG. 19B. In some embodiments, the incident flow of the coolant CL exists the heat dissipating system via the channels 910 by passing through the fluidic flowing channel 1001 and the fluidic channel 1002, see the flow direction F shown in FIGS. 19A and 19B.

Continued on FIG. 19A, FIG. 19B and FIG. 20A, in some embodiments, the first portion P3 is overlapped with the second portion P4 on the X-Y plane. For example, the first portion P3 has a size W3 (FIG. 20B) less than a width W4 (FIG. 20C) of the second portion P4, where the (outer) periphery of the first portion P3 is partially in contact with the flange portion 514N and the (inner) periphery of the first portion P3 is partially in contact with the second portion P4, while the periphery of the second portion P4 is substantially aligned with the periphery of the flange portion 514N. As shown in FIG. 20B and FIG. 20C, the first portion P3 includes an opening O2 with a size D3 while the second portion P4 includes the channels 910 (e.g., the outflow channel) and the channels 920 (e.g., the inflow channels) surrounding the channels 910, where a positioning locations of a respective one of the channels 910 is within a positioning location of the opening O2, and positioning locations of rest of the channels 910 are outside of the positioning location of the opening O2. On the X-Y plane, the size D3 of the opening O2 is greater than a size D4 of the respective one channel 910, for example. As shown in FIG. 19A, after assembling the first portion P3 and the second portion P4, a portion of the second portion P4 (involving the respective one of the channels 910) is inserted into the opening O2 of the first portion P3, in some embodiments.

In some embodiments, as shown in FIG. 19A, a first space, in a discontinuous annular shape, presents between the inner periphery of the first portion P3 and the inserted part of the second portion P4 at the opening O2 for allowing the coolant CL flowing therethrough. On the other hand, in some embodiments, as shown in FIG. 19B, a second space, in a discontinuous annular shape, presents between the outer periphery the first portion P3 and the flange portion 514N for allowing the coolant CL flowing therethrough. Owing to such first and second spaces, the vertical communication between the fluidic channels 1001 and 1002 of the enclosure E2 is achieved.

In the disclosure, the microstructures are enclosed inside (the fluidic channel 1001 of) the enclosure E1 or E2 of one heat dissipating system constituted by the metallization layer 300 and one of the heat dissipating module (e.g. 500A-500F, 500K, 500M-500N). In some embodiments, the central portion 512A-512F, 512K, 512M-512N may constitute the ceiling of the enclosure E1 or E2, the flange portion 514A-514F, 514K, 514M-514N may constitute the sidewall of the enclosure E1 or E2, and the metallization layer 300 may constitute the floor of the enclosure E1 or E2. For some non-limiting examples, the microstructures may be disposed on the floor of the enclosure E1 or E2; see package structures 10A, 10B, 10C, 10D, 10E, 10F, 10G, 10H, 10I, 10J, 10K, 10L, 10M, 10N respectively depicted in FIG. 4, FIG. 6 through FIG. 17A and FIGS. 19A-19B. However, the disclosure is not limited thereto; alternatively, in addition to the microstructures disposed on the floor of the enclosure E1 or E2, additional microstructures may be disposed on the ceiling of the enclosure E1 or E2; see package structures 10O, 10P, 10Q, 10R, 10S, 10T and 10U respectively depicted in FIG. 23 through FIG. 29.

Figure 21:
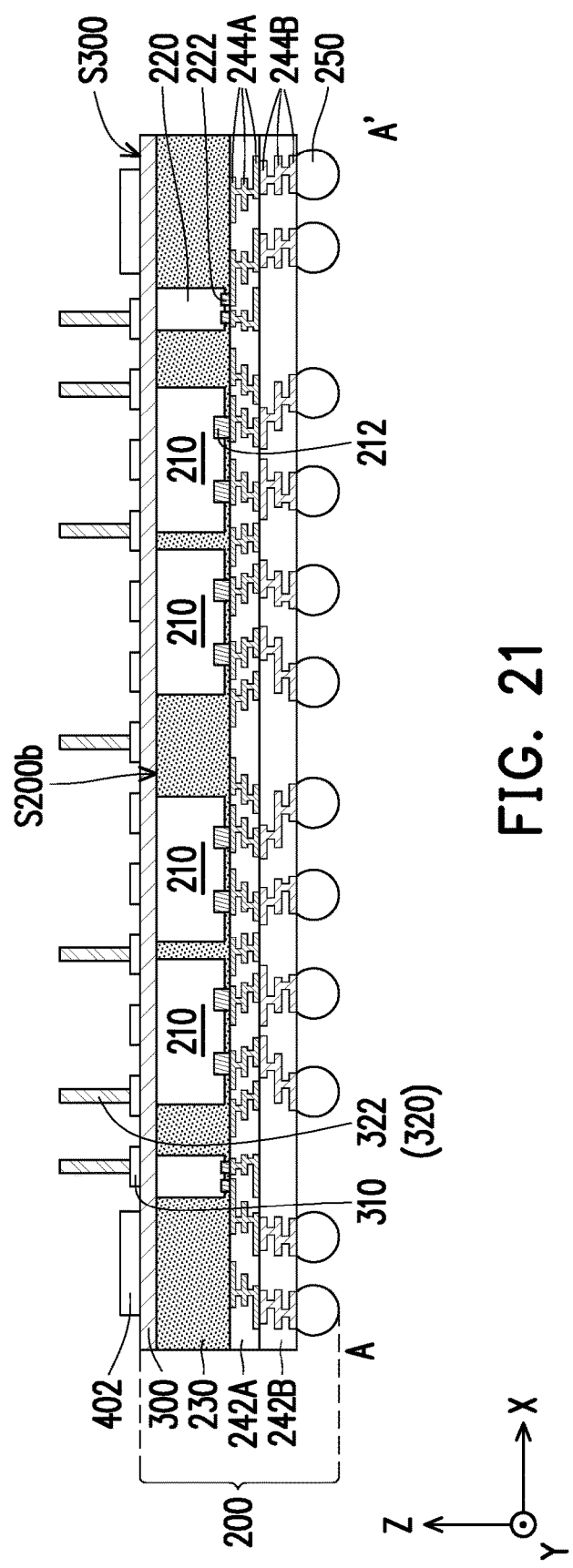
FIG. 21 through FIG. 23 are schematic cross-sectional views illustrating intermediate structures formed at various stages of a manufacturing method of a package structure in accordance with some embodiments of the disclosure.
Figure 22:
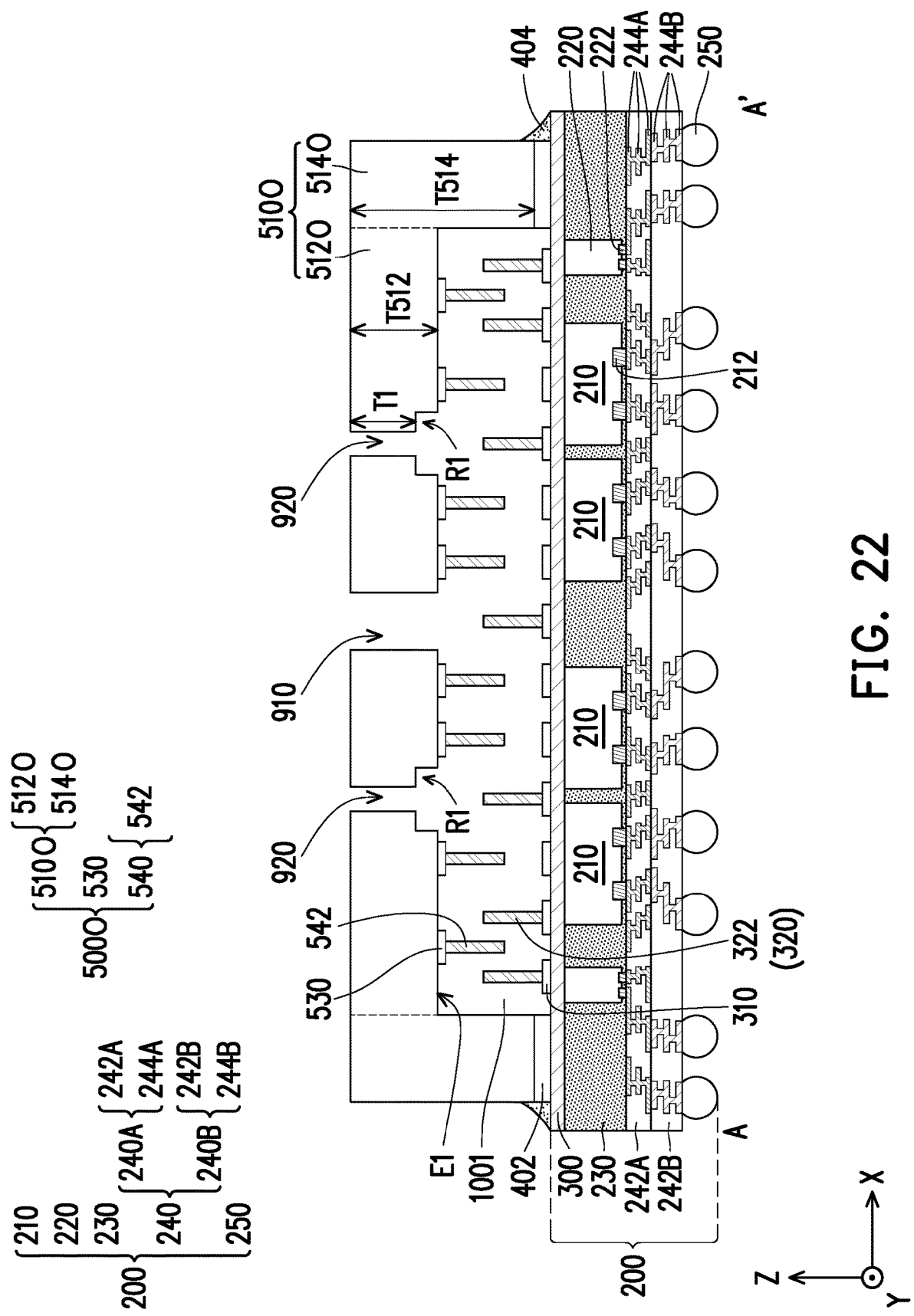
Figure 23:
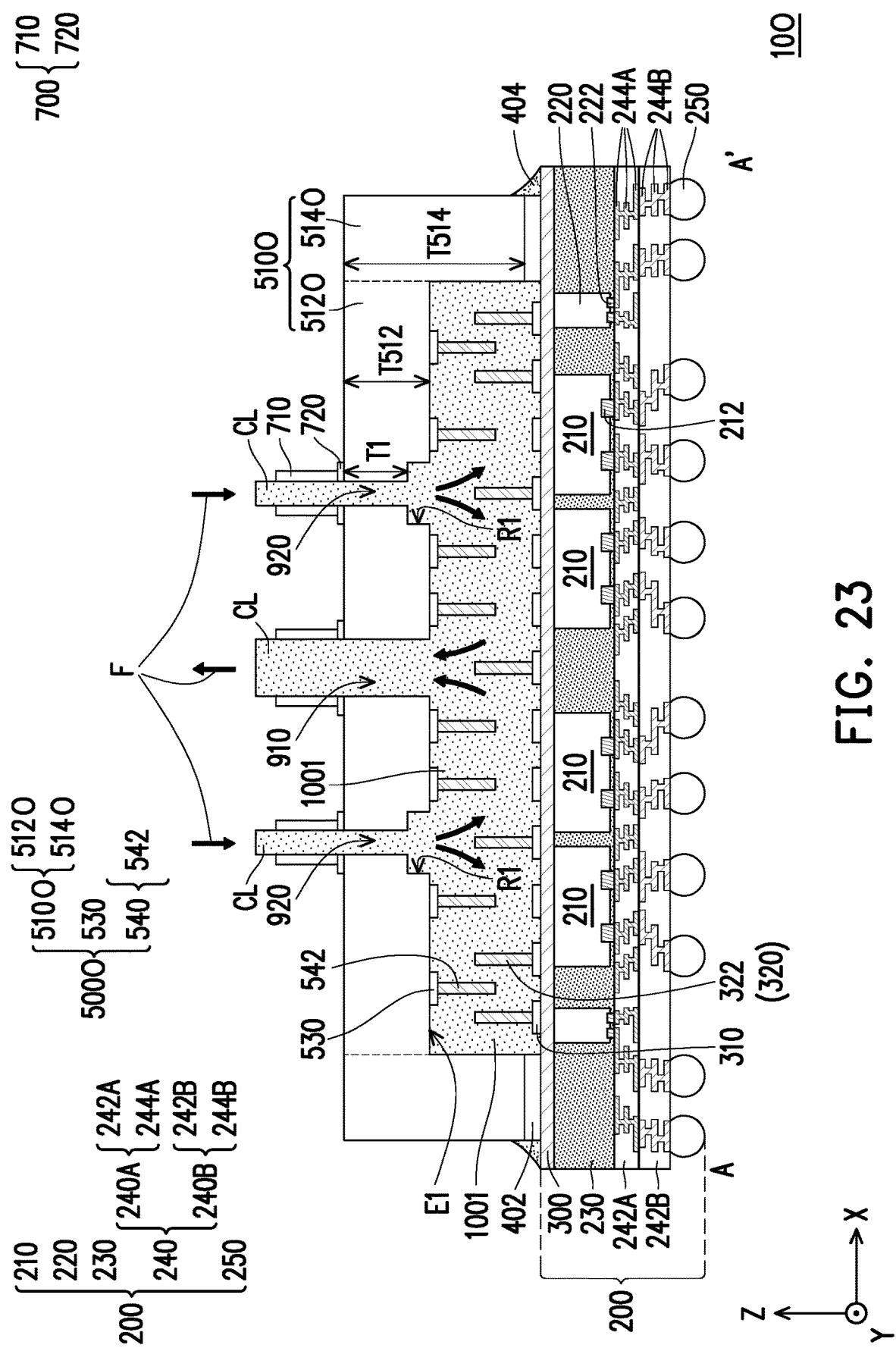
Figure 24:
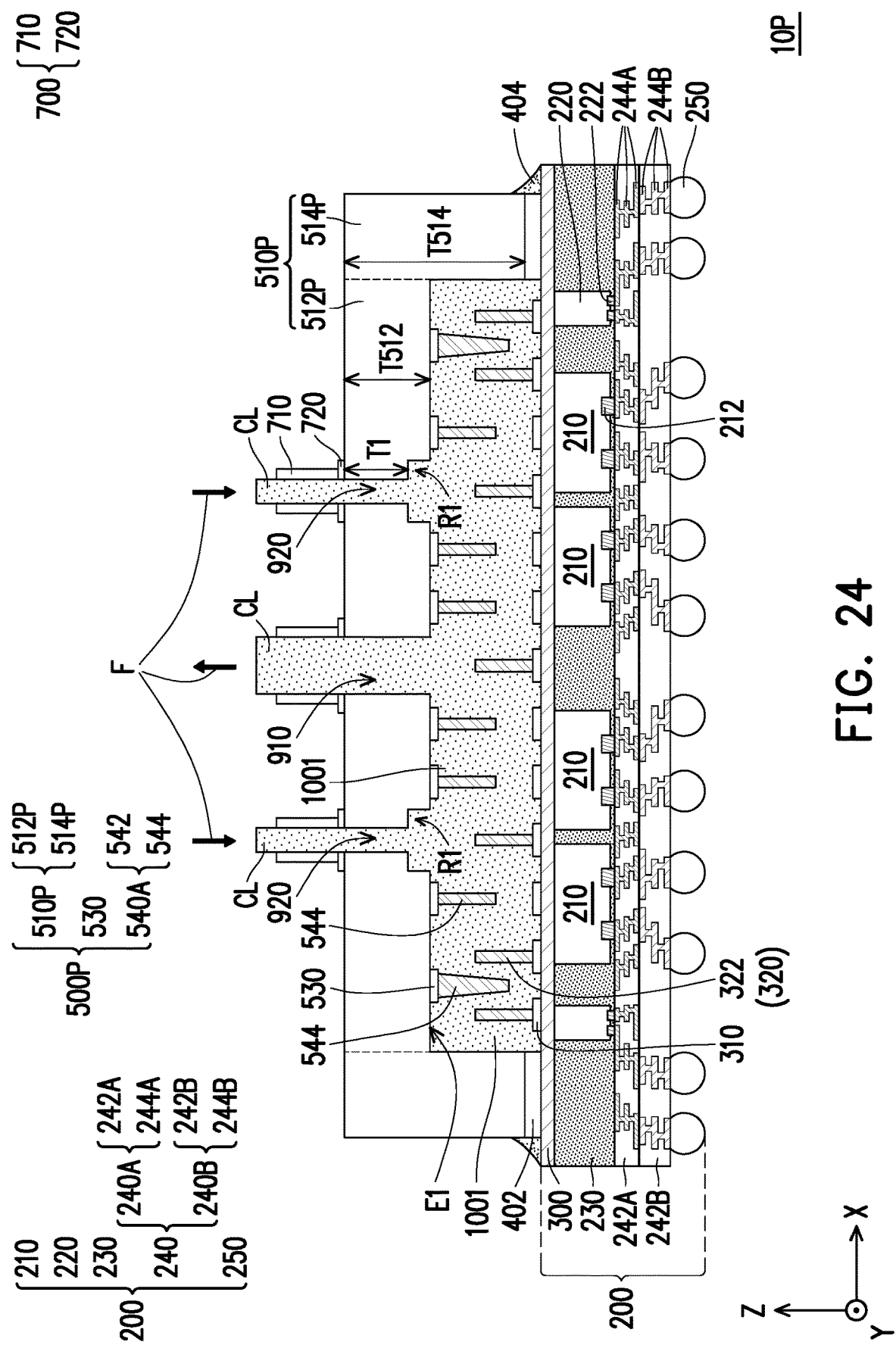
FIG. 24 through FIG. 26 are schematic cross-sectional views respectively illustrating a package structure in accordance with some embodiments of the disclosure.
Figure 25:
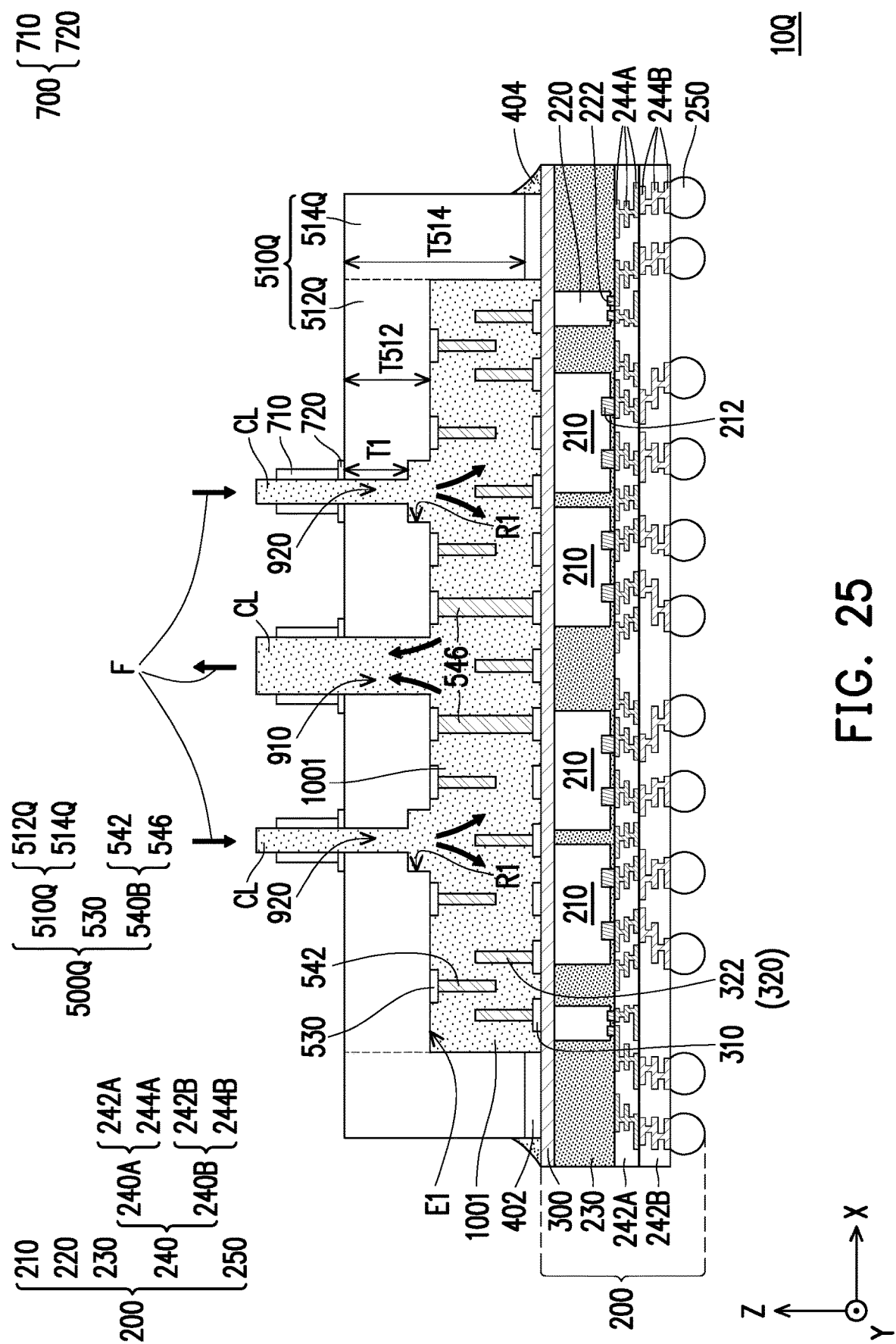
Figure 26:
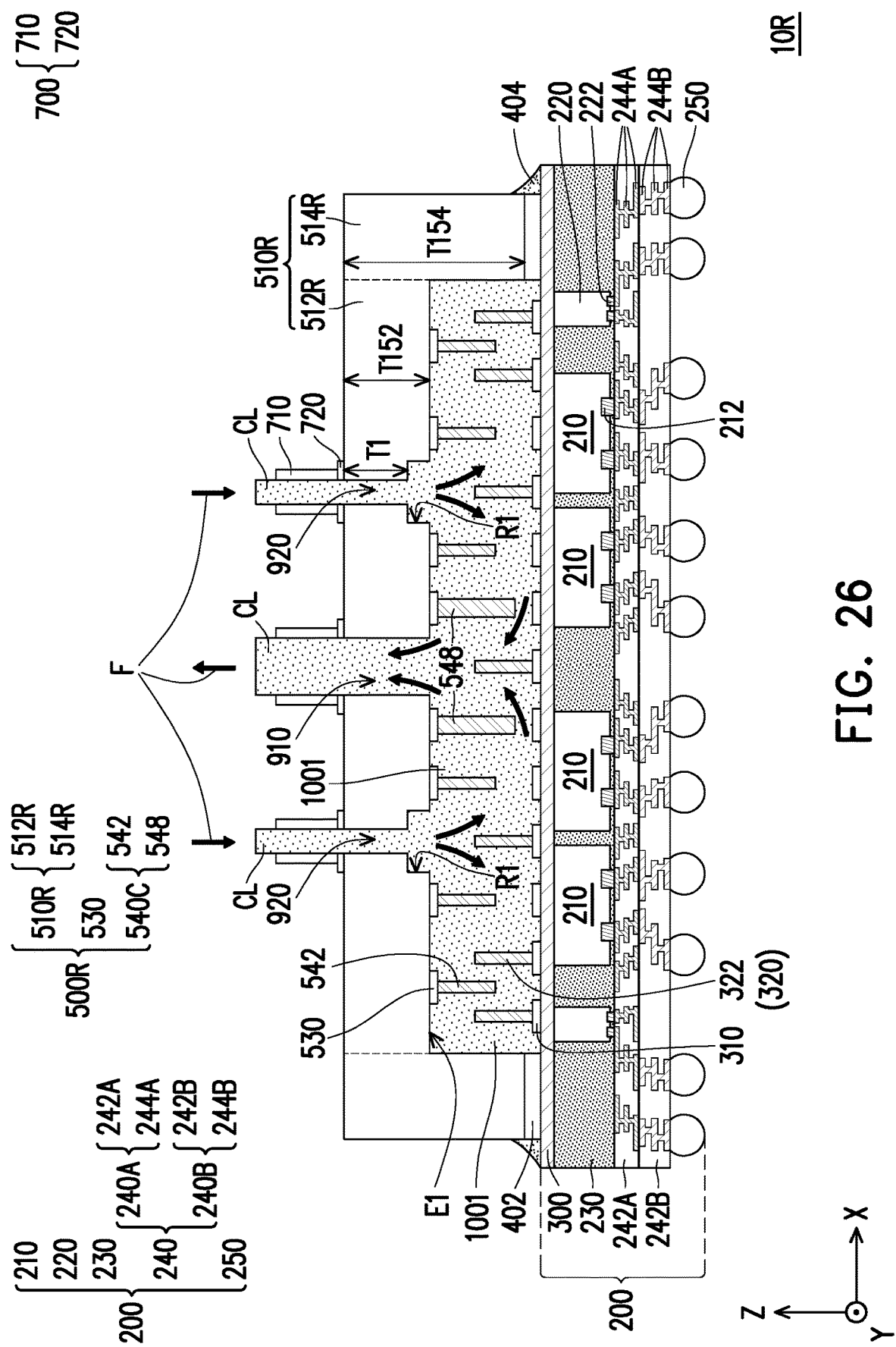
Figure 27:
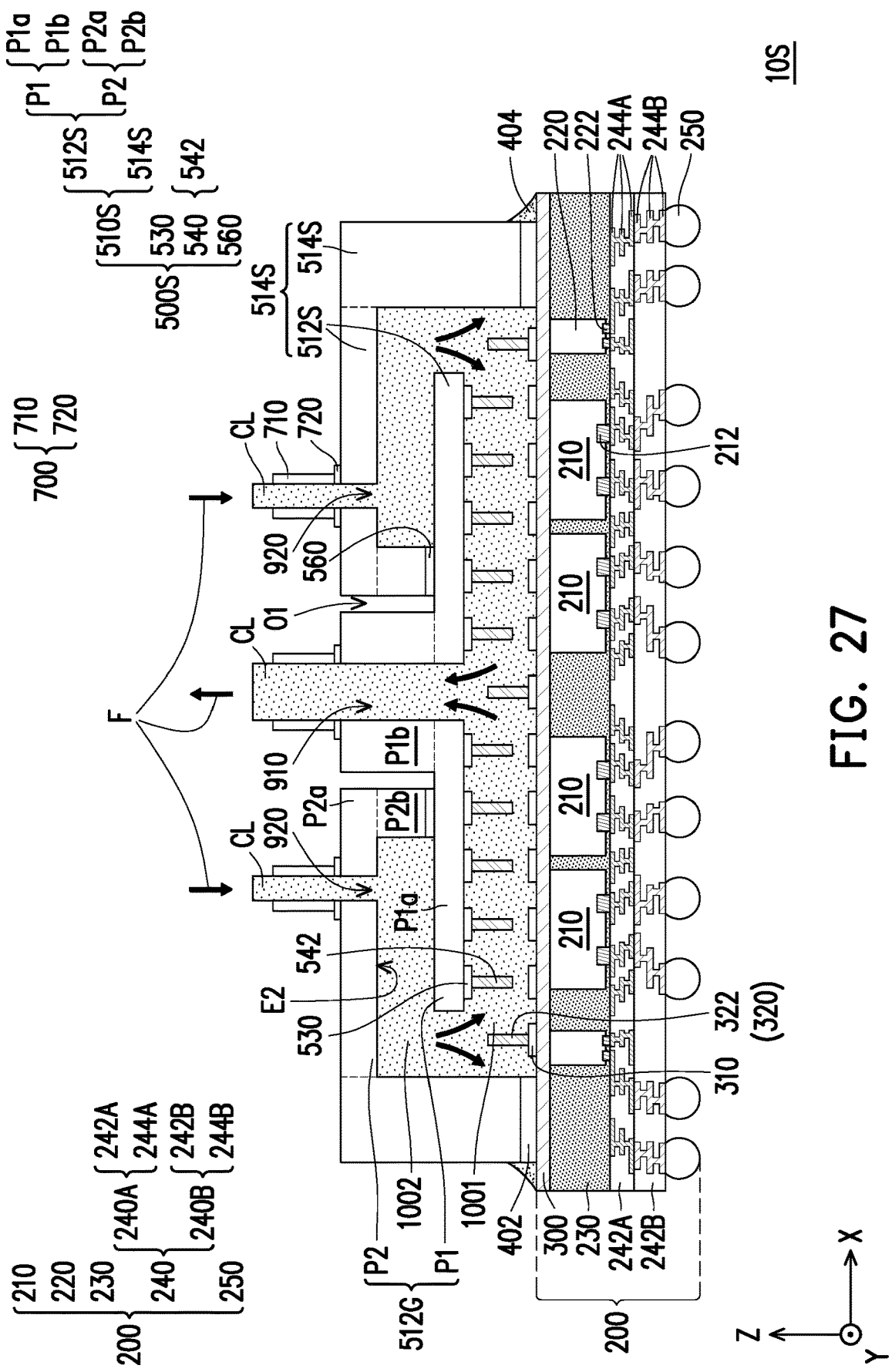
FIG. 27 is a schematic cross-sectional view illustrating a package structure in accordance with some embodiments of the disclosure.

FIG. 21 through FIG. 23 are schematic cross-sectional views illustrating intermediate structures formed at various stages of a manufacturing method of a package structure in accordance with some embodiments of the disclosure, where FIG. 21 to FIG. 23 are the cross-sectional views taken along the line AA' of FIG. 5. FIG. 24 through FIG. 26 are schematic cross-sectional views respectively illustrating a package structure in accordance with some embodiments of the disclosure. FIG. 27 is a schematic cross-sectional view illustrating a package structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 21, in some embodiments, a semiconductor package 200 is provided, and a metallization layer 300 is located over a backside surface S200b of the semiconductor package 200. For example, the metallization layer 300 is in form of a blanket layer covering the semiconductor package 200, where the metallization layer 300 is thermally coupled to and electrically isolated from the semiconductor package 200. The detail of the semiconductor package 200 and the detail of the metallization layer 300 have been described in FIG. 1, and thus are omitted for simplicity. In some embodiments, after forming the metallization layer 300, bonding pads 310 and a bonding pad 402 are formed over a surface S300 of the metallization layer 300, where the metallization layer 300 is sandwiched between the semiconductor package 200 and the bonding pads 310, 402. The details of the bonding pads 310, 402 have been described in FIG. 2, and thus are not repeated herein. In some embodiments, after the formation of the bonding pads 310 and the bonding pad 402, a plurality of pillars 322 are formed on the bonding pads 310 and are thermally coupled to the metallization layer 300 through the bonding pads 310. The pillars 322 are referred to as the microstructure 320 for heat dissipating as the pillars 322 are thermally coupled to the semiconductor package 200 via the bonding pads 310 and the metallization layer 300. The detail of the microstructure 320 (e.g., the pillars 322) has been described in FIG. 2, and thus is not repeated herein.

Referring to FIG. 22, in some embodiments, a heat dissipating module 500O is provided and bonded to the metallization layer 300 through the bonding pad 402 to form a heat dissipating system thermally coupled to and electrically isolated from the semiconductor package 200. For example, the heat dissipating module 500O includes a cover 510O having a central portion 512O and a flange portion 514O at the periphery of the central portion 512O. In some embodiments, as shown in FIG. 22, the heat dissipating module 500O further includes a plurality of pillars 542 disposed on the central portion 512O through bonding pads 530. The central portion 512O and the flange portion 514O of the cover 510O are respectively similar to or the same as the central portion 512A and the flange portion 514A of the cover 510A as described in FIG. 3, and thus are not repeated herein. In some embodiments, as illustrated in FIG. 22, the pillars 542 are located on an inner surface of the central portion 512O facing toward the metallization layer 300 and are thermally coupled to the central portion 512O through the bonding pads 530, where the pillars 542 are referred to as a microstructure 540. The formation and material of the pillars 542 may be the same or similar to the formation and material of the pillars 322 as described in FIG. 2, and thus are not repeated herein. However, the disclosure is not limited thereto; alternatively, the pillars 542 may be formed by milling machining, where the pillars 542, the central portion 512O and the flange portion 514O are integrally formed, and there is no bonding pad 530 between the pillars 542 and the central portion 512O. For example, the microstructures 320 and 540 (e.g., the pillars 322, 542) respectively located on the metallization layer 300 and the central portion 512O are surrounded by the flange portion 514O, where the microstructure 320 is distant from the central portion 512O and the microstructure 540 are distant from the metallization layer 300. However, the disclosure is not limited thereto, the microstructure 320 (e.g., the pillars 322) may in contact with the central portion 512O of the cover 510O; and/or, the microstructure 540 (e.g., the pillars 542) may in contact with the metallization layer 300.

In some embodiments, the heat dissipating system constituted together by the metallization layer 300 and the heat dissipating module 500O including the cover 510O (having the central portion 512O and the flange portion 514O) defines an enclosure E1 surrounding the microstructures 320 and 540 on all sides, where a fluidic channel 1001 is confined by the enclosure E1. In some embodiments, the central portion 512O includes one or more channels (e.g., 910 and 920 in the cross-sectional view of FIG. 22 and in the top view of FIG. 5) spatially communicated with the fluidic channel 1001. In the disclosure, the channels 910, 920 may be individually referred to as an inflow channel or an outflow channel of the enclosure E1 included in the heat dissipating system, and may be selected and designated based on the demand and the design requirement. In some embodiments, the enclosure E1 serves as an accommodating container of the coolant CL (shown in FIG. 23), where the coolant CL is in contact with the pillars 322, 542 placed inside the fluidic channel 1001 to achieve heat transfer from the pillars 322, 542 to the coolant CL for the purpose of heat dissipating. In some embodiments, the microstructures 320 and 540 together define a network of interstices in fluidic communication inside the enclosure E1 of the heat dissipating system. With the microstructures 320 and 540, the distribution of the coolant flow is further improved by increasing the vertical movement of the coolant flow inside the fluidic channel 1001. That is, similar to the pillars 322, the distribution of the coolant flow is improved due to the pillars 542, thereby further enhancing the heat dissipation of the package structure 10O.

Referring to FIG. 23, in some embodiments, a fluid circulation system 700 is installed on the heat dissipating module 500O in correspondence with the channels 910, 920 to facilitate flowing of the coolant CL in and out of the enclosure E1 of the heating dissipating system. The detail of the fluid circulation system 700 has discussed in FIG. 4, and thus is omitted for brevity. Up to here, the package structure 10O, which is installed with the heat dissipating system having the heating dissipating module 500O with the microstructure 540 disposed thereon and the metallization layer 300 with the microstructure 320 disposed thereon, is manufactured. In the disclosure, some of the microstructure 320 (e.g., pillars 322) located on the metallization layer 300 are positioned underneath the openings of the channels 920, where the coolant CL flows into the heat dissipating system through the channels 920 and is further divided into subflows of different directions due to the presence of such microstructure 320. Owing to the microstructure 320 positioned underneath the openings of the channels in the heat dissipating system, the distribution of the coolant flow is improved, thereby enhancing the heat dissipation of the package structure 10O. It is appreciated that the number of the microstructures (e.g., 322, 324, 326, 328) in the heat dissipating system may not be affected by the presence of the microstructures (e.g., 542, 544, 546, 548), where the number of the microstructures (e.g., 322, 324, 326, 328) and the number of the microstructures (e.g., 542, 544, 546, 548) are independently selected and designated based on the demand and design layout, as long as there is at least one micro-pillar (e.g., 322 or 324) disposed at a location corresponding to the opening of each of the inflow/outflow channels of the heat dissipating system for splitting the flow.

The modifications to the heat dissipating module discussed in FIG. 6 through FIG. 10 and/or the modifications to the microstructures discussed in FIG. 11 through FIG. 13 may be adopted in the heat dissipating module 500O and/or the microstructure 320 of the package structure 10O depicted in FIG. 23. In addition, similar modifications to the microstructure 320 discussed in FIG. 11 through FIG. 13 may be also adopted in the microstructure 540 of the package structure 10O depicted in FIG. 23 (e.g., FIG. 24 through FIG. 26, which will be further described later in detail). The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

For example, referring to FIG. 23 and FIG. 24 together, the package structure 10O of FIG. 23 is similar to a package structure 10P of FIG. 24; the difference is that, the package structure 10P of FIG. 24 adopts a heat dissipating module 500P for substituting the heat dissipating module 500O. The central portion 512P and the flange portion 514P of the cover 510P included in the heat dissipating module 500P are respectively similar to or the same as the central portion 512O and the flange portion 514O of the cover 510O included in the heat dissipating module 500O as described in FIG. 23, and thus are not repeated herein for brevity. In some embodiments, for the heat dissipating module 500P of the package structure 10P, the microstructure 540 is substituted by a microstructure 540A, where the microstructure 540A includes the pillars 542 and splitter 544 disposed on the central portion 512P through the bonding pads 530. The formation and material of the splitters 544 are the same or similar to the formation and material of the splitters 324, and thus are not repeated herein. However, the disclosure is not limited thereto; alternatively, the splitters 544 may be formed by milling machining, where the splitters 544, the central portion 512P and the flange portion 514P are integrally formed, and there is no bonding pad 530 between the splitters 544 and the central portion 512P. Similar to the splitters 324, the distribution of the coolant flow is further improved due to the splitters 544, thereby further enhancing the heat dissipation of the package structure 10P.

However, the disclosure is not limited thereto. The microstructure 540 may be substituted by a microstructure 540B (e.g. a heat dissipating module 500Q of a package structure 10Q as shown in FIG. 25) or substituted by a microstructure 540C (e.g. a heat dissipating module 500R of a package structure 10R as shown in FIG. 26).

For one example, referring to FIG. 23 and FIG. 25 together, the package structure 10O of FIG. 23 is similar to a package structure 10Q of FIG. 25; the difference is that, the package structure 10Q of FIG. 25 adopts a heat dissipating module 500Q for substituting the heat dissipating module 500O. The central portion 512Q and the flange portion 514Q of the cover 510Q included in the heat dissipating module 500Q are respectively similar to or the same as the central portion 512O and the flange portion 514O of the cover 510O included in the heat dissipating module 500O as described in FIG. 23, and thus are not repeated herein for brevity. In some embodiments, for the heat dissipating module 500Q of the package structure 10Q, the microstructure 540 is substituted by the microstructure 540B, where the microstructure 540B includes the pillars 542 and baffles 546 disposed on the central portion 512Q through the bonding pads 530. The formation and material of the baffles 546 are the same or similar to the formation and material of the baffles 326, and thus are not repeated herein. However, the disclosure is not limited thereto; alternatively, the baffles 546 may be formed by milling machining, where the baffles 546, the central portion 512Q and the flange portion 514Q are integrally formed, and there is no bonding pad 530 between the baffles 546 and the central portion 512Q. Similar to the baffles 326, the movement of the coolant flow is controllable by the baffle 546, which leads to a fast heat dissipation, thereby further enhancing the heat dissipation of the package structure 10Q.

For another example, referring to FIG. 23 and FIG. 26 together, the package structure 10O of FIG. 23 is similar to a package structure 10R of FIG. 26; the difference is that, the package structure 10R of FIG. 26 adopts a heat dissipating module 500R for substituting the heat dissipating module 500O. The central portion 512R and the flange portion 514R of the cover 510R included in the heat dissipating module 500R are respectively similar to or the same as the central portion 512O and the flange portion 514O of the cover 510O included in the heat dissipating module 500O as described in FIG. 23, and thus are not repeated herein for brevity. In some embodiments, for the heat dissipating module 500R of the package structure 10R, the microstructure 540 is substituted by the microstructure 540C, where the microstructure 540C includes the pillars 542 and fins 548 disposed on the central portion 512R through the bonding pads 530. The formation and material of the fins 548 are the same or similar to the formation and material of the fins 328, and thus are not repeated herein. However, the disclosure is not limited thereto; alternatively, the fins 548 may be formed by milling machining, where the fins 548, the central portion 512R and the flange portion 514R are integrally formed, and there is no bonding pad 530 between the fins 548 and the central portion 512R. Similar to the fins 328, the movement of the coolant flow is further controllable due to the fins 548, which leads to a fast heat dissipation, thereby further enhancing the heat dissipation of the package structure 10R.

It is appreciated that in the disclosure, the microstructures (e.g., 542, 544, 546, 548) may be, in part or all, integrally formed with the cover of a heat dissipating module. The disclosure is not limited thereto.

In some embodiments, the flow movements of the coolant CL due to the presences of the microstructures (e.g., 542, 544, 546, 548) inside the heat dissipating system are demonstrated in FIG. 33 for illustrative purposes, where an arrangement of the microstructures (e.g., 542, 544, 546, 548) is not specifically limited thereto. The non-limiting examples of possible arrangements of the microstructures (e.g., 542, 544, 546, 548) will be described in FIG. 34 through FIG. 45 later for further details. Referring to FIG. 33, in some embodiments, if assuming the coolant CL proceeds from the right side of the drawing towards the left end of the drawing (along the direction X), the incident flow (indicated by arrows) is deviated by the pillars 542 and the splitters 544, forced to pass under the fins 548, and deviated by the baffle 546. In some embodiments, the incident flow flows in a space between two baffles 546, between two fins 548 or between one baffle 546 and one fin 548, and passes under the pillars 542 and the splitters 544. As show in FIG. 33, the microstructures (e.g., 542, 544, 546, 548) are separated from each other on the X-Y plane, for example. In other words, the microstructures (e.g., 542, 544, 546, 548) are not overlapped to each other in direction Z. In some embodiments, the microstructures (e.g., 542, 544, 546, 548) may be coated with a thermally conductive material. In some embodiments, the coating material includes graphene or diamond-like carbon (DLC). In some embodiments, the coating material includes metals such as copper or aluminum.

Furthermore, in the above non-limiting examples, along the direction Z, the thicknesses of the pillars 322 are the same to each other while the thicknesses of the pillars 542 are also the same to each other. However, the disclosure is not limited thereto; alternatively, the thicknesses of the pillars 322 may be different, in part or all. Similarly, the thicknesses of the pillars 542 may be different, in part or all. In the disclosure, such thickness modification in pillars 322/542 may also applied to the thicknesses of the splitters 324/544 and/or the thicknesses of the fins 328/548.

In the disclosure, the microstructures may be further located on the heat dissipating module in the heat dissipating system having the structure of a two-piece, besides the microstructures located on the metallization layer. The microstructures (e.g., 542, 544, 546, 548) may further be introduced to the package structure 10M of FIG. 17A, see FIG. 27. For example, referring to FIG. 17A and FIG. 27 together, the package structure 10M of FIG. 17A is similar to a package structure 10S of FIG. 27; the difference is that, the package structure 10U of FIG. 27 adopts a heat dissipating module 500S for substituting the heat dissipating module 500M. The central portion 512S and the flange portion 514S of the cover 510S included in the heat dissipating module 500S are respectively similar to or the same as the central portion 512M and the flange portion 514M of the cover 510M included in the heat dissipating module 500M as described in FIG. 17A, and thus are not repeated herein for brevity. In some embodiment, the heat dissipating module 500S further includes a plurality of pillars 542 disposed on the first portion P1 of the central portion 512S of the cover 510S through a plurality of bonding pads 530. With the pillars 322 and 542, the distribution of the coolant flow is further improved by increasing the vertical movement of the coolant flow inside the fluidic channel 1001. The details of the rest components included in the package structure 10S of FIG. 27 are the same as the components included in the package structure 10M of FIG. 17A, and thus are not repeated herein for simplicity. Furthermore, the modification to the package structure 10N of FIGS. 19A-19B (e.g., having the heat dissipating module with a cover having the two-piece structure) is very similar to the modification of the package structure 10M of FIG. 17A discussed above, and thus are omitted herein. Similarly, the microstructures (e.g., 542, 544, 546, 548) may further be introduced to package structures 10A, 10B, 10C, 10D, 10E, 10F, 10G, 10H, 10I, 10J, 10K, 10L (e.g., having the heat dissipating module with a cover having the single-piece structure) respectively depicted in FIG. 4 and FIG. 6 through FIG. 16.

Figure 28A:
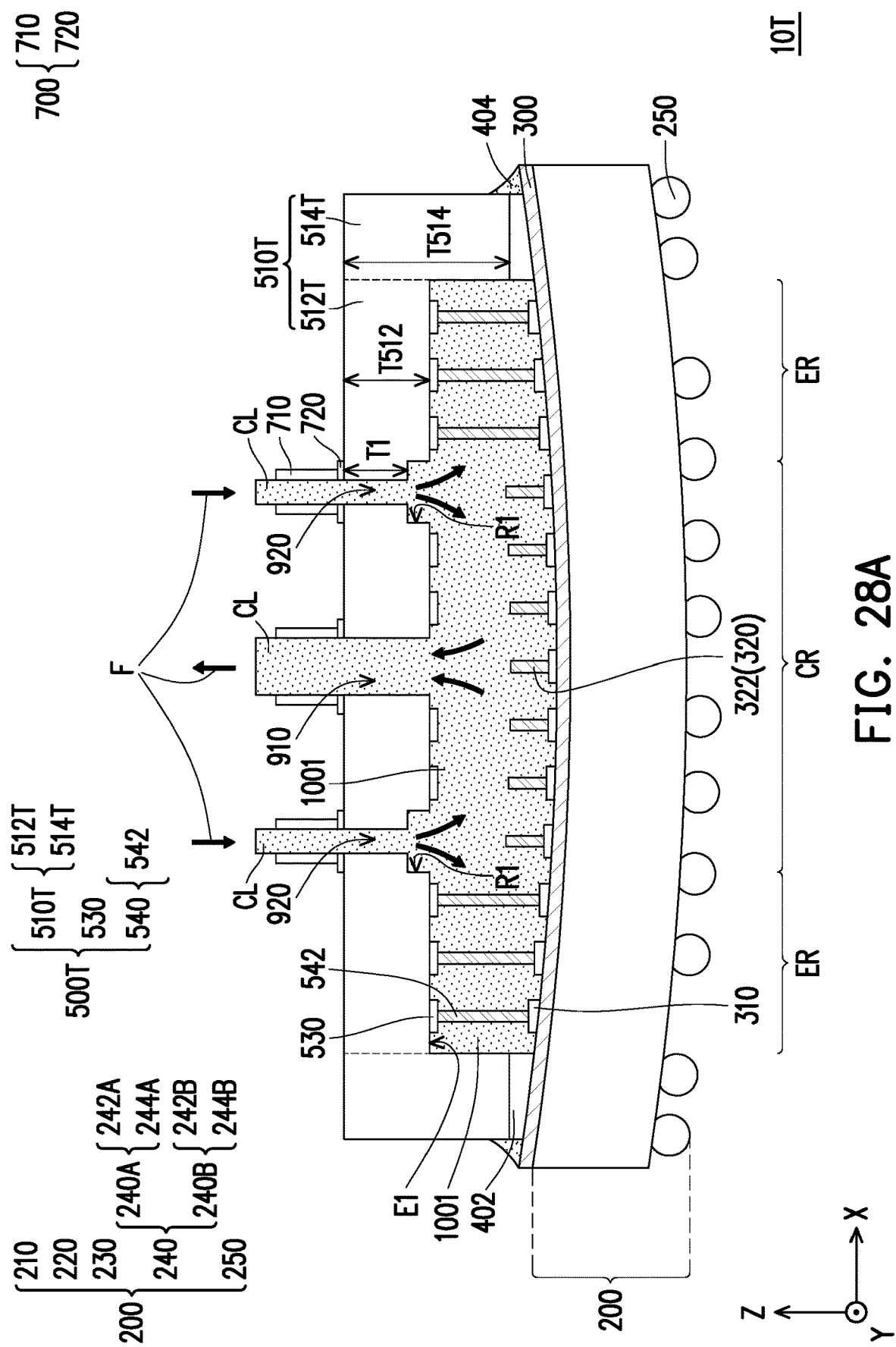
FIG. 28A through FIG. 28B are schematic cross-sectional views respectively illustrating the configurations of microstructures of a heat dissipating system in a package structure in accordance with some embodiments of the disclosure.
Figure 28B:
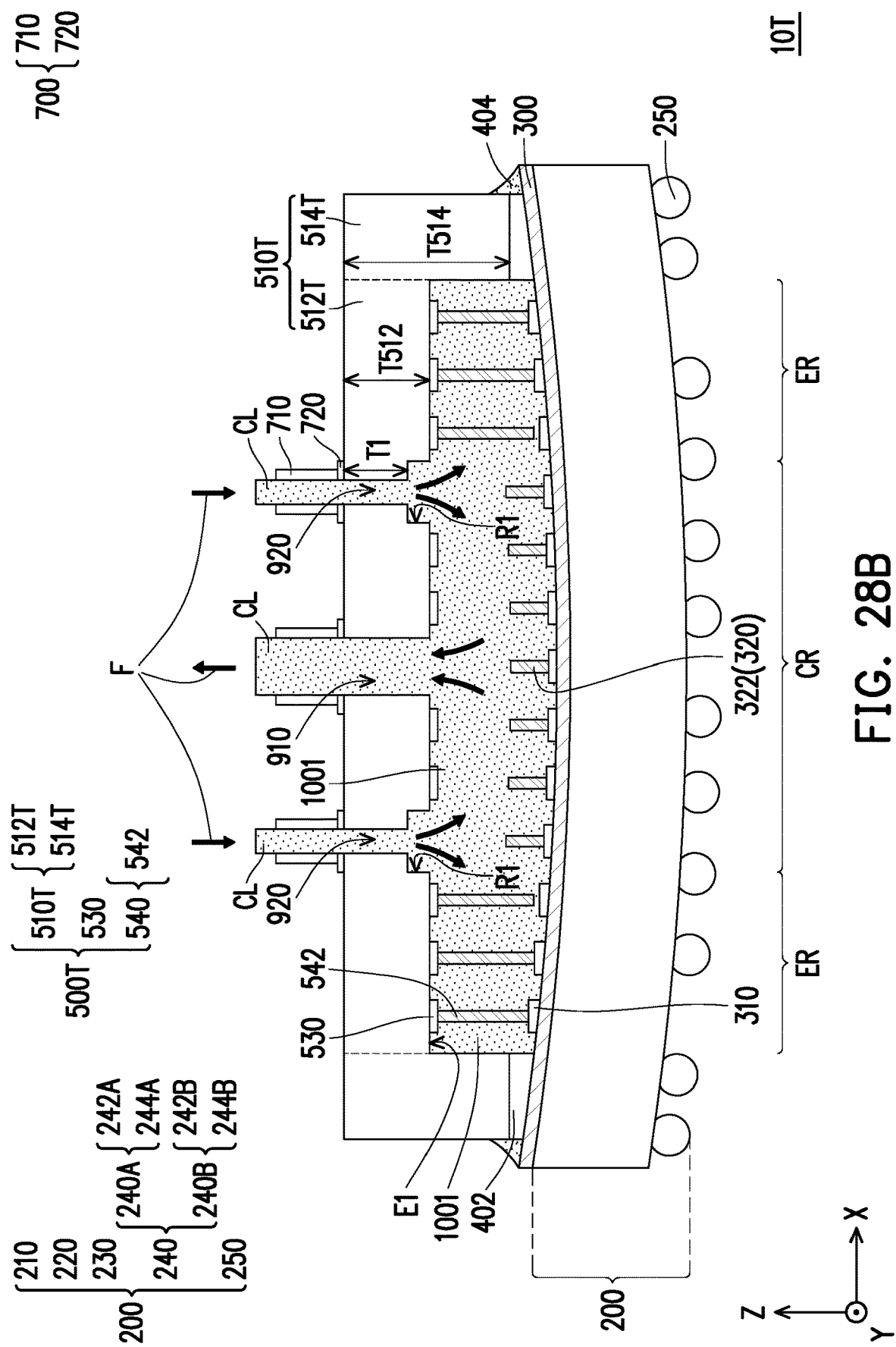
Figure 29A:
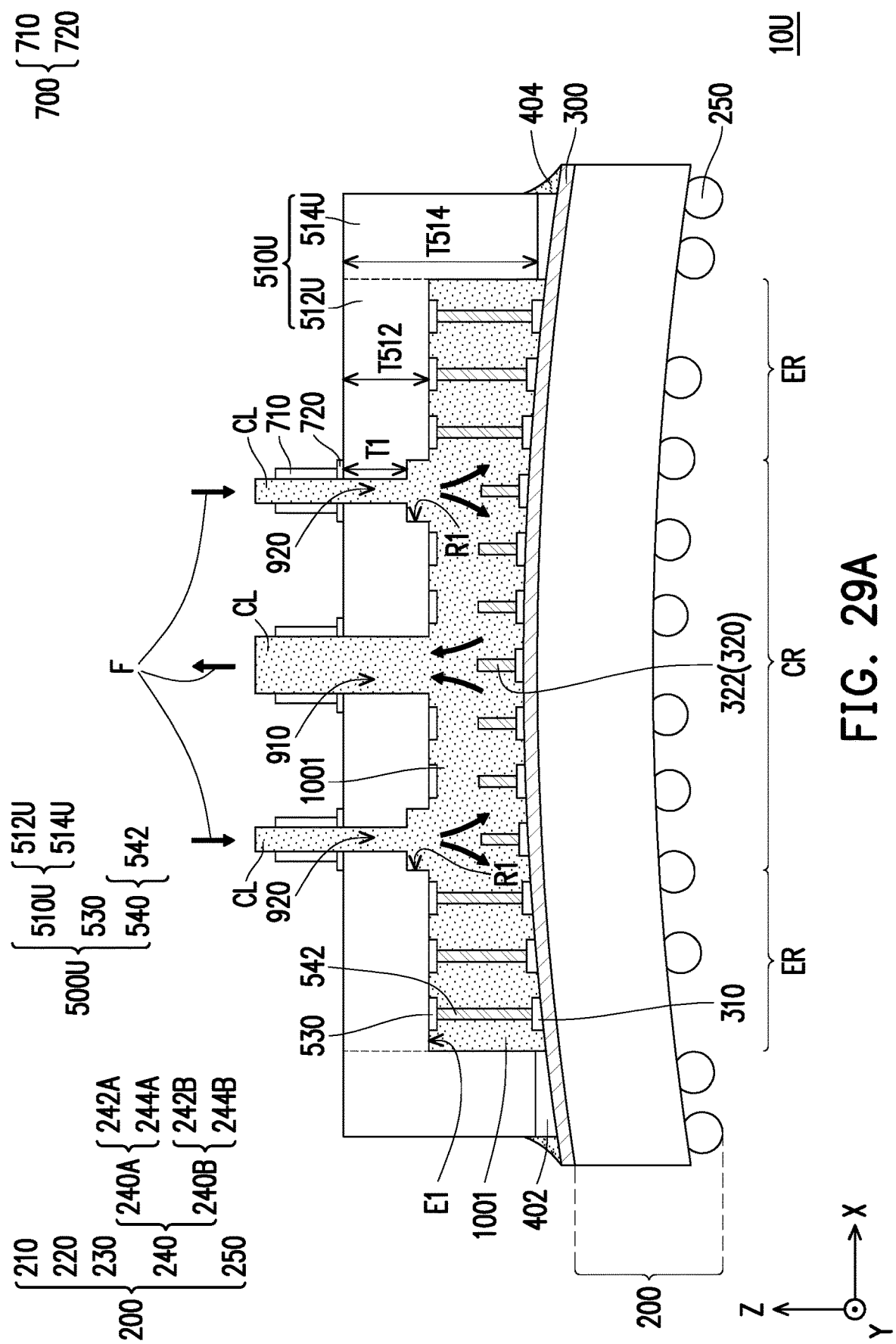
FIG. 29A through FIG. 29B are schematic cross-sectional views respectively illustrating the configurations of microstructures of a heat dissipating system in a package structure in accordance with some embodiments of the disclosure.
Figure 29B:
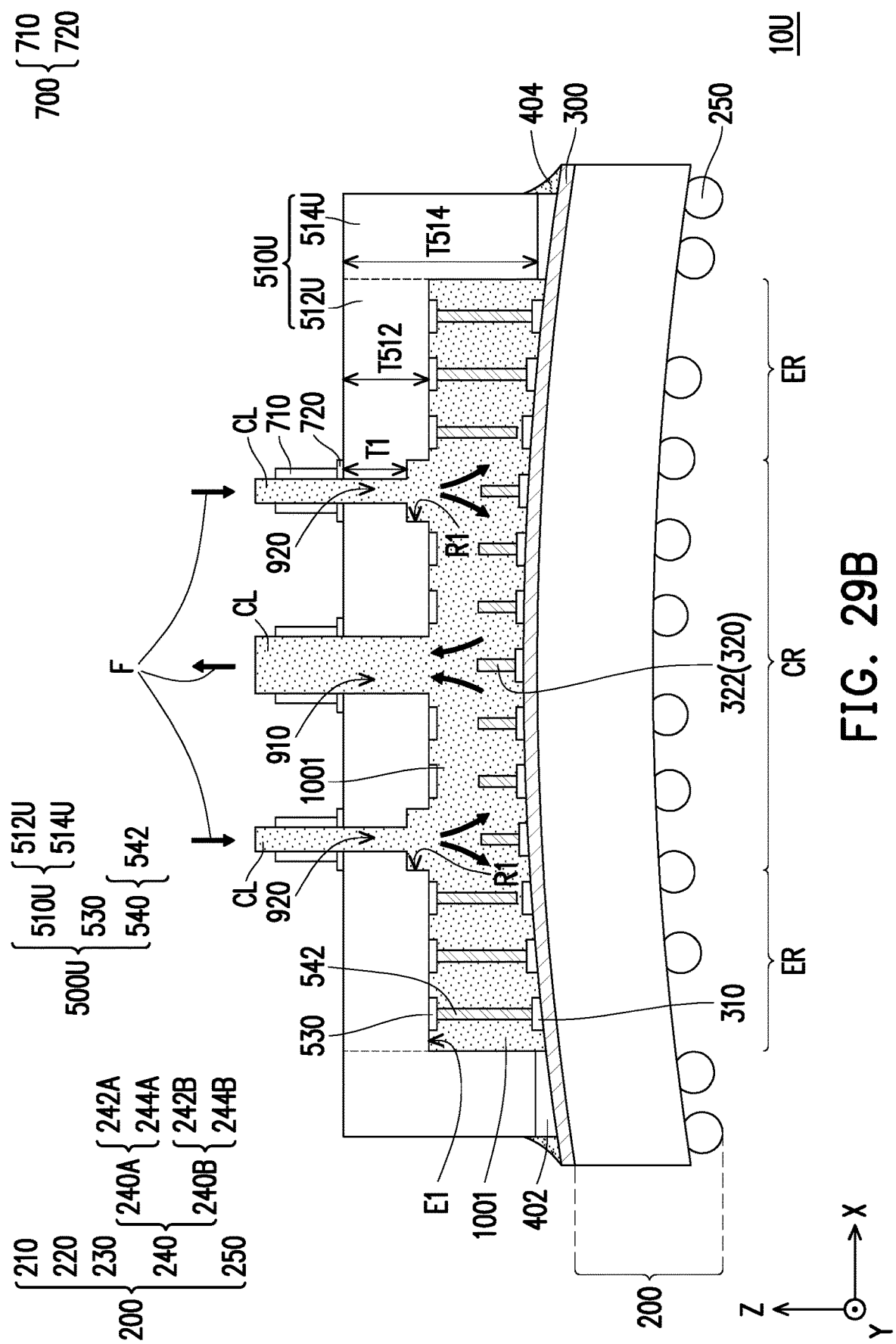

FIG. 28A through FIG. 28B are schematic cross-sectional views respectively illustrating the configurations of microstructures of a heat dissipating system in a package structure in accordance with some embodiments of the disclosure. FIG. 29A through FIG. 29B are schematic cross-sectional views respectively illustrating the configurations of microstructures of a heat dissipating system in a package structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. It is appreciated that the semiconductor package 200 depicted in FIG. 28A, FIG. 28B, FIG. 29A and FIG. 29B are illustrated in a simplified way, where the components included in the semiconductor package 200 are omitted for simplicity. The detail of the semiconductor package 200 is described in FIG. 1, and thus is not repeated herein.

In some embodiments, if considering the semiconductor package 200 of a package structure undergoes a warpage caused by tensile stress, a profile of a vertical cross-section of the pillars 322 located on metallization layer 300 is in a form of a smiling pattern. Referring to FIG. 23 and FIG. 28A together, the package structure 10O of FIG. 23 is similar to a package structure 10T of FIG. 28A; the difference is that, the package structure 10T of FIG. 28A adopts a heat dissipating module 500T for substituting the heat dissipating module 500O. The central portion 512T and the flange portion 514T of the cover 510T included in the heat dissipating module 500T are respectively similar to or the same as the central portion 512O and the flange portion 514O of the cover 510O included in the heat dissipating module 500O as described in FIG. 23, and thus are not repeated herein for brevity. In some embodiments, for the heat dissipating module 500T of the package structure 10T, the microstructure 540 (e.g. the pillars 542) is only arranged on the central portion 512T at an edge region ER of the enclosure E1 through the bonding pads 530, and the microstructure 320 (e.g. the pillars 322) is only arranged on the metallization layer 300 through the bonding pads 310 at a central region CR of the enclosure E1.

Due to the warpage caused by tensile stress, the edge of the semiconductor package 200 is bent upward along the direction Z as illustrated in FIG. 28A, where the pillars 542 at the edge region ER of the enclosure E1 are in contact with the metallization layer 300 through the bonding pads 310, and the pillars 322 at the central region CR of the enclosure E1 are spacing away from the central portion 512T with different distances, for example. As shown in FIG. 28A, for example, at the central region CR, the spacing distances between the pillars 322 and the central portion 512T are increased gradually from a periphery of the central region CR towards to a center of the central region CR. Alternatively, the bonding pads 310 between the pillars 542 and the metallization layer 300 may be omitted.

However, the disclosure is not limited thereto; alternatively, some of the pillars 542 at the edge region ER of the enclosure E1 may be spacing away from the metallization layer 300, see FIG. 28B. For example, as shown in FIG. 28B, at the edge region ER, the spacing distances between the pillars 542 and the metallization layer 300 (e.g. the bonding pads 310 located thereon) are increased gradually from an outer periphery of the edge region ER towards to an inner periphery of the edge region ER. That is, in other word, at the edge region ER, the pillars 542 located near the outer periphery are in contact with the metallization layer 300 while the pillars 542 located near the inner periphery are spacing away from the metallization layer 300. In a further alternative embodiment, besides the pillars 322 located underlying (or immediately underneath) the channels 910 and 920, the rest of the pillars 322 arranged in the central region CR are in contact with the central portion 512T through the bonding pads 530.

In alternative embodiments, if considering the semiconductor package 200 of a package structure undergoes a warpage caused by compressive stress, a profile of a vertical cross-section of the pillars 322 located on metallization layer 300 is in a form of a crying pattern. Referring to FIG. 23 and FIG. 29A together, the package structure 10O of FIG. 23 is similar to a package structure 10U of FIG. 29A; the difference is that, the package structure 10U of FIG. 29A adopts a heat dissipating module 500U for substituting the heat dissipating module 500O. The central portion 512U and the flange portion 514U of the cover 510TU included in the heat dissipating module 500U are respectively similar to or the same as the central portion 512O and the flange portion 514O of the cover 510O included in the heat dissipating module 500O as described in FIG. 23, and thus are not repeated herein for brevity. In some embodiments, for the heat dissipating module 500U of the package structure 10U, the microstructure 540 (e.g. the pillars 542) is only arranged on the central portion 512U at an edge region ER of the enclosure E1 through the bonding pads 530, and the microstructure 320 (e.g. the pillars 322) is only arranged on the metallization layer 300 through the bonding pads 310 at a central region CR of the enclosure E1.

Due to the warpage caused by compressive stress, the edge of the semiconductor package 200 is bent downward along the direction Z as illustrated in FIG. 29A, where the pillars 542 at the edge region ER of the enclosure E1 are in contact with the metallization layer 300 through the bonding pads 310, and the pillars 322 at the central region CR of the enclosure E1 are spacing away from the central portion 512U with different distances, for example. As shown in FIG. 29A, for example, at the central region CR, the spacing distances between the pillars 322 and the central portion 512U are decreased gradually from a periphery of the central region CR towards to a center of the central region CR. However, the disclosure is not limited thereto. Alternatively, the bonding pads 310 between the pillars 542 and the metallization layer 300 may be omitted.

However, the disclosure is not limited thereto; some of the pillars 542 at the edge region ER of the enclosure E1 may be spacing away from the metallization layer 300, see FIG. 29B. For example, as shown in FIG. 29B, at the edge region ER, the spacing distances between the pillars 542 and the metallization layer 300 (e.g. the bonding pads 310 located thereon) are increased gradually from an outer periphery of the edge region ER towards to an inner periphery of the edge region ER. That is, in other word, at the edge region ER, the pillars 542 located near the outer periphery are in contact with the metallization layer 300 while the pillars 542 located near the inner periphery are spacing away from the metallization layer 300. In a further alternative embodiment, besides the pillars 322 located underlying (or immediately underneath) the channels 910 and 920, the rest of the pillars 322 arranged in the central region CR are in contact with the central portion 512T through the bonding pads 530.

Figure 30:
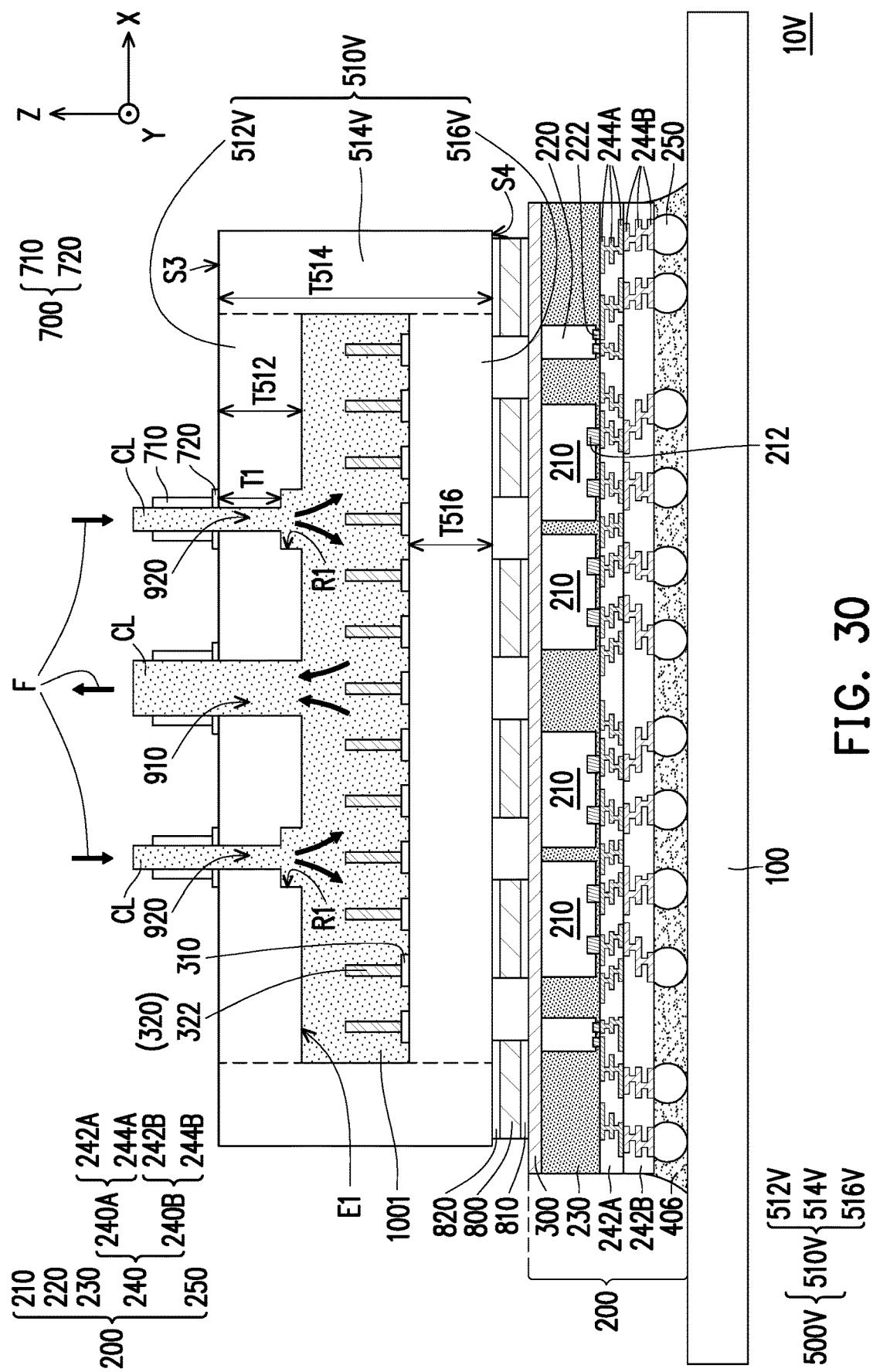
FIG. 30 is a schematic cross-sectional view illustrating a package structure in accordance with some embodiments of the disclosure.
Figure 31A:
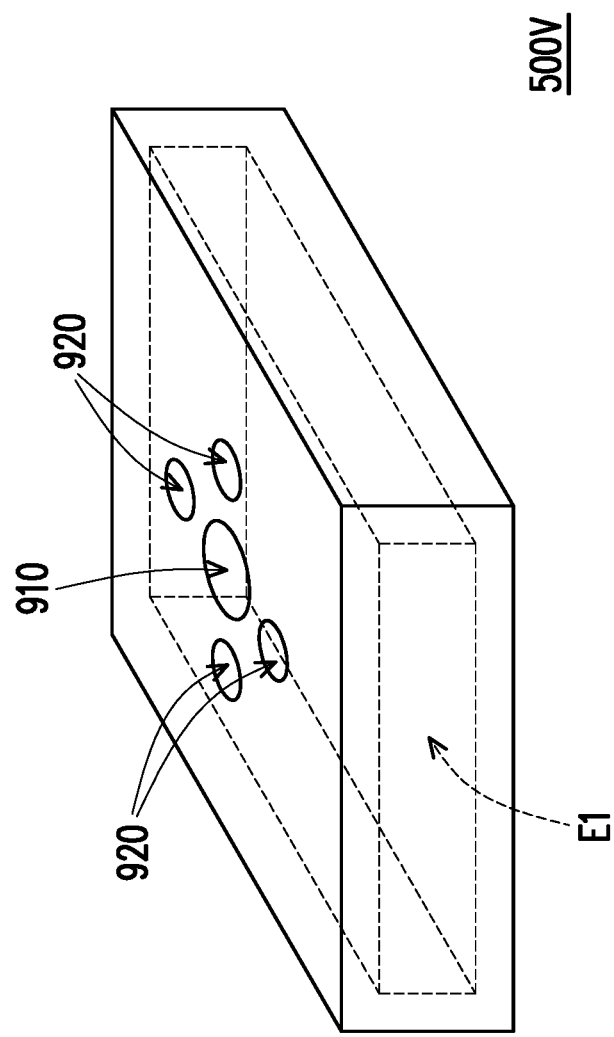
FIG. 31A is a schematic three-dimensional side-view diagram of a heat dissipating module in a package structure in accordance with some embodiments of the disclosure.
Figure 32:
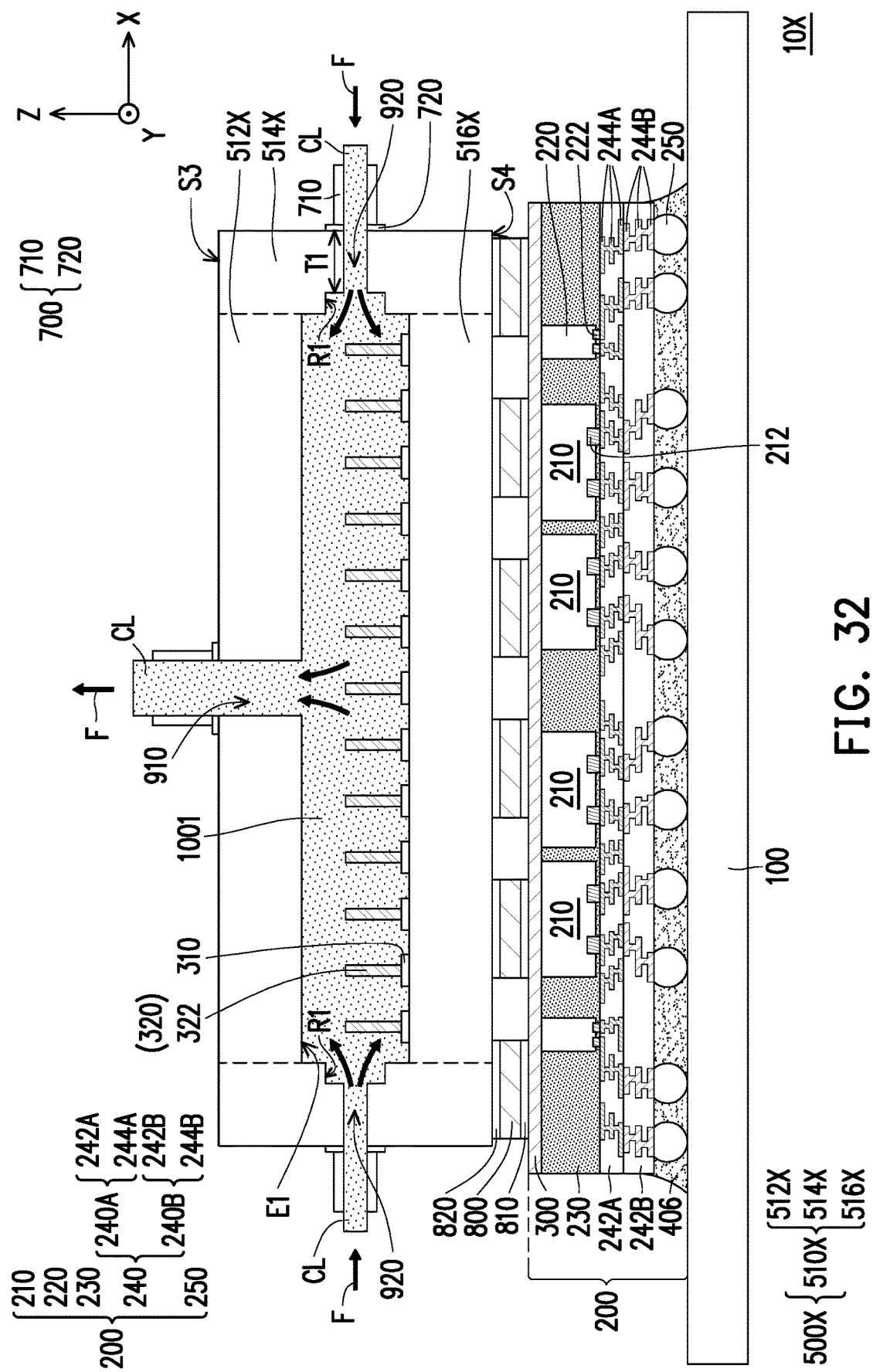
FIG. 32 is a schematic cross-sectional view illustrating a package structure in accordance with some embodiments of the disclosure.

FIG. 30 is a schematic cross-sectional view illustrating a package structure in accordance with some embodiments of the disclosure. FIG. 31A is a schematic three-dimensional side-view diagram of a heat dissipating module in a package structure in accordance with some embodiments of the disclosure. FIG. 31B is a schematic top view illustrating the heat dissipating module depicted in FIG. 31A. FIG. 31C is a schematic bottom view illustrating the heat dissipating module depicted in FIG. 31A. FIG. 32 is a schematic cross-sectional view illustrating a package structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 30, in some embodiments, a package structure 10V includes a semiconductor package 200, a heat dissipating system thermally coupled to the semiconductor package 200, and a circuit component 100 bonded to the semiconductor package 200, where the semiconductor package 200 is electrically coupled to the circuit component 100 and is between the circuit component 100 and the heat dissipating system. For example, as shown in FIG. 30, a underfill 406 is formed between the gap of the circuit component 100 and the semiconductor package 200 to further secure the bonding strength between the circuit component 100 and the semiconductor package 200. The detail of the semiconductor package 200 has described in FIG. 1, the details of the circuit component 100 and the underfill 406 have described in FIG. 14, and thus are not repeated herein.

For example, the heat dissipating system includes a metallization layer 300, a heat dissipating module 500V, and a plurality of connectors 800 connecting the metallization layer 300 and the heat dissipating module 500V through bonding pads 810 and 820. In some embodiments, the metallization layer 300 is located on and thermally coupled to the semiconductor package 200, and is electrically isolated from the semiconductor package 200. The detail of the metallization layer 300 has described in FIG. 1, and thus is not repeated herein. In some embodiments, the connectors 800 are bonded to and thermally coupled to the metallization layer 300 through the bonding pads 810, and are bonded to and thermally coupled to the heat dissipating module 500V through the bonding pad 820. The connectors 800 may be referred to as conductive connectors having capable of heat transfer for thermal dissipation, in the disclosure. For example, the connectors 800 are conductive joints made of metal (such as copper, aluminum, etc.), metal alloy, a thermal adhesive material, or the like. In some embodiments, the formations and materials of the bonding pads 810, 820 are the same or similar to the formations and materials of the bonding pads 310, 530, and thus are not omitted herein. For example, the bonding pads 810 are formed on the metallization layer 300 and the bonding pads 820 are formed on a surface S4 of the heat dissipating system, where the connectors 800 are bonded to one of the bonding pads 810 and the bonding pads 820 first and then bonded to other one of the bonding pads 810 and the bonding pads 820 by soldering process or the like. After bonding, in some embodiments, the heat dissipating module 500V is electrically isolated and thermally coupled to the semiconductor package 200 through the metallization layer 300, the connectors 800 and the bonding pads 810, 820.

For example, the heat dissipating module 500V includes a hollow block 510V having a central portion 512V, a flange portion 514V and a backside portion 516V, where the central portion 512V is located on and overlapped with the backside portion 516V along the direction Z, and the flange portion 514V connecting the periphery of the central portion 512V and the periphery of the backside portion 516V, as shown in FIG. 30 in further view of FIG. 31B and FIG. 31C. For example, as shown in FIG. 30 and FIG. 31A through FIG. 31C, an enclosure E1 is defined by the central portion 512V, the flange portion 514V and the backside portion 516V, where a fluidic channel 1001 is confined by the enclosure E1. In the heat dissipating system, the central portion 512V may constitute the ceiling of the enclosure E1, the flange portion 514V may constitute the sidewall of the enclosure E1, and the backside portion 516V may constitute the floor of the enclosure E1, where a microstructure 320 (e.g., a plurality of pillars 322) is located in the fluidic channel 1001 on the backside portion 516V through bonding pads 310 and surrounded by the enclosure E1. In some embodiments, the central portion 512V includes channels 910, 920 (FIG. 31A and FIG. 31B) spatially communicated with the enclosure E1.

In some embodiments, the enclosure E1 serves as an accommodating container of a coolant CL, where the coolant CL is in contact with the microstructure 320 (pillars 322) placed inside the fluidic channel 1001 to achieve heat transfer from the pillars 322 to the coolant CL for the purpose of heat dissipating. In the disclosure, the microstructure 320 (e.g., some of the pillars 322) located on the backside portion 516V are positioned underneath the openings of the channels 920, where the coolant CL flows into the heat dissipating system through the channels 920 and is further divided into sub-flows of different directions due to the presence of such microstructure 320. Owing to the microstructure 320 positioned underneath the openings of the channels in the heat dissipating system, the distribution of the coolant flow is improved, thereby enhancing the heat dissipation of the package structure 10V. In alternative embodiments, additional microstructures (e.g., 324, 326, 328 and/or 542, 544, 546, 548) are further adopted in the heat dissipating system. In some embodiments, a fluid circulation system 700 is installed onto the heat dissipating module 500V, where the fluid circulation system 700 includes pipes 710 and washers 720, the pipes 710 are securely installed to the channels 910, 920 of the heat dissipating module 500V through the washers 720. In addition, the detail of the fluid circulation system 700 is discussed in FIG. 4, and thus is not repeated herein for brevity.

The formations and materials of the central portion 512V and the flange portion 514V may be similar to the formations and materials of the central portion 512A and the flange portion 514A as described in FIG. 3, and thus are not repeated herein. In some embodiments, the formation and material of the backside portion 516V are similar to the formations and materials of the central portion 512A and the flange portion 514A. For example, a thickness T516 of the backside portion 516V may be selected and designated based on the demand and/or design requirement, the disclosure is not limited thereto. For example, the central portion 512V, the flange portion 514V and the backside portion 516V are integrally formed. In an alternative embodiment, the backside portion 516V and the central and flange portions 512V, 514V are fabricated separately and then assembled to produce the hollow block 510V. The disclosure is not limited thereto.

However, the disclosure is not limited thereto, the inflow/outflow channels (e.g., 910, 920), in part or all, may be relocated. A non-limiting example is shown as a package structure 10X of FIG. 32, where the package structure 10X of FIG. 32 is similar to the package structure 10V of FIG. 30, except the locations of the inflow channels such as 920. Referring to FIG. 32, the package structure 10X includes a heat dissipating module 500X, where the heat dissipating module 500X includes a hollow block 510X having a central portion 512X, a flange portion 514X and a backside portion 516X, where the flange portion 514X includes at least the channels 920 while the central portion 512X includes at least the channel 910. As shown in FIG. 32, the coolant CL flowing into the heat dissipating system through the channels 920 are still divided into sub-flows of different directions (see the flow directions F) due to the presence of the microstructure 320 (e.g., pillars 322). The formations and materials of the central portion 512X, the flange portion 514X and the backside portion 516X are similar to the central portion 512V, the flange portion 514V and the backside portion 516V as described in FIG. 30, and thus are not repeated herein.

FIG. 34 through FIG. 45 are schematic top views respectively illustrating an arrangement of microstructures and inflow/outflow channels of a heat dissipating system in a package structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In FIG. 34 through FIG. 45, non-limiting examples of possible arrangements of the microstructures (e.g., 546, or 548) and the inflow/outflow channels (e.g., Ip (indicating the inflow channels) and Op (indicating the outflow channels)) are provided for illustrative purposes, and are not intended to limit the disclosure. It is appreciated that the inflow channels Ip and the outflow channels Op can be modified (e.g. switching the locations, the number, the size, and so on in the way of which the channels 910, 920 may adopted as described above); the disclosure is not limited to the non-limiting examples illustrated herein. Although the pillars 542 and the splitters 544 are not shown in FIG. 34 through FIG. 45 for simplicity, one or more pillars 542 (not shown) and/or one or more splitter 544 (not shown) may be formed on the central portion 512 between two fins 548, between two baffles 546 and/or between one fin 548 and one baffle 546 as long as the microstructures (e.g. 322 and/or 324) located on the metallization layer or the backside portion of the heat dissipating module are positioned corresponding to (e.g. underneath) the openings of the inflow/outflow channels. The numbers of the splitters 544 and the pillars 542 are not limited to the disclosure, and may be selected based on the demand and the design layout.

Figure 34:
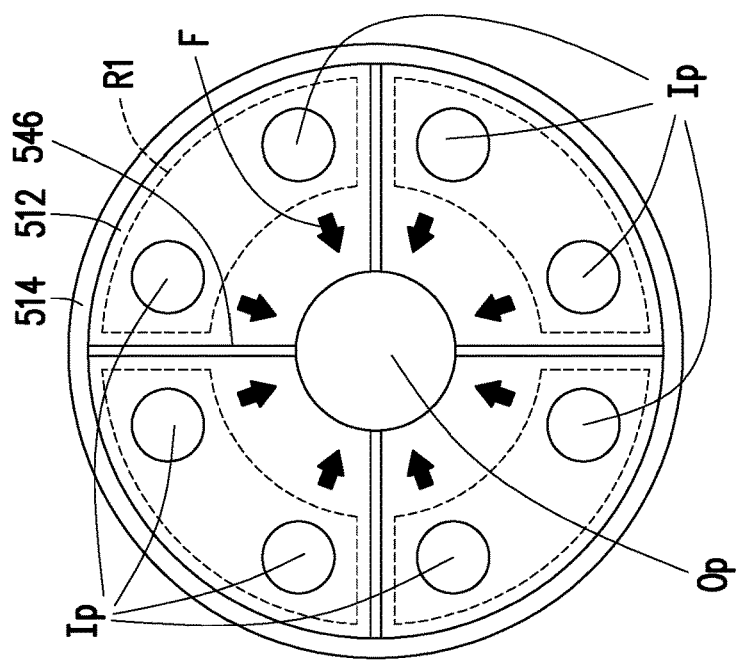
Figure 34:
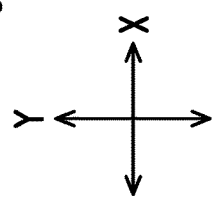

Referring to FIG. 34, in some embodiments, the microstructures (e.g., 542, 544, 546, or 548) and inflow/outflow channels (e.g., Ip and Op) are located on the central portion 512, where an outflow channel Op is located at the center of the central portion 512 while inflow channels Ip are located at the periphery of the central portion 512. With such arrangement, the flow direction F of the coolant (not shown) is from the periphery of the central portion 512 toward the center of the central portion 512. For example, there are one outflow channel Op and eight inflow channels Ip shown in FIG. 34 for illustrative purposes, however the numbers of the inflow/outflow channels Ip and Op may not be limited thereto. The outflow channel Op may be one or more than one while the inflow channels Ip may be one or more than one. Alternatively, the outflow channel Op may be replaced by one inflow channel Ip, and/or the inflow channels Ip, in part or all, may individually be replaced by one outflow channel Op.

In some embodiments, as illustrated in FIG. 34, a plurality of baffles 546 are located on the central portion 512 and connected to the flange portion 514 at the periphery of the central portion 512, where the baffles 546 individually extend over the central portion 512 from the periphery of the central portion 512 to the edge of the outflow channel Op located at the center of the central portion 512 so as to divide the central region 512 into several partition regions (not labeled) for better controlling the coolant flow. For example, as shown in FIG. 34, the central portion 512 (in a solid circle shape) is divided into four equal sections (e.g., the partition regions in arc shapes), where each of the sections has two inflow channels Ip, and all the sections share the one same outflow channel Op. However, the disclosure is not limited thereto, the number of the partition regions is not limited in the disclosure, and may be adjusted based on the demand and design layout. Alternatively, there may be no partition region (FIG. 41), two partition regions (FIG. 40), three partition regions, four partition regions (FIG. 35, FIG. 36, FIG. 39, FIG. 43), five partition regions (FIG. 42), six partition regions, seven partition regions, eight partition regions (FIG. 37, FIG. 38, FIG. 44, FIG. 45), and so on. In one embodiment, the areas of the partition regions are the same. Alternatively, the areas of the partition regions are different, in part or all.

In alternative embodiments, one or more fins 548 may be formed on the central portion 512 with the partition regions (FIG. 35-FIG. 39, FIG. 42-FIG. 45) to facilities the control in the flow direction of the coolant. The numbers of the fins 548 and the baffles 546 are not limited to the disclosure, and may be selected based on the demand and the design layout.

In some embodiments, a least one recess R1 may be formed in the central portion 512. For example, as shown in FIG. 34, there are four recesses R1 formed in the central portion 512, where each of the recesses R1 is located in one of the four equal sections, and in each section, a positioning location of the recess R1 is overlapped with positioning locations of the two inflow channels Ip. Alternatively, the recess R1 may be only overlapped with one of the two inflow channels Ip; or, more recesses R1 may be formed in the central portion 512, where each recess R1 may be only overlapped with each inflow channel Ip. In some embodiments, the recesses R1 may be omitted or be, in part or all, substituted by a recess R4. The disclosure is not limited thereto. In other embodiments, one recess R3 may be formed in the central portion 512 and a positioning location of the recess R3 is overlapped with a positioning location of the outflow channels Op. Alternatively, the recess R3 may be substituted by the recess R4. The details of the recesses R1, R3 and R4 have been described in FIG. 3 and FIG. 6-FIG. 10, and thus are not repeated herein.

Figure 35:
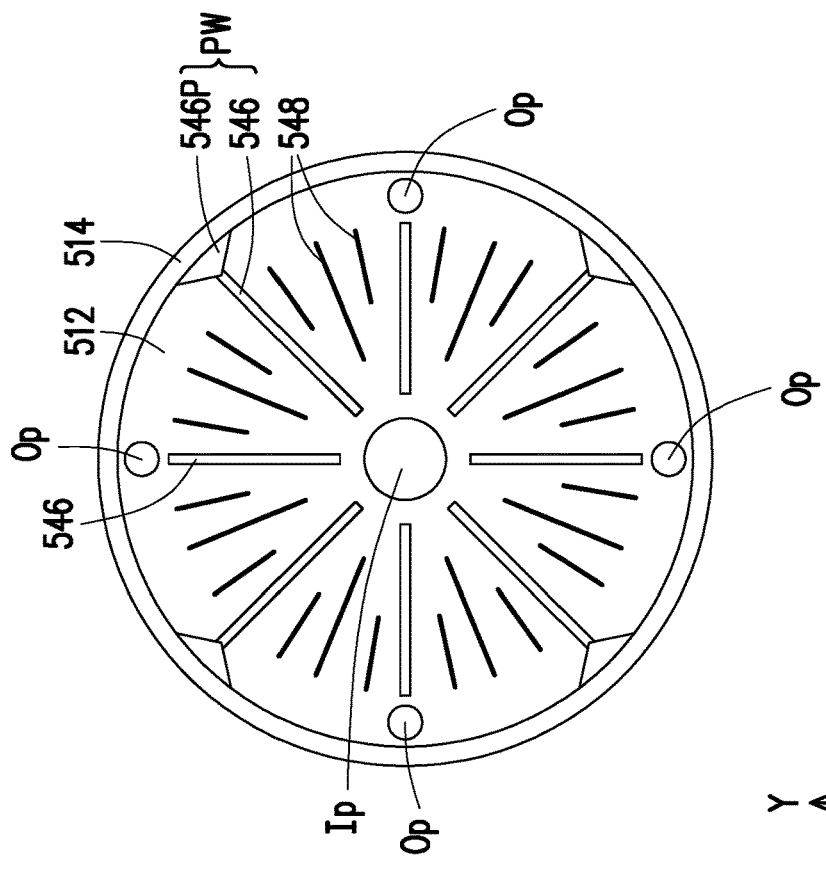
FIG. 34 through FIG. 45 are schematic top views respectively illustrating an arrangement of microstructures and inflow/outflow channels of a heat dissipating system in a package structure in accordance with some embodiments of the disclosure.
Figure 35:
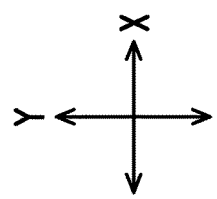

Referring to FIG. 35, in some embodiments, there are eight baffles 546 formed on the central portion 512, where the baffles 546 extends from the center toward the periphery of the central portion 512, four of the baffles 546 are each connected to a partition 546p located at the periphery of the central portion 512 to form a partition wall PW for dividing the central portion 512 into four equal sections, and the other four baffles 546 are each divides one section into two parts. The partitions 546p are connected to the flange portion 514 at the periphery of the central portion 512, for example. In some embodiments, there are three fins 548 in each part of the above equal sections to facilities the control in the flow direction of the coolant. However, the number of the fins 548 and baffles 546 are not limited in the disclosure, and may be selected or designed based on demand and design layout. In addition, for example, the inflow channel Ip is formed in the central portion 512 at the center thereof, and four outflow channels Op are formed in the central portion 512 at the periphery thereof, where one outflow channel Op is placed into one section. That is, in some embodiments, each of the sections has one outflow channel Op, and all the sections share the one same inflow channel Ip.

Figure 36:
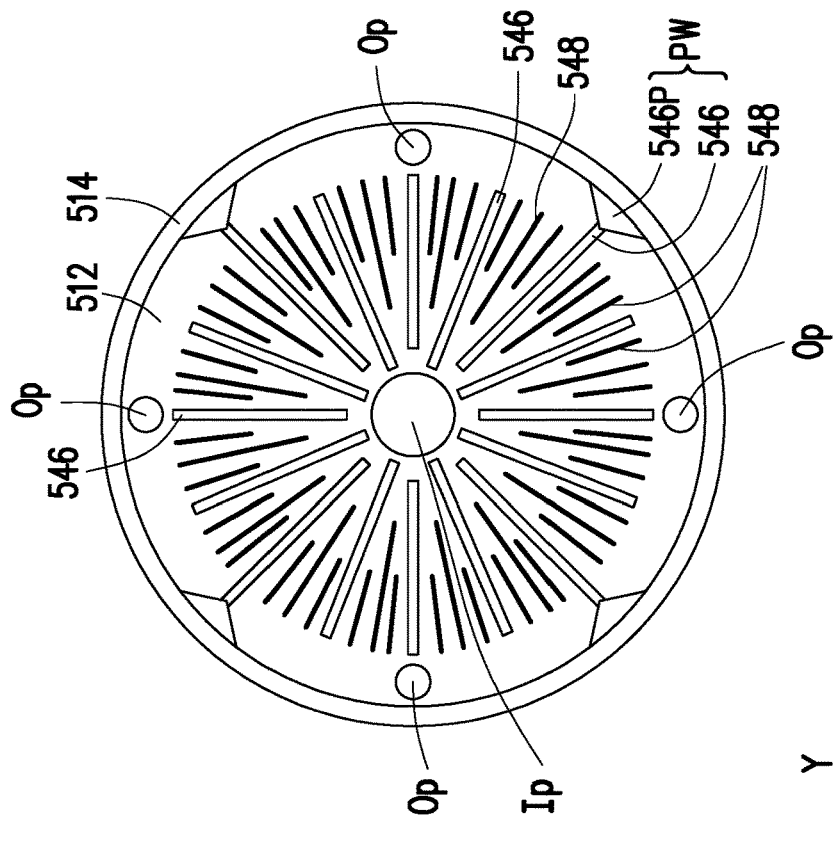

Referring to FIG. 36, in some embodiments, there are four partition walls for dividing the central portion 512 into four equal sections, where each section is further divided into four parts by three additional baffles 546, and there are three fins 548 in each part of the above equal sections to facilities the control in the flow direction of the coolant. However, the number of the fins 548 and baffles 546 are not limited in the disclosure, and may be selected or designed based on demand and design layout. In some embodiments, the inflow channel Ip is formed in the central portion 512 at the center thereof, and four outflow channels Op are formed in the central portion 512 at the periphery thereof, where one outflow channel Op is placed into one section. That is, in some embodiments, each of the sections has one outflow channel Op, and all the sections share the one same inflow channel Ip.

Figure 37:
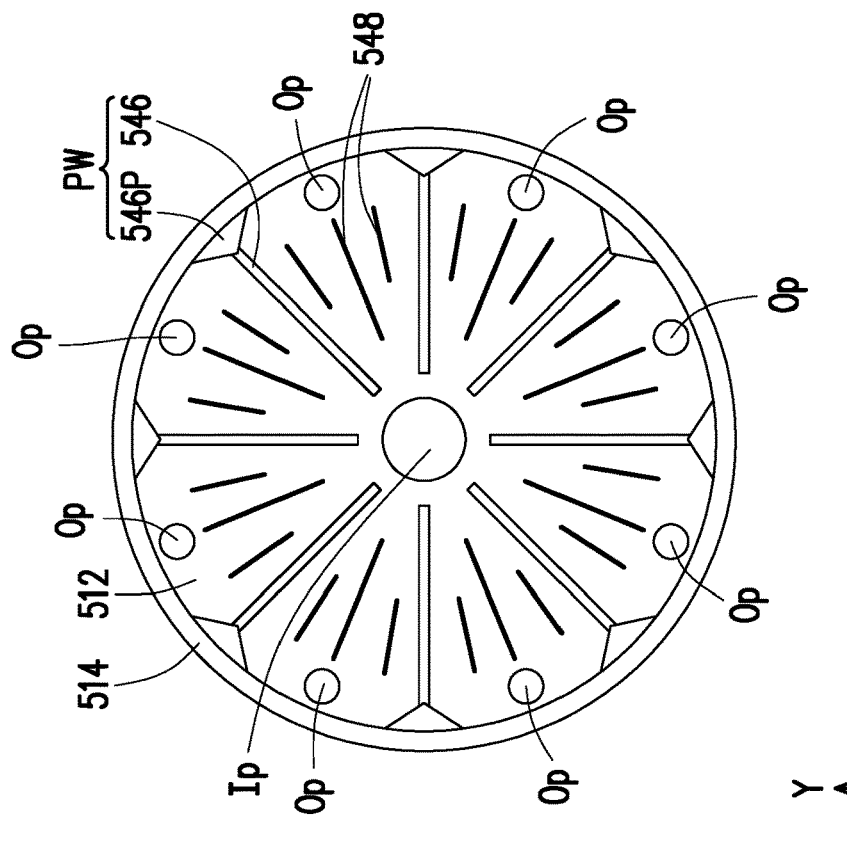
Figure 39:
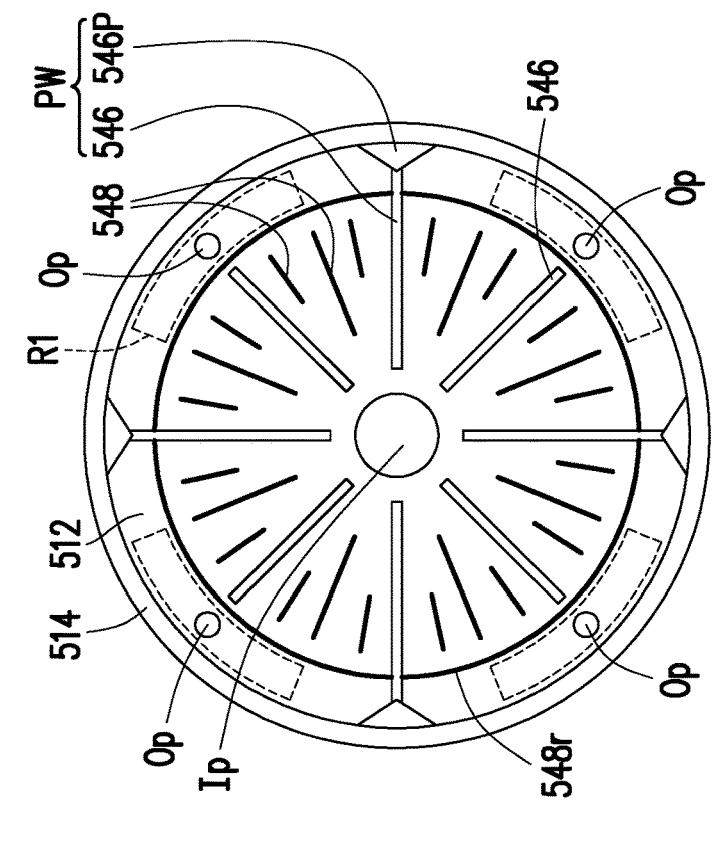
Figure 38:
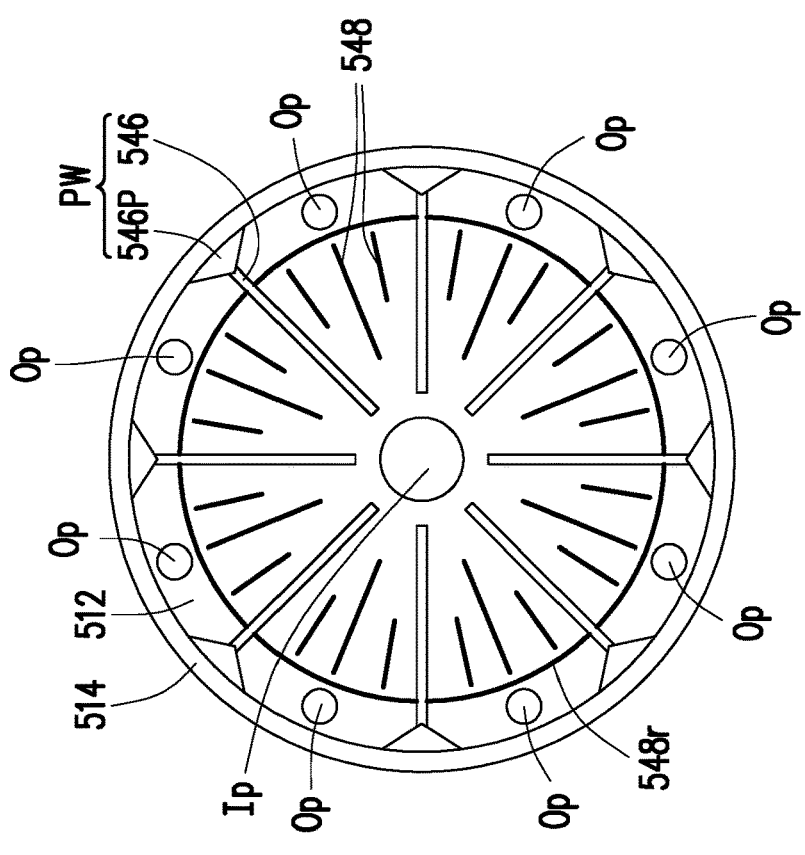

Referring to FIG. 37 through FIG. 39, in some embodiments, there are eight partition walls for dividing the central portion 512 into eight equal sections, where there are three fins 548 in each of the above equal sections to facilities the control in the flow direction of the coolant. However, the number of the fins 548 and baffles 546 are not limited in the disclosure, and may be selected or designed based on demand and design layout. In some embodiments, the inflow channel Ip is formed in the central portion 512 at the center thereof, and eight outflow channels Op are formed in the central portion 512 at the periphery thereof, where one outflow channel Op is placed into one section. That is, in some embodiments, each of the sections has its one outflow channel Op, and all the sections share the one same inflow channel Ip. However, the disclosure is not limited thereto; in alternative embodiments, a fin 548, which is formed in form of a ring (e.g., a fin ring 548r), is formed on the central portion 512 in a concentric manner with the inflow channel, and is connected with the partition walls PW by separating the fins 548 and the outflow channels at its two opposite sides, see FIG. 38. In further alternatively, the recesses R1 are formed in the central region 512, where a positioning location of each recess R1 is overlapped with a positioning location of each outflow channel Op on the X-Y plane, as shown in FIG. 39.

Figure 40:
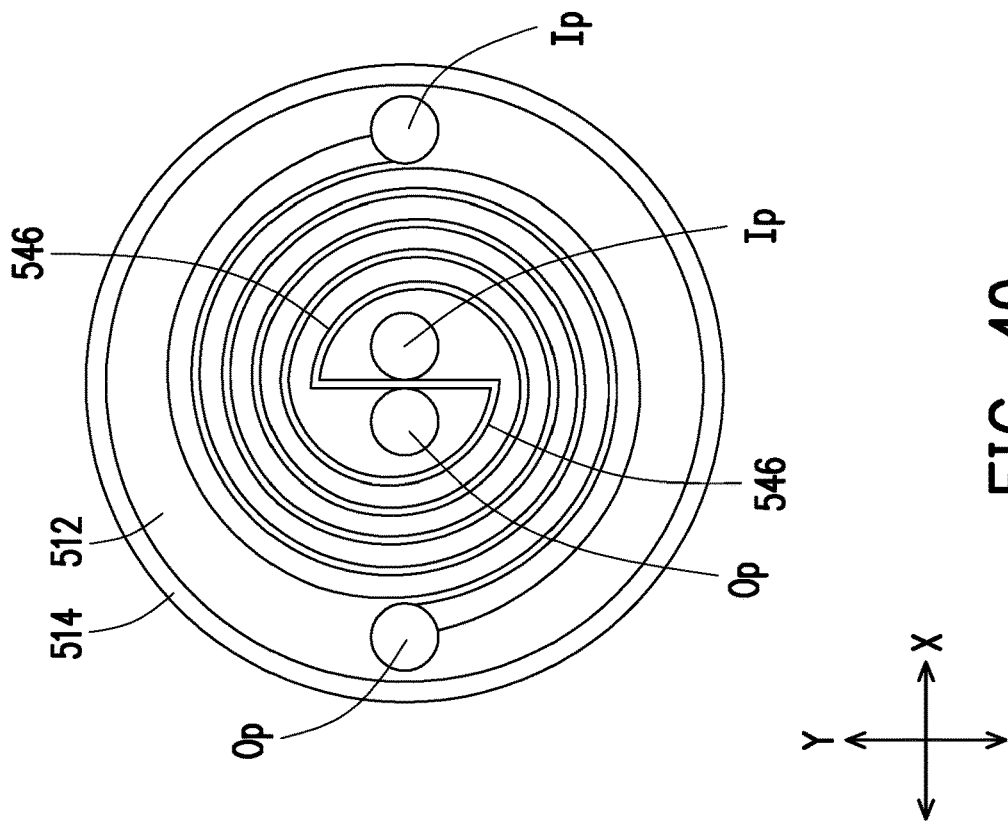

Referring to FIG. 40, in some embodiments, two baffles 546 are formed on the central portion 512 in a spiral shape and are aligned (e.g., connected to) at a center of the central portion 512, where the center of the central portion 512 is referred to as an intersected location of the baffles 546. For example, the baffles 546 spiral outwards in opposite directs from their intersected location. After spiraling outward, two independent fluidic channels are confined by the baffles 546, and each of the fluidic channels has one inflow channel Ip and one outflow channel Op. In some embodiments, the fluidic channels independently have constant widths. However, the disclosure is not limited thereto; alternatively, the fluidic channels have, in part or all, non-constant widths. In some embodiments, the widths of the fluidic channels are different from one another.

Figure 41:
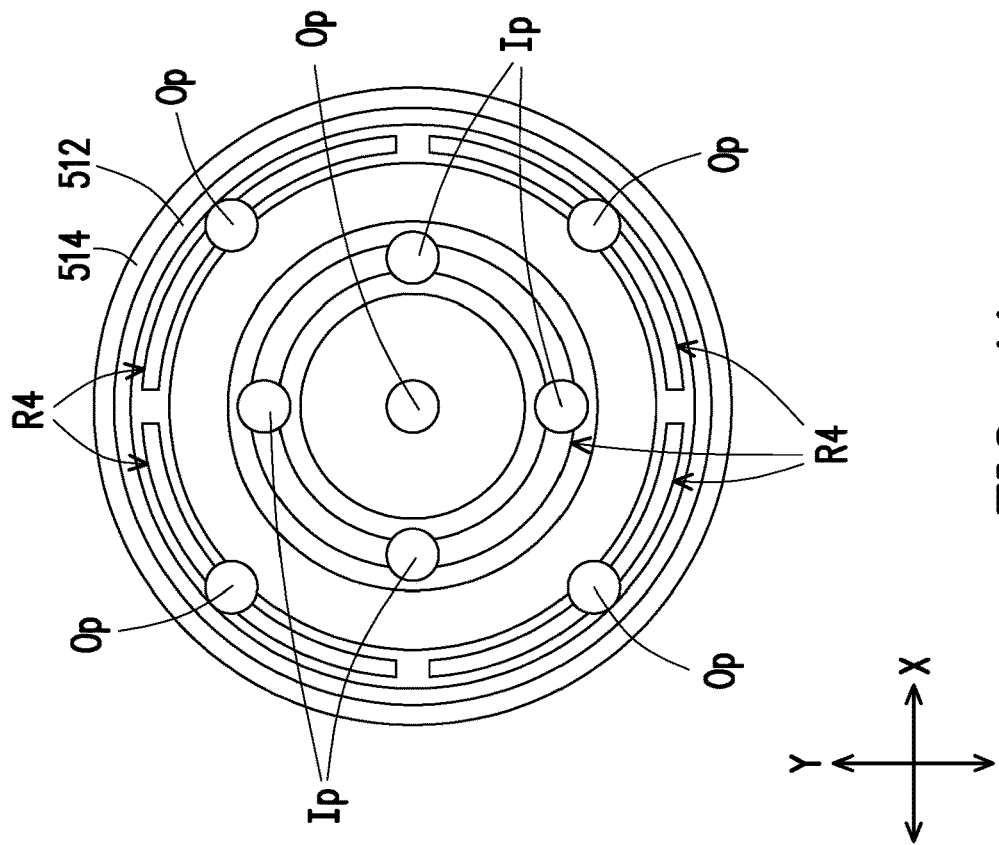

Referring to FIG. 41, in some embodiments, a plurality of recesses R4 are formed in the central portion 512, where the recesses R4 are in annular shapes with different sizes and are arranged in a concentric manner. For example, there are two recesses R4, where one inner recess R4 has an annular shape close to the center of the central portion 512 while one outer recess R4 has an annular shape recess close to the periphery of the central portion 512 and enclosing the inner recess R4, as shown in FIG. 41. In some embodiments, one outflow channel Op is placed at the center of the central portion 512, four inflow channels Ip are placed at the inner recess R4, and four addition outflow channels Op are placed at the outer recess R4. For example, the two opposite inflow channels Ip and the center outflow channel Op are substantially aligned along a diameter of the central portion 512 but not aligned with any outflow channels Op at the outer recess R4. On the other hand, the two opposite outflow channels Op at the outer recess R4 and the center outflow channel Op are substantially aligned along a diameter of the central portion 512 but not aligned with any inflow channels Ip at the inner recess R4.

Figure 42:
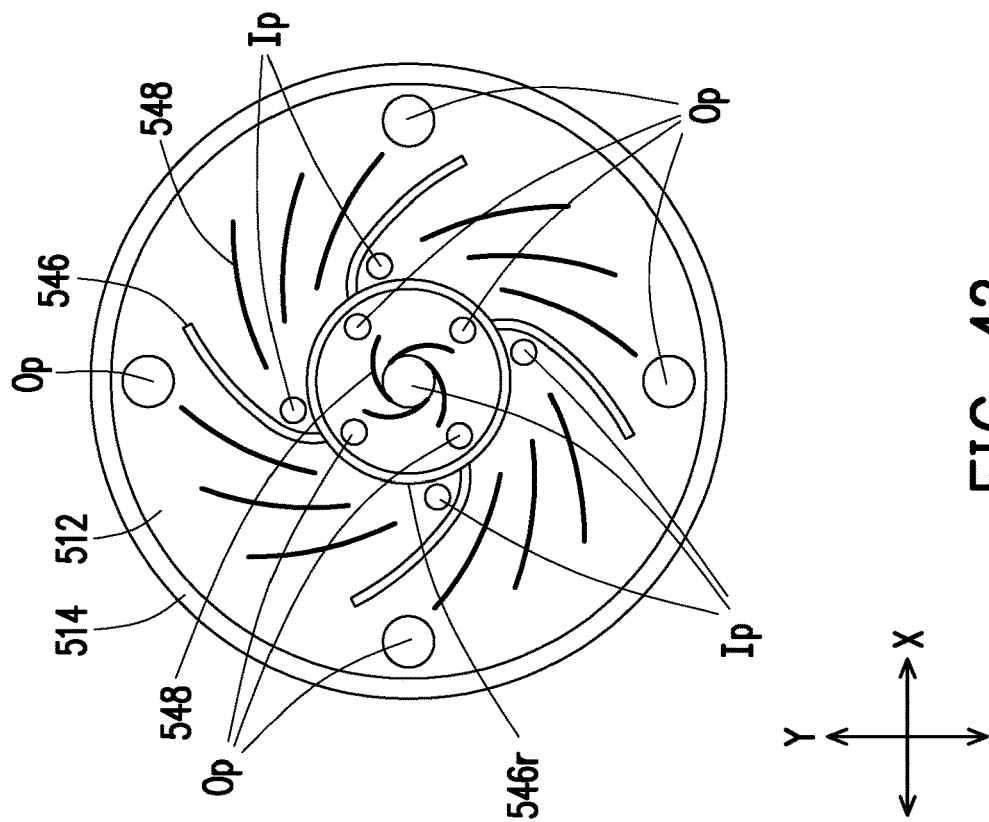

Referring to FIG. 42, in some embodiments, a baffle 546, which is formed in form of a ring (e.g., a baffle ring 546r), is formed on the central portion 512 in a concentric manner to have two independent partition regions (e.g. an inner region and an outer region surrounding the inner region). In some embodiments, within the inner region, one inflow channel Ip is formed in the central portion 512 at the center of the inner region and four outflow channels Op are formed in the central portion 512 at the periphery of the inner region. For example, the fins 548 are formed on the central portion 512 with the inner region, and extend from the inflow channel Ip toward the outflow channels Op in a spiral manner (e.g., clockwise). Alternatively, the fins 548 may extend counterclockwise. In some embodiments, within the outer region, four additional baffles 546 are formed on the central portion 512 and connected to the baffle ring 546r, where the baffles extend from the baffle ring 546r toward the periphery of the central portion 514 in a spiral manner (e.g., clockwise) to further divide the outer region into four equal sections. For example, four inflow channels Ip are formed in the central portion 512 at the joints of the baffles 546 and the baffle ring 546r, respectively; and four outflow channels Op are formed in the central portion 512 at the periphery thereof. For example, additional three fins 548 are formed on the central portion 512 in each equal section, and extend from the inflow channel Ip toward the outflow channels Op in a spiral manner (e.g., clockwise). Alternatively, the additional baffles 546 and/or the additional fins 548 may extend counterclockwise, the disclosure is not limited thereto.

Figure 43:
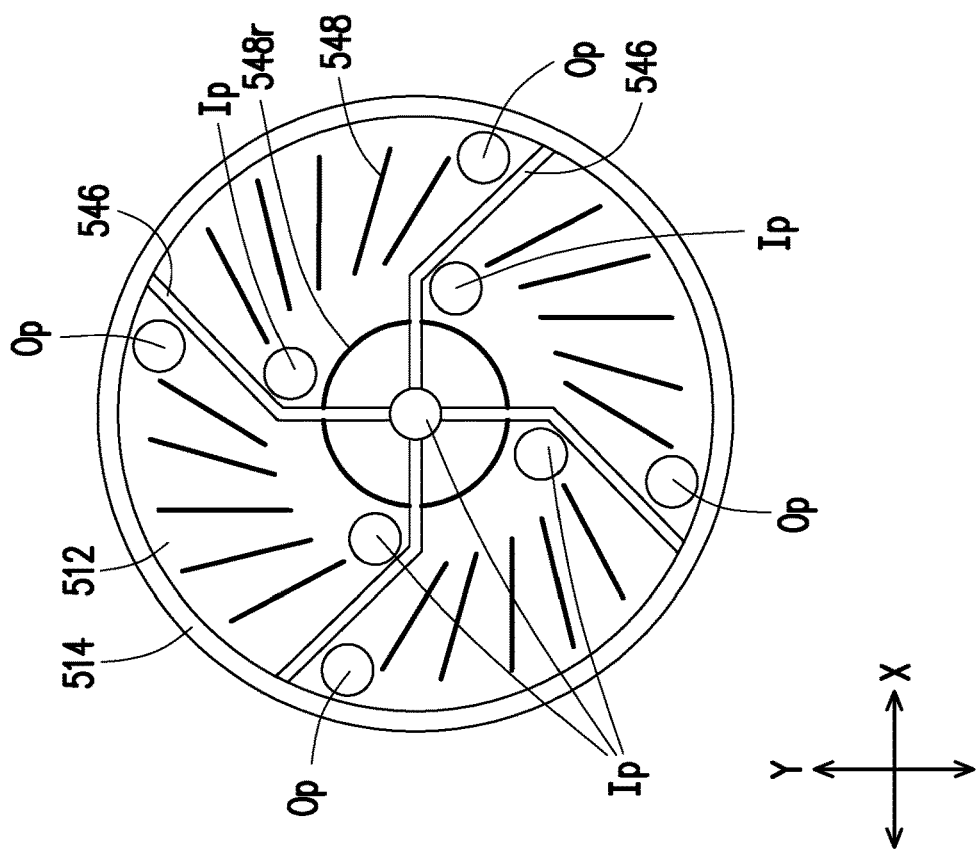

Referring to FIG. 43, in some embodiments, an inflow channel Ip is formed in the central portion 512 at the center thereof, and four baffles 546 are formed on the central portion 512 and connected to the edge of the inflow channel Ip, where the baffles 546 extend from the inflow channel Ip to the periphery of the central portion 512 (to connect to the flange portion 514) in a spiral manner (e.g., clockwise), and the central portion 512 is divided into four equal sections. For example, each of the baffles 546 may include at least one bent portion due to extending in the spiral manner. In some embodiments, additional inflow channels Ip are formed in the central portion 512 at the bent portion of each baffle 546, and four outflow channels Op are formed in the central portion 512 at the joints of baffles 546 and the flange portion 514. With such, each section has its own one inflow channel Ip and one outflow channel Op while all the sections share extra one same inflow channel Ip. In some embodiments, a fin ring 548r is formed in the central portion 512 and connected to the baffles 546, where the fin ring 548r is between the shared inflow channel Ip and the bent portions of the baffles 546. In addition, a plurality of fins 548 may be formed in each section to facilities the control in the flow direction of the coolant. For example, five fins 548 are formed in each of the sections, as shown in FIG. 43. However, the number of the fins 548 in each section are not limited thereto, and the number of the fins 548 may be zero, one or more than one. Alternatively, the baffles 546 and/or the fins 548 may extend counterclockwise, the disclosure is not limited thereto.

Figure 45:
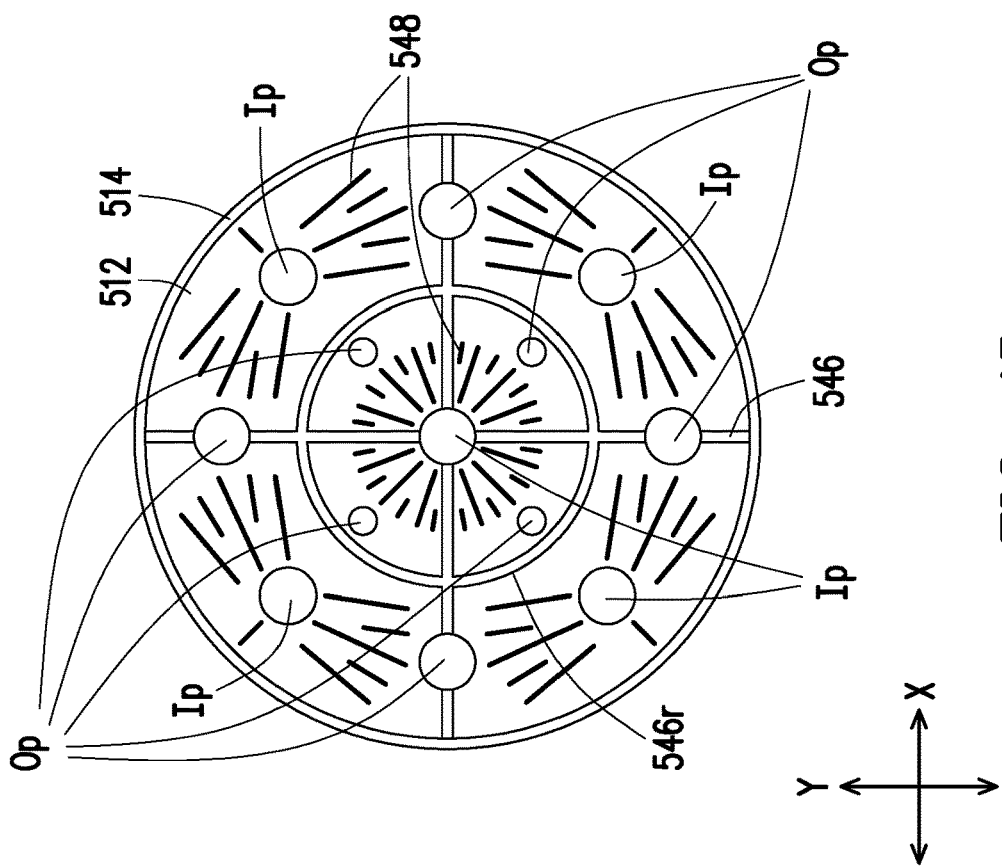
Figure 44:
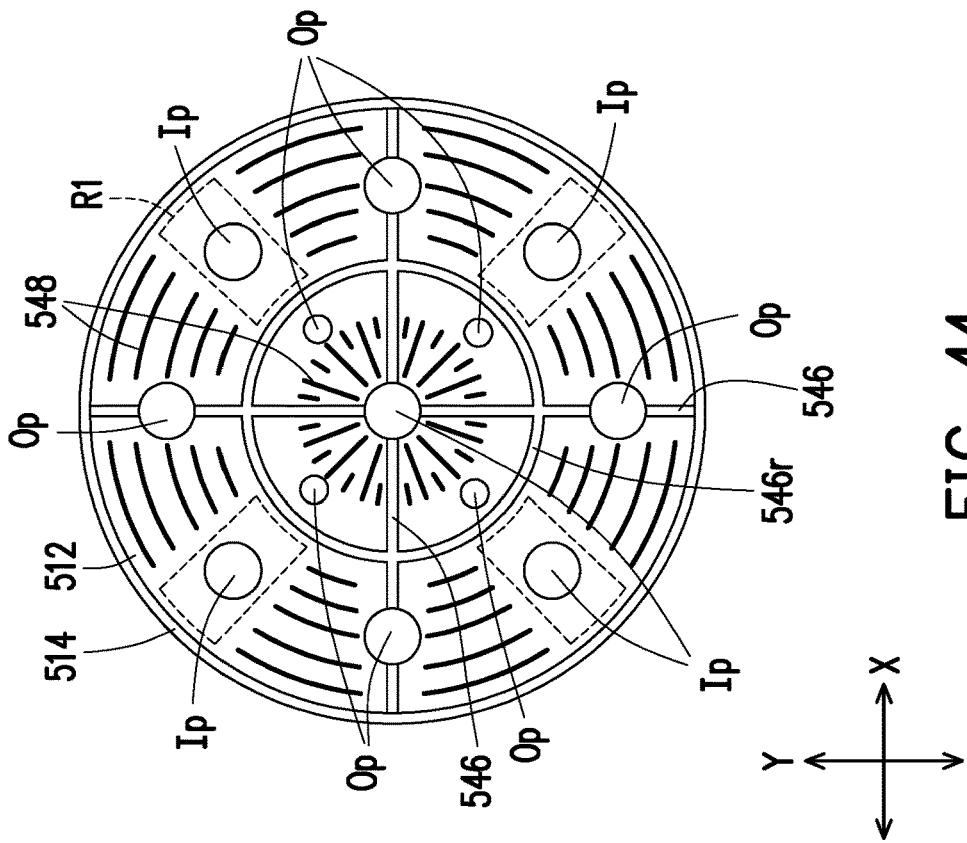

Referring to FIG. 44 and FIG. 45, in some embodiments, an inflow channel Ip is formed in the central portion 512 at the center thereof, and one baffle ring 546r is formed on the central portion 512 between the periphery of the central portion 512 and the centered inflow channel Ip to divide the center portion 512 into two independent partition regions (e.g. an inner region and an outer region surrounding the inner region). For example, four baffles 546 are formed on the central portion 512 and connected to the edge of the inflow channel Ip, where the baffles 546 extend from the inflow channel Ip to the baffle ring 546r to divide the inner region into four equal sections. In some embodiments, four outflow channels Op are formed in the four sections of the inner region, respectively. In other words, each section of the inner region has one outflow channel Op and share the same one inflow channel Ip, in some embodiments, as shown in FIG. 44 and FIG. 45. For example, a plurality of fins 548 are formed in each of the sections to facilities the control in the flow direction of the coolant, where the size of the fins 548 are not identical, in part or all. However, the number of the fins 548 in each section are not limited thereto, and the number of the fins 548 may be zero, one or more than one. The size of the fins 548 in the sections of the inner region may be identical. For example, the fins 548 are located between the outflow channel Op and the inflow channel Ip in each section of the inner region, where the fins 548 are parallel to each other and extend in a direction from the additional outflow channel Op to the additional inflow channel Ip (or from the additional inflow channel Ip to the additional outflow channel Op), as shown in FIG. 44 and FIG. 45.

In some embodiments, additional four inflow channels Ip and additional four outflow channels Op are formed in the outer region of the central portion 512 and arranged in an annular shape side-by-side, and additional four baffles 546 are formed on the central portion 512 and connected to the baffle ring 546r. For example, the additional baffles 546 extend from the baffle ring 546r to the periphery of the central portion 512 (to connect to the flange portion 514), where the additional baffles 546 divide the outer region into four equal sections, and each of the additional baffles 546 is positioned to connect to the edge of one of the additional outflow channels Op. For example, the each of the additional baffles 546 has two separated parts positioned to align with a diameter of one of the additional outflow channels Op, one part is located between the baffle ring 546r and other part is located between the respective one of the additional outflow channels Op and the flange portion 514. In some embodiments, as shown in FIG. 44 and FIG. 45, each section of the outer region has one of the additional inflow channel Ip and shares one of the additional outflow channels Op with another one section immediately adjacent thereto.

For example, as shown in FIG. 44, a plurality of additional fins 548 are formed between one additional outflow channel Op and one additional inflow channel Ip within the outer region to facilities the control in the flow direction of the coolant, where the additional fins 548 are parallel to each other and extend in a direction from the additional outflow channel Op to the additional inflow channel Ip (or from the additional inflow channel Ip to the additional outflow channel Op).

However, the disclosure is not limited thereto; in another example, as shown in FIG. 45, a first plurality of additional fins 548 are formed between one additional outflow channel Op and one additional inflow channel Ip within the outer region to facilities the control in the flow direction of the coolant, where the first additional fins 548 are non-parallel to each other and extend in a direction from the additional outflow channel Op to the additional inflow channel Ip (or from the additional inflow channel Ip to the additional outflow channel Op), and a second plurality of additional fins 548 are formed between the additional inflow channels Ip and the flange portion 514 and extend in a direction passing through the inflow channel Ip located in the inner region. For example, the non-parallel fins 548 have extending axes from ends at a first side thereof are converged while extending axes from other ends at a second side thereof are diverged, where the first side and the second side are opposite along the extending direction of the fins 548. In FIG. 45, for instance, the converged ends of the non-parallel fins 548 are closer to the additional inflow channels Ip than the diverged ends, and the diverged ends of the non-parallel fins 548 are closer to the additional outflow channel Op than the converged ends. However, alternatively, the converged ends of the non-parallel fins 548 may be closer to the additional outflow channels Op than the diverged ends, and the diverged ends of the non-parallel fins 548 may be closer to the additional inflow channel Ip than the converged ends.

The non-limiting arrangements of the microstructures (e.g., 542, 544, 546, or 548) and the recesses (e.g., R1 through R4) formed on the central portion 512 have been described in detail as shown in FIG. 34 through FIG. 45. However it is appreciated that besides the uses of the recesses R1 through R4, the arrangements of the microstructures (e.g., 542, 544, 546, or 548) formed on the central portion 512 may be adopted to the microstructure (e.g., 322, 324, 346, 348) formed on the metallization layer or a backside portion of the heat dissipating system. Due to the configuration of the heat dissipating module, the heat dissipating system of the disclosure is scalable in correspondence with the size of the semiconductor package bonded therewith.

In accordance with some embodiments, a package structure includes a wafer-form semiconductor package and a thermal dissipating system. The wafer-form semiconductor package includes semiconductor dies electrically connected with each other. The thermal dissipating system is located on the wafer-form semiconductor package, where the thermal dissipating system has a hollow structure with a fluidic space, and the fluidic space includes a ceiling and a floor. The thermal dissipating system includes at least one inlet opening, at least one outlet opening and a plurality of first microstructures. The at least one inlet opening and the at least one outlet opening are spatially communicated with the fluidic space. The first microstructures are located on the floor, and at least one of the first microstructures is corresponding to the at least one outlet opening.

In accordance with some embodiments, a package structure includes a wafer-form semiconductor package, a metallization layer, a thermal dissipating module and microstructures. The wafer-form semiconductor package includes dies electrically connected with each other. The metallization layer is located on and thermally coupled to the wafer-form semiconductor package. The thermal dissipating module is located on the metallization layer and includes a plurality of openings, where a confined space is between the thermal dissipating module and the metallization layer and includes one or more fluidic channels providing fluidic communication between the plurality of openings. The microstructures are located on the metallization layer and within the confined space, wherein a first group of the first microstructures is positioned at locations corresponding to the plurality of openings.

In accordance with some embodiments, a method of manufacturing a package structure includes the following steps, providing a wafer-form semiconductor package comprising semiconductor dies electrically connected with each other; and disposing a heat dissipating system on the wafer-form semiconductor package, comprising: forming a metallization layer over the wafer-form semiconductor package, the metallization layer thermally coupled to the wafer-form semiconductor package; bonding a heat dissipating module having a plurality of openings to the metallization layer to form a confined space between the heat dissipating module and the metallization layer and spatially communicated with the plurality of openings; and disposing first microstructures on the metallization layer within the confined space and at locations corresponding to the plurality of openings, the first microstructure thermally coupled to and bonded to the metallization layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
  a wafer-form semiconductor package, comprising semiconductor dies electrically connected with each other; and
  a thermal dissipating system, located on the wafer-form semiconductor package, the thermal dissipating system being in direct physical contact with the semiconductor dies, wherein the thermal dissipating system has a hollow structure with a fluidic space, and the fluidic space comprises a ceiling and a floor, wherein the thermal dissipating system comprises:
    at least one inlet opening and at least one outlet opening spatially communicated with the fluidic space; and
    a plurality of first microstructures, located on the floor, and at least one of the plurality of first microstructures corresponding to the at least one outlet opening.

2. The package structure of claim 1, wherein the thermal dissipating system further comprises:
  a plurality of second microstructures, located on the ceiling, wherein a positioning location of each of the plurality of second microstructures is offset from a positioning location of each of the plurality of first microstructures in a projection on the wafer-form semiconductor package along a stacking direction of the wafer-form semiconductor package and the heat dissipating system.

3. The package structure of claim 1, wherein the thermal dissipating system further comprises:
  a conductive layer disposed on and thermally couple to the wafer-form semiconductor package; and
  a heat dissipating module comprising a lid having a central portion and a flange portion bonded to a periphery of the central portion, wherein the flange portion is bonded to the conductive layer to form the fluidic space between the conductive layer, the flange portion and the central portion,
  wherein the conductive layer and the heat dissipating module together confine the hollow structure of the heat dissipating system.

4. The package structure of claim 3, wherein the floor of the fluidic space comprises the conductive layer and the ceiling of the fluidic space comprises the central portion.

5. The package structure of claim 1, wherein the thermal dissipating system further comprises:
  a conductive layer disposed on and thermally couple to the wafer-form semiconductor package;
  a plurality of conductive connectors; and
  a heat dissipating module, bonded to and thermally coupled to the conductive layer through the plurality of the conductive connectors, and comprising a block having a central portion, a backside portion and a flange portion connecting the central portion and the backside portion,
  wherein the fluidic space is located between the backside portion, the flange portion and the central portion, and the hollow structure of the heat dissipating system is confined inside the heat dissipating module.

6. The package structure of claim 5, wherein the floor of the fluidic space comprises the backside portion and the ceiling of the fluidic space comprises the central portion.

7. The package structure of claim 1, wherein the fluidic space further comprises a sidewall connecting the ceiling and the floor,
  wherein the at least one inlet opening is formed in at least one of the ceiling and the sidewall of the fluidic space, and the at least one outlet opening is formed in at least one of the ceiling and the sidewall of the fluidic space.

8. The package structure of claim 1, wherein the plurality of first microstructures comprises micro-pillar structures.

9. A package structure, comprising:
a wafer-form semiconductor package, comprising dies electrically connected with each other;
a metallization layer, located on and thermally coupled to the wafer-form semiconductor package, the metallization layer being in direct physical contact with the dies;
a thermal dissipating module, located on the metallization layer and comprising a plurality of openings, wherein a confined space is between the thermal dissipating module and the metallization layer and comprises one or more fluidic channels providing fluidic communication between the plurality of openings; and
microstructures, located on the metallization layer and within the confined space, wherein a first group of the first microstructures is positioned at locations corresponding to the plurality of openings.

10. The package structure of claim 9, wherein a second group of the microstructures are arranged aside of the first group of the microstructures in a vertical projection on the wafer-form semiconductor package along a stacking direction of the metallization layer and the wafer-form semiconductor package.

11. The package structure of claim 9, wherein the thermal dissipating module comprises a lid comprising a central portion and a flange portion at a periphery of the central portion,
wherein the flange portion is bonded to the metallization layer to form the confined space between the lid and the metallization layer, and
wherein the confined space has one fluidic channel.

12. The package structure of claim 11, wherein the plurality of openings are formed in the central portion.

13. The package structure of claim 9, wherein the thermal dissipating module comprises a lid, and the lid comprises:
a central portion, comprising a first portion and a second portion; and
a flange portion, connected to the first portion or the second portion of the central portion and bonded to the metallization layer to form the confined space between the lid and the metallization layer, and
wherein the confined space has at least two fluidic channels parallel to each other and overlapped with one another along a stacking direction of the central portion and the metallization layer, and the at least two fluidic channels are spatially communicated in a vertical direction.

14. The package structure of claim 13, wherein one of the at least two fluidic channels is located between the first portion and the second portion, and other one of the at least two fluidic channels is located between the first portion and the metallization layer,
wherein the first group of the microstructures are located in the one of the at least two fluidic channels located between the first portion and the second portion.

15. The package structure of claim 13, wherein the plurality of openings are formed in the central portion.

16. The package structure of claim 9, wherein the microstructures comprise micro-pillars structures.

17. The package structure of claim 9, wherein the microstructures are surface-coated with graphene or diamond like carbon.

18. A method of manufacturing a package structure, comprising:
providing a wafer-form semiconductor package comprising semiconductor dies electrically connected with each other; and
disposing a heat dissipating system on the wafer-form semiconductor package, comprising:
forming a metallization layer over the wafer-form semiconductor package, the metallization layer thermally coupled to the wafer-form semiconductor package, the metallization layer being in direct physical contact with the semiconductor dies;
bonding a heat dissipating module having a plurality of openings to the metallization layer to form a confined space between the heat dissipating module and the metallization layer and spatially communicated with the plurality of openings; and
disposing first microstructures on the metallization layer within the confined space and at locations corresponding to the plurality of openings, the first microstructures thermally coupled to and bonded to the metallization layer.

19. The method of claim 18, further comprising:
installing a fluid circulation system onto the heat dissipating module, the fluid circulation system comprising pipes and washers, wherein installing the fluid circulation system onto the heat dissipating module comprises:
connecting the pipes to the heat dissipating module through the washers, wherein the pipes spatially communicated with the plurality of openings, respectively.

20. The method of claim 18, wherein disposing the heat dissipating system on the wafer-form semiconductor package further comprises:
disposing second microstructures on the heat dissipating module within the confined space, a positioning location of each of the second microstructures is offset from a positioning location of each of the first microstructures in a projection on the wafer-form semiconductor package along a stacking direction of the wafer-form semiconductor package and the heat dissipating system.

* * * * *